United States Patent
Wittak et al.

(10) Patent No.: US 6,882,674 B2
(45) Date of Patent: *Apr. 19, 2005

(54) FOUR KHZ GAS DISCHARGE LASER SYSTEM

(75) Inventors: Christian J. Wittak, San Diego, CA (US); William N. Partlo, Poway, CA (US); Richard L. Sandstrom, Encinitas, CA (US); Paul C. Melcher, El Cajon, CA (US); David M. Johns, Lakeside, CA (US); Robert B. Saethre, San Diego, CA (US); Richard M. Ness, San Diego, CA (US); Curtis L. Rettig, Vista, CA (US); Robert A. Shannon, Ramona, CA (US); Richard C. Ujazdowski, San Diego, CA (US); Shahryar Rokni, Carlsbad, CA (US); Scott T. Smith, San Diego, CA (US); Stuart L. Anderson, San Diego, CA (US); John M. Algots, San Diego, CA (US); Ronald L. Spangler, Arlington, MA (US); Igor V. Fomenkov, San Diego, CA (US); Thomas D. Steiger, San Diego, CA (US); Jerome A. Emilo, San Diego, CA (US); Clay C. Titus, San Diego, CA (US); Alex P. Ivaschenko, La Jolla, CA (US); Paolo Zambon, San Diego, CA (US); Gamaralalage G. Padmabandu, San Diego, CA (US); Mark S. Branham, Fallbrook, CA (US); Sunjay Phatak, Alpine, CA (US); Raymond F. Cybulski, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 206 days.

This patent is subject to a terminal disclaimer.

(21) Appl. No.: 10/036,676

(22) Filed: Dec. 21, 2001

(65) Prior Publication Data

US 2003/0118072 A1 Jun. 26, 2003

Related U.S. Application Data

(63) Continuation-in-part of application No. 10/012,002, filed on Nov. 30, 2001, now Pat. No. 6,625,191, and a continuation-in-part of application No. 10/000,991, filed on Nov. 14, 2001, and a continuation-in-part of application No. 10/029,319, filed on Oct. 17, 2001, and a continuation-in-part of application No. 09/943,343, filed on Aug. 29, 2001, and a continuation-in-part of application No. 09/854,097, filed on May 11, 2001, and a continuation-in-part of application No. 09/837,150, filed on Apr. 18, 2001, and a continuation-in-part of application No. 09/834,840, filed on Apr. 13, 2001, and a continuation-in-part of application No. 09/794,782, filed on Feb. 27, 2001, and a continuation-in-part of application No. 09/771,789, filed on Jan. 29, 2001, and a continuation-in-part of application No. 09/768,753, filed on Jan. 23, 2001, and a continuation-in-part of application No. 09/684,629, filed on Oct. 6, 2000, and a continuation-in-part of application No. 09/597,812, filed on Jun. 19, 2000, and a continuation-in-part of application No. 09/473,852, filed on Dec. 27, 1999.

(51) Int. Cl.[7] ................................................. H01S 3/22
(52) U.S. Cl. .......................... 372/58; 372/55; 372/58; 372/57; 372/59
(58) Field of Search .................................... 372/55–59

(56) References Cited

U.S. PATENT DOCUMENTS

| | | | |
|---|---|---|---|
| 4,959,840 A | 9/1990 | Akins et al. ............... 372/57 |
| 5,023,884 A | 6/1991 | Akins et al. ............... 372/57 |
| 5,025,445 A | 6/1991 | Anderson et al. ........... 372/20 |
| 5,315,611 A | 5/1994 | Ball et al. .................. 372/56 |
| 5,448,580 A | 9/1995 | Birx et al. ................. 356/349 |
| 5,835,520 A | * 11/1998 | Das et al. ................... 372/57 |
| 5,856,991 A | 1/1999 | Ershov ....................... 372/57 |
| 5,953,360 A | 9/1999 | Vitruk et al. ............... 372/87 |
| 5,978,394 A | 11/1999 | Newman et al. ............. 372/32 |
| 6,005,879 A | 12/1999 | Sandstrom et al. .......... 372/25 |
| 6,018,537 A | 1/2000 | Hofmann et al. ............ 372/25 |
| 6,067,311 A | 5/2000 | Morton et al. .............. 372/57 |
| 6,128,323 A | 10/2000 | Myers et al. ............... 372/38 |
| 6,157,662 A | * 12/2000 | Scaggs et al. ............... 372/60 |

| | | | |
|---|---|---|---|
| 6,164,116 A | 12/2000 | Rice et al. | 73/1.72 |
| 6,208,674 B1 | 3/2001 | Webb et al. | 372/57 |
| 6,208,675 B1 | 3/2001 | Webb | 372/58 |
| 6,219,368 B1 | 4/2001 | Govorkov | 372/59 |
| 6,442,181 B1 | 8/2002 | Oliver et al. | 372/25 |
| 6,477,193 B2 * | 11/2002 | Oliver et al. | 372/58 |
| 6,560,254 B2 * | 5/2003 | Stamm | 372/32 |
| 2002/0021728 A1 * | 2/2002 | Newman et al. | 372/55 |
| 2002/0154669 A1 | 10/2002 | Spangler et al. | 372/55 |
| 2002/0167975 A1 | 11/2002 | Spangler et al. | 372/20 |

OTHER PUBLICATIONS

U.S. patent application Ser. No. 09/608,543, Fomenkov et al., filed Jun. 30, 2000.

U.S. patent application Ser. No. 10/006,913, Smith et al., filed Oct. 29, 2001.

* cited by examiner

*Primary Examiner*—Don Wong
*Assistant Examiner*—Leith A Al-Nazer

(74) *Attorney, Agent, or Firm*—William Cray

(57) ABSTRACT

The present invention provides an excimer laser capable of producing a high quality pulsed laser beam at pulse rates of about 4,000 Hz at pulse energies of about 5 mJ or greater. A preferred embodiment is an ArF excimer laser specifically designed as a light source for integrated circuit lithography. An improved wavemeter with special software monitors output beam parameters and controls a very fast PZT driven tuning mirror and the pulse power charging voltage to maintain wavelength and pulse energy within desired limits. In a preferred embodiment two fan motors drive a single tangential fan which provides sufficient gas flow to clear discharge debris from the discharge region during the approximately 0.25 milliseconds between pulses.

66 Claims, 64 Drawing Sheets

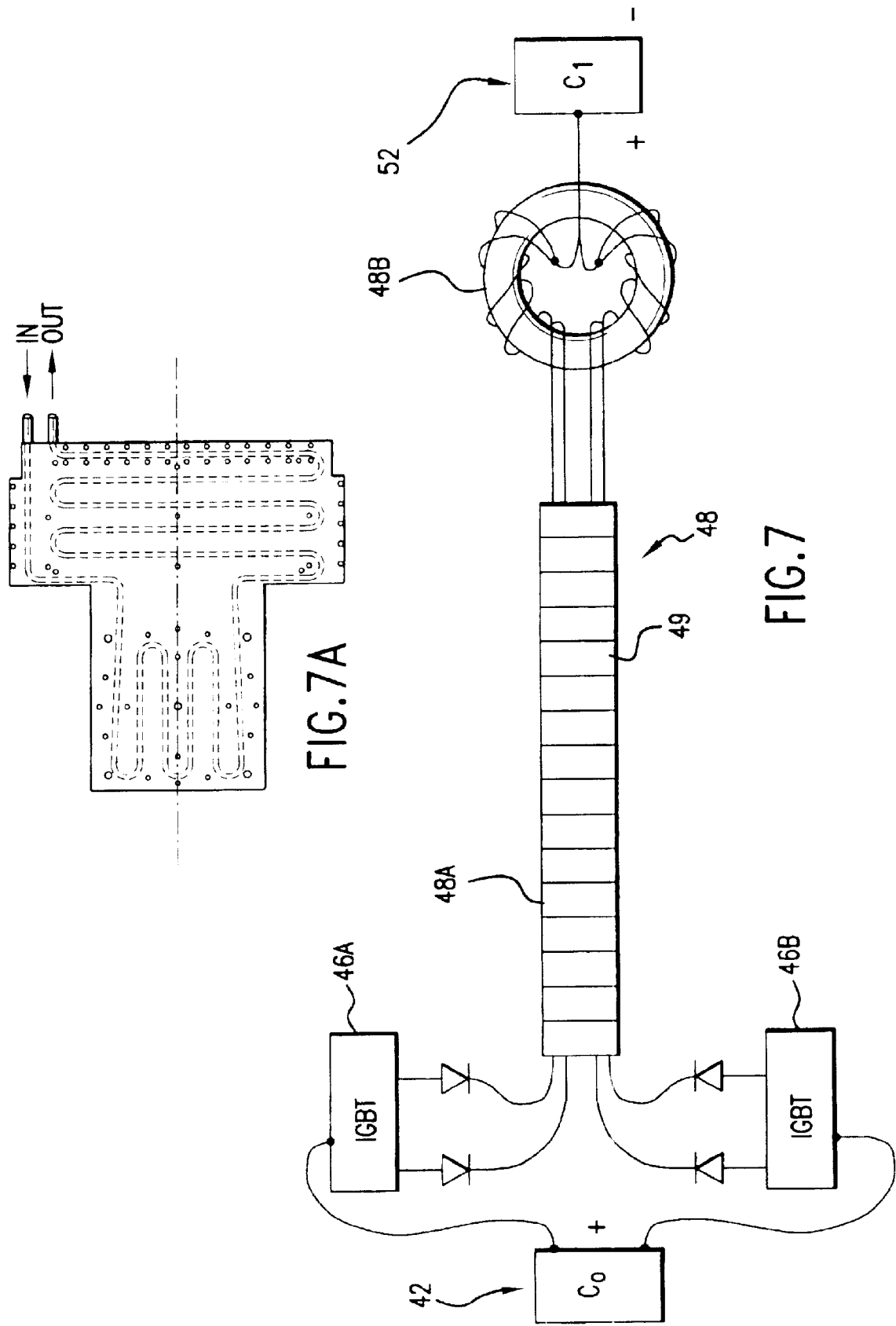

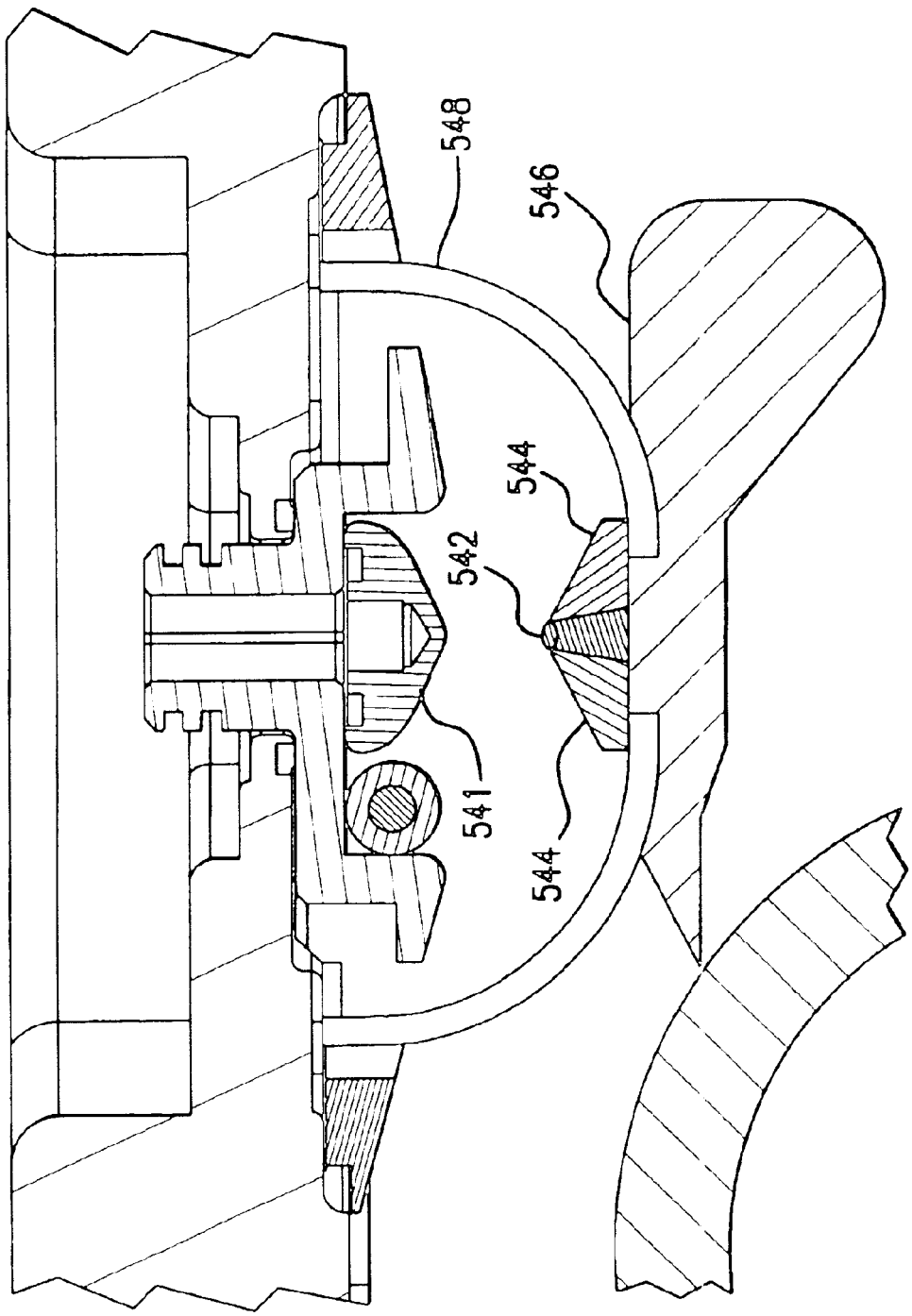
FIG. 13A(1)

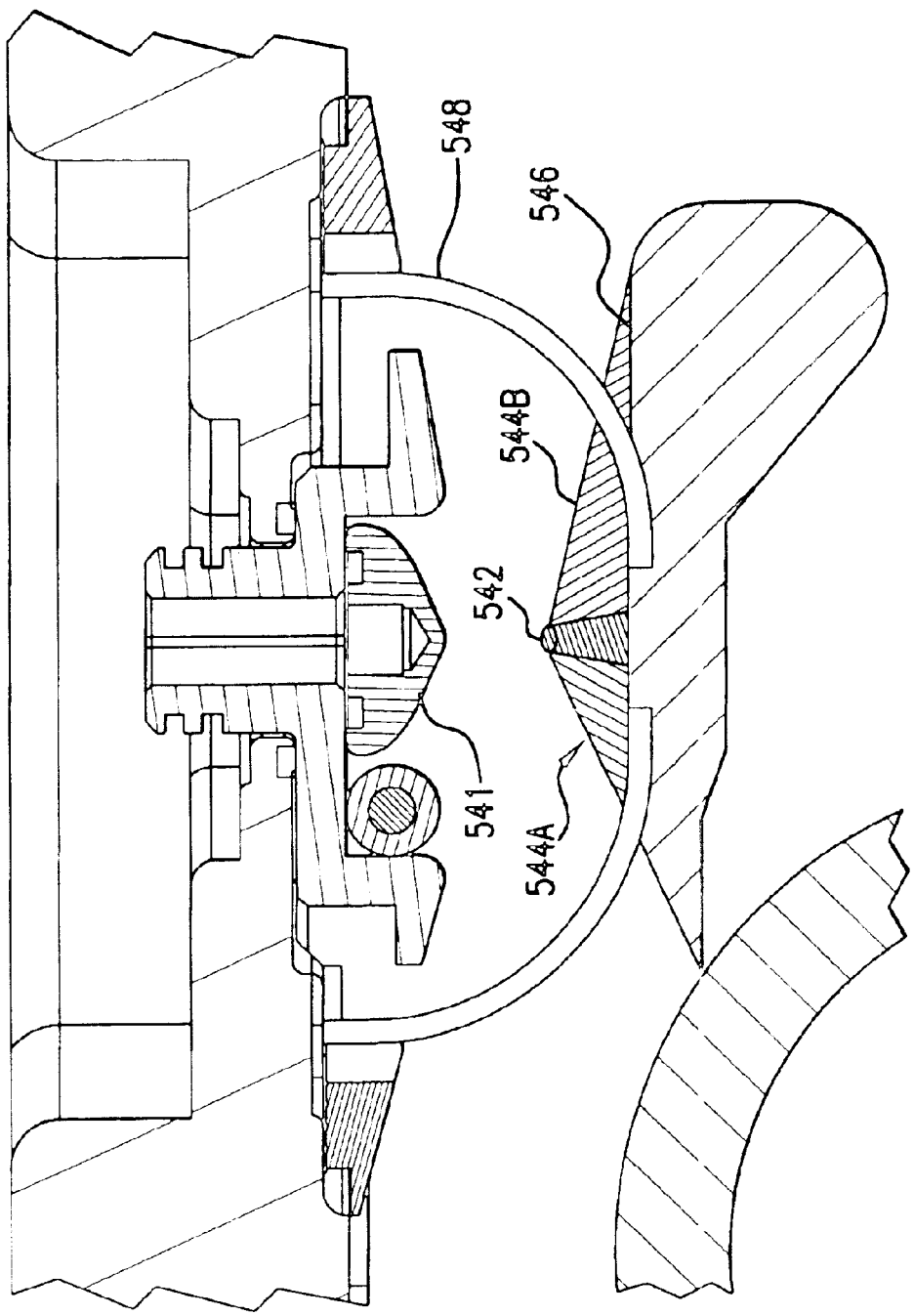

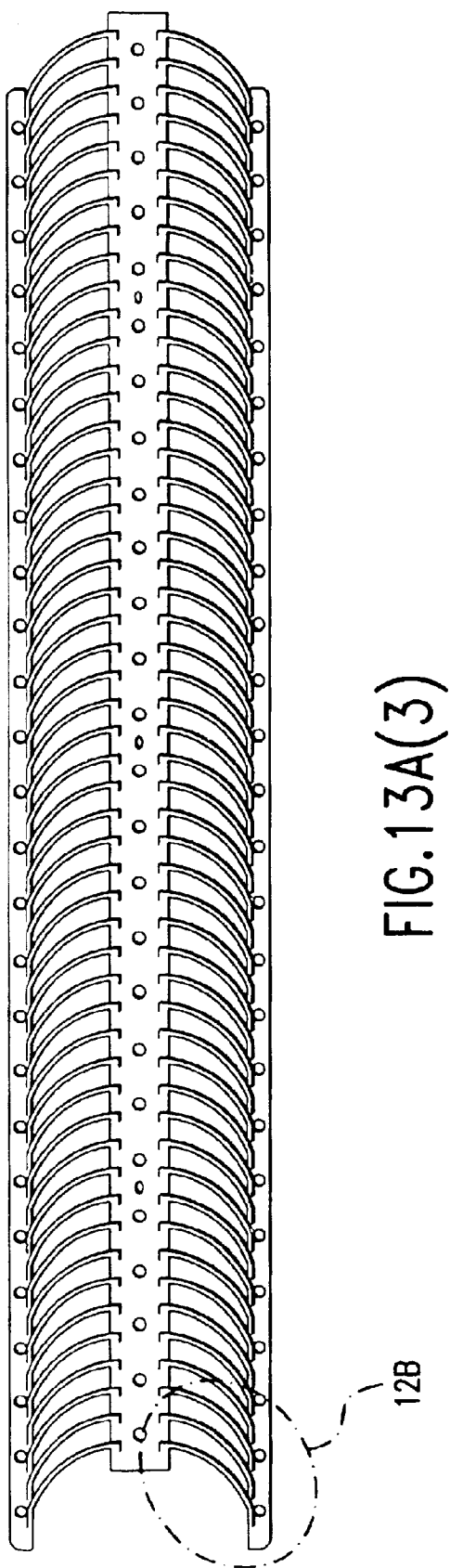
FIG.13A(3)

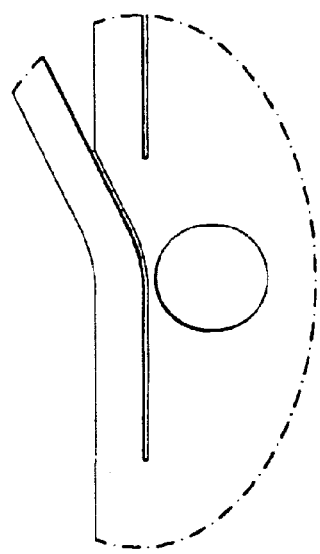
FIG.13A(6)
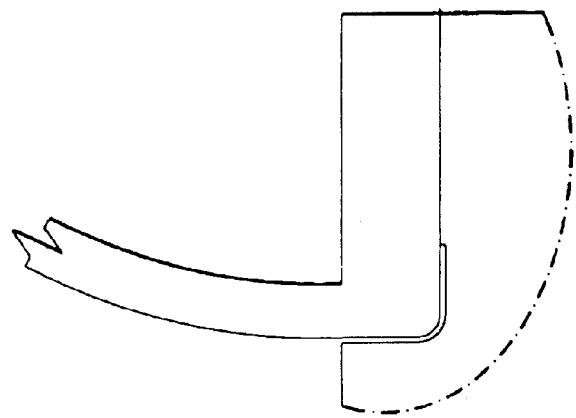
FIG.13A(5)
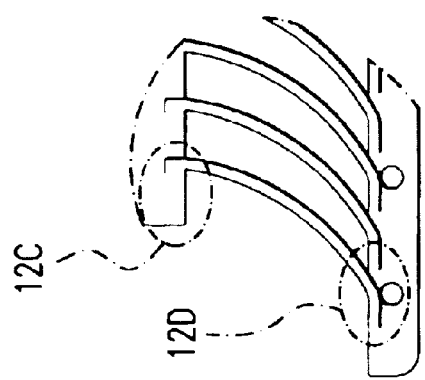
FIG.13A(4)

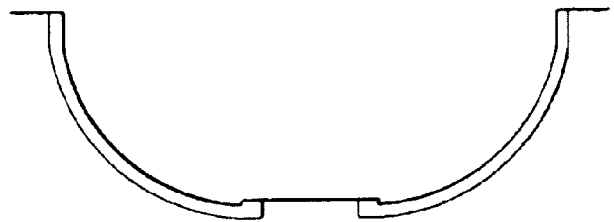
FIG.13A(8)
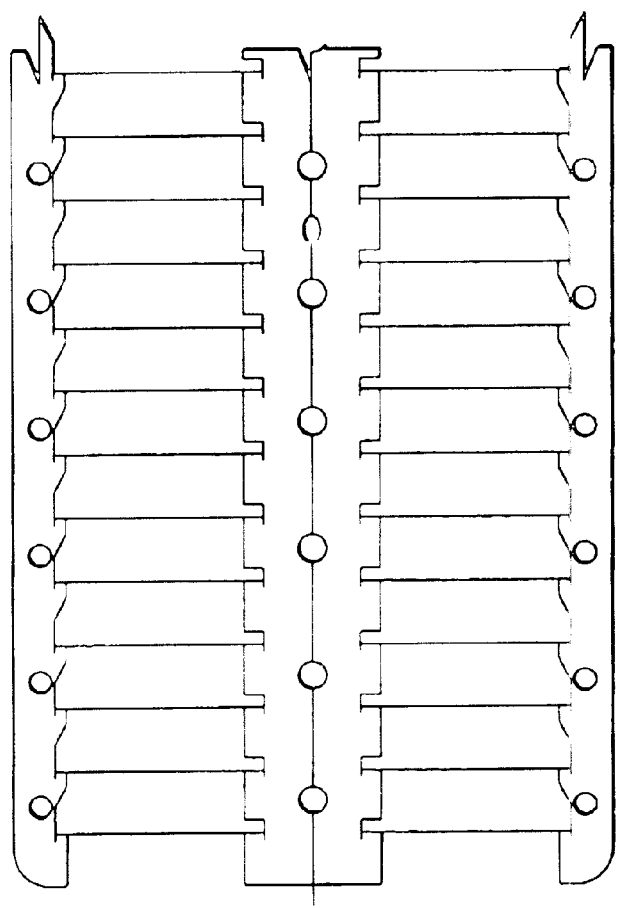
FIG.13A(7)

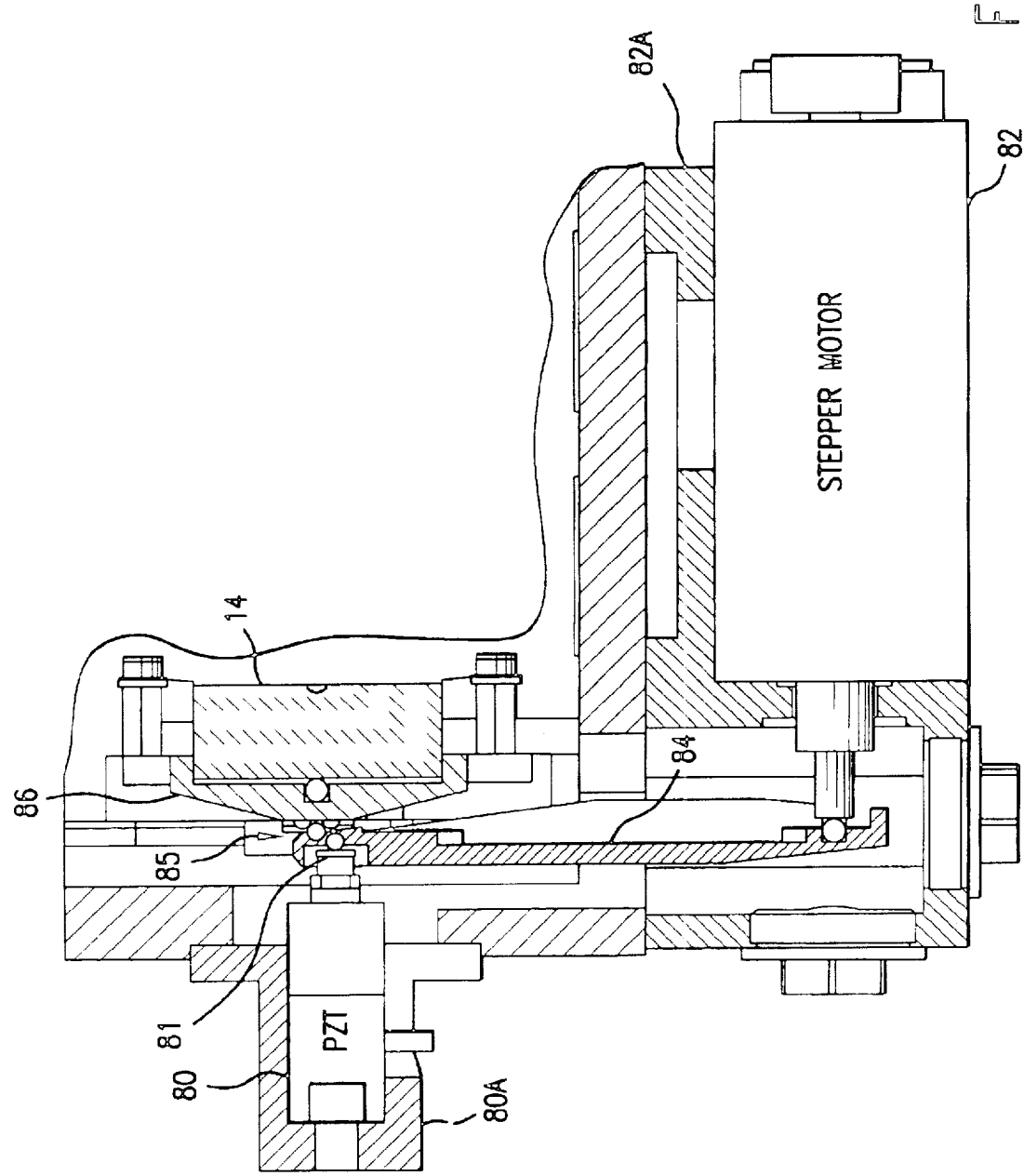
FIG. 16B1

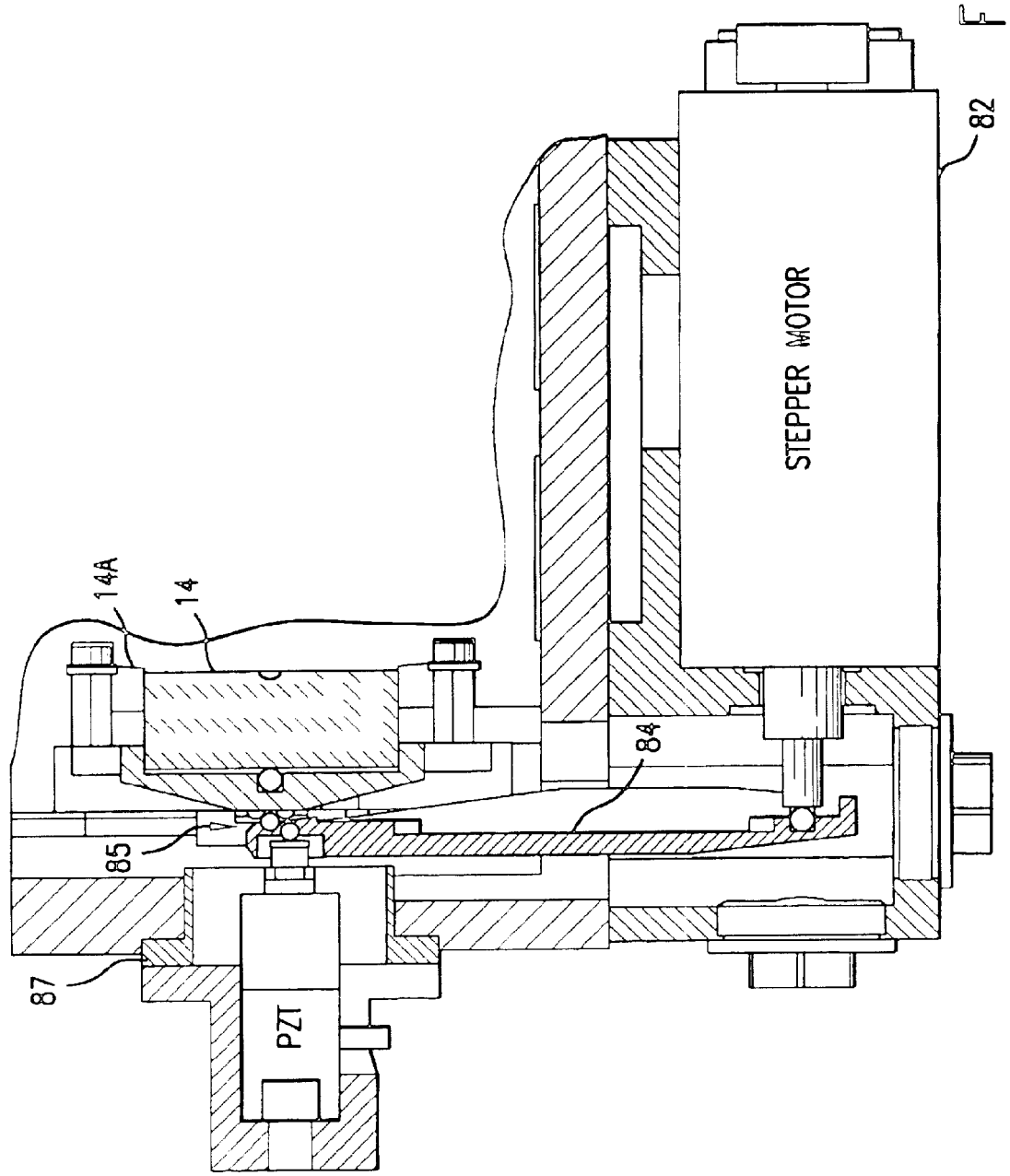

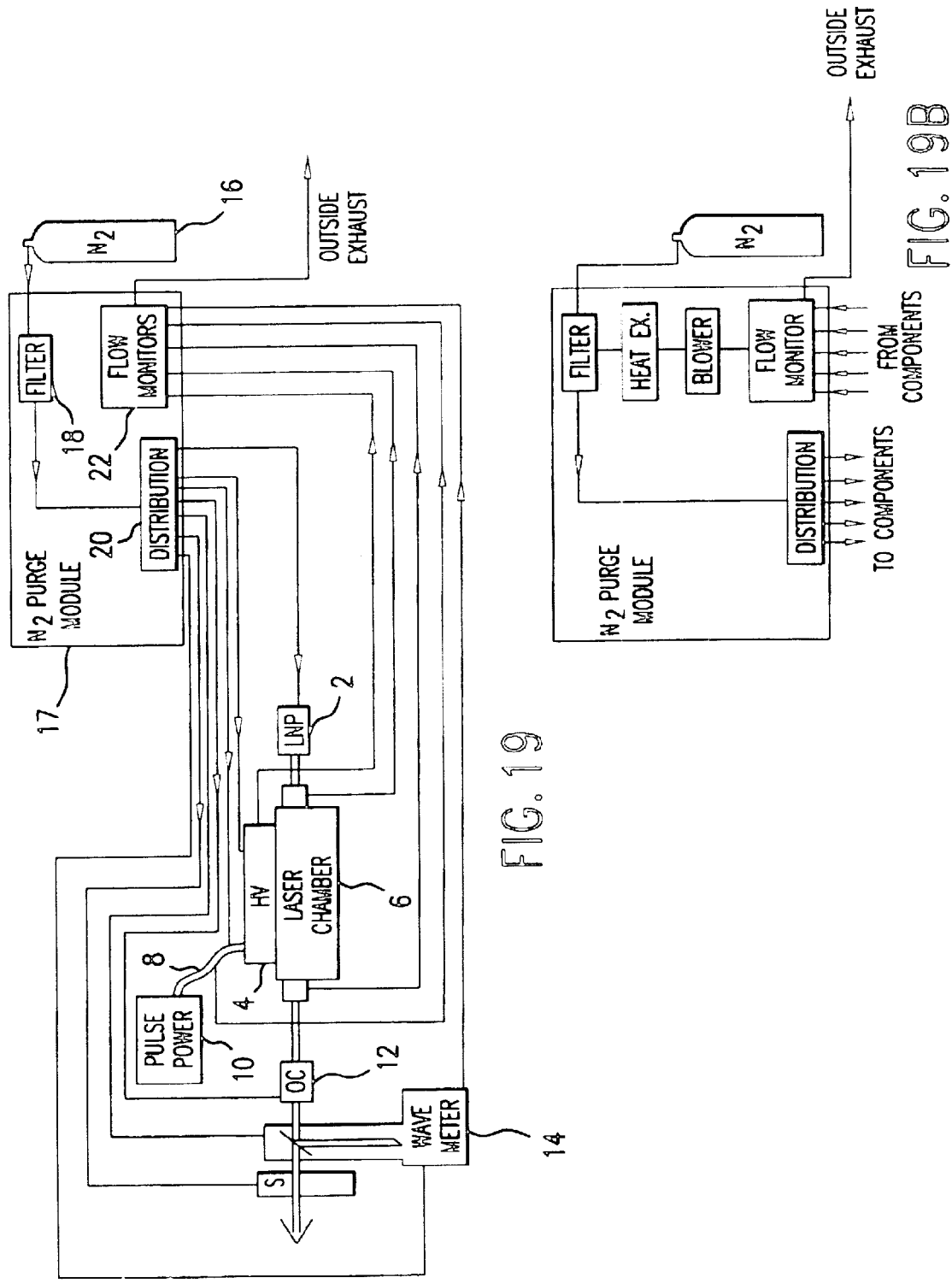

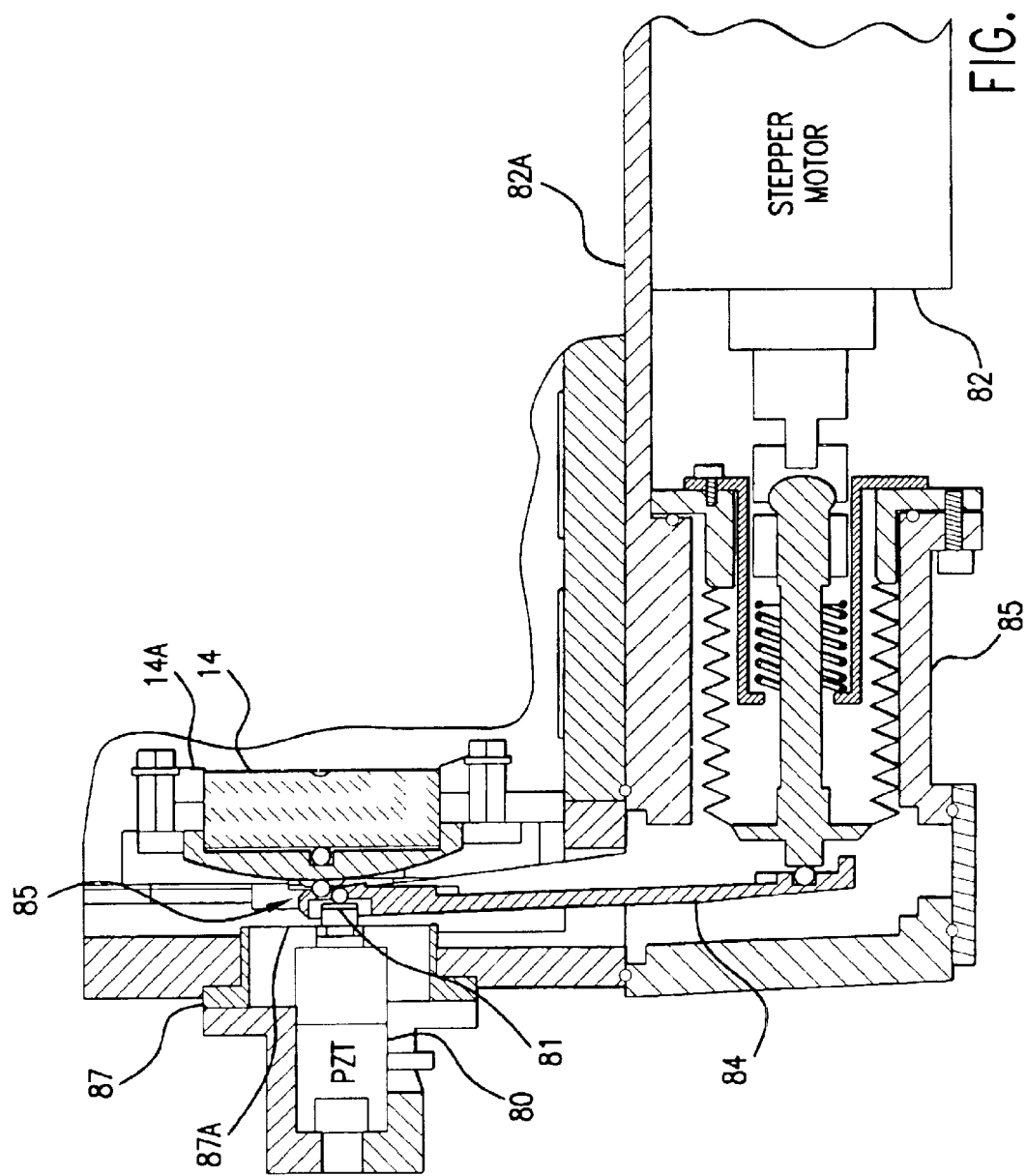

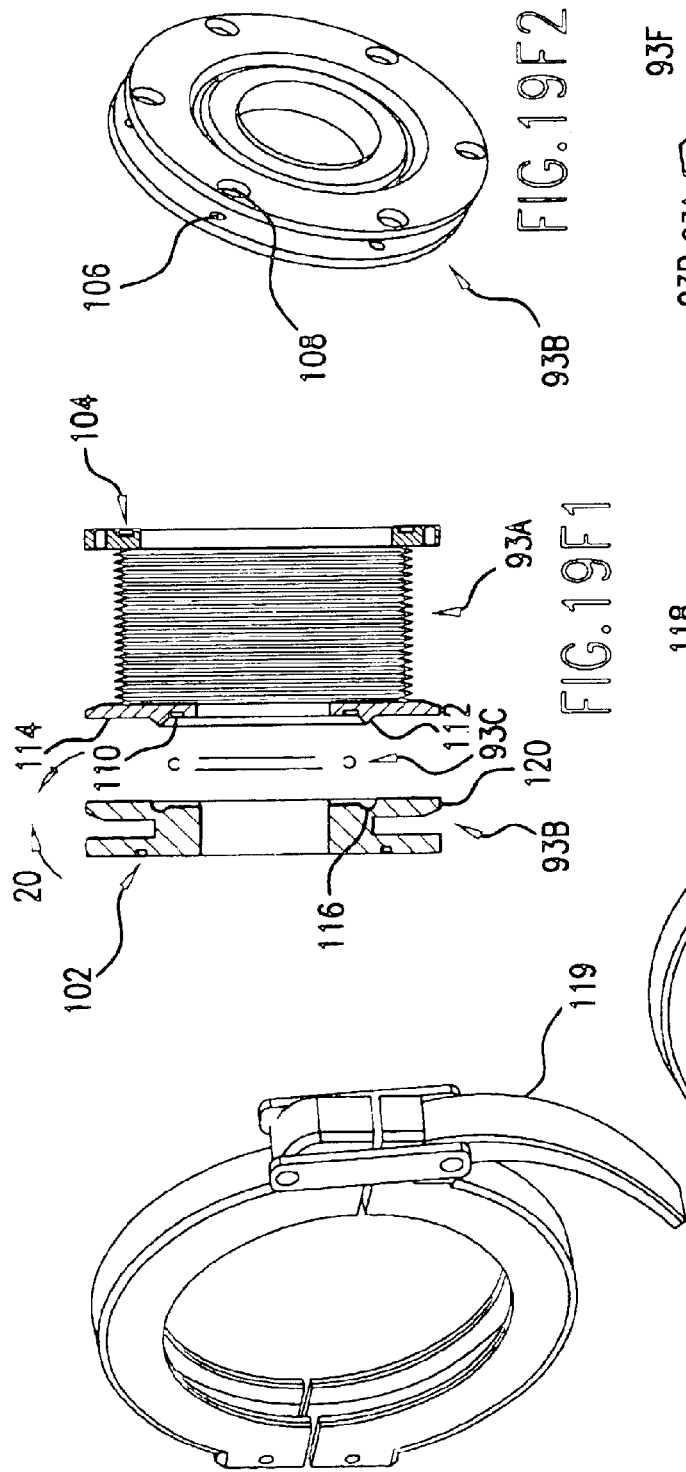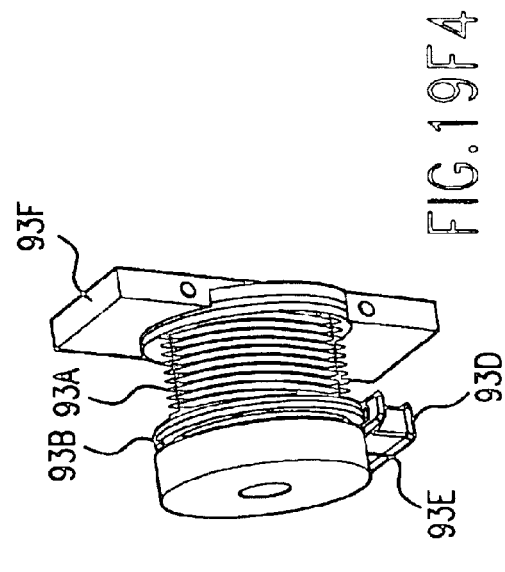
FIG.19F1
FIG.19F2
FIG.19F3
FIG.19F4
FIG.19F5

FOUR KHZ GAS DISCHARGE LASER SYSTEM

The present invention is a continuation-in-part of Ser. No. 10/012,002, filed Nov. 30, 2001, now U.S. Pat. No. 6,625,191 Ser. No. 10/000,991, filed Nov. 14, 2001, Ser. No. 10/029,319, filed Oct. 17, 2001, Ser. No. 09/943,343, filed Aug. 29, 2001, Ser. No. 09/854,097, filed May 11, 2001, Ser. No. 09/837,150, filed Apr. 18, 2001, Ser. No. 09/834,840, filed Apr. 13, 2001, Ser. No. 09/794,782, filed Feb. 27, 2001, Ser. No. 09/771,789, filed Jan. 29, 2001, Ser. No. 09/768,753, filed Jan. 23, 2001, Ser. No. 09/684,629, filed Oct. 6, 2000, Ser. No. 09/597,812, filed Jun. 19, 2000 and Ser. No. 09/473,852, filed Dec. 27, 1999. This invention relates to gas discharge lasers and in particular to high repetition rate gas discharge lasers.

BACKGROUND OF THE INVENTION

Electric Discharge Gas Lasers

Electric discharge gas lasers are well known and have been available since soon after lasers were invented in the 1960s. A high voltage discharge between two electrodes excites a gaseous gain medium. A resonance cavity containing the gain medium permits stimulated amplification of light which is then extracted from the cavity in the form of a laser beam. Many of these electric discharge gas lasers are operated in a pulse mode.

Excimer Lasers

Excimer lasers are a particular type of electric gas discharge laser and have been known as such since the mid 1970s. A description of an excimer laser, useful for integrated circuit lithography, is described in U.S. Pat. No. 5,023,884 issued Jun. 11, 1991 entitled "Compact Excimer Laser." This patent has been assigned to Applicants' employer, and the patent is hereby incorporated herein by reference. The excimer laser described in Patent '884 is a high repetition rate pulse laser. In FIGS. 1 and 2, the principal elements of the laser 10 are shown. (FIG. 1 corresponds to FIG. 1 and FIG. 2 corresponds to FIG. 7 in Patent '884.) The discharges 22 are between two long (about 23 inches) electrodes 18 and 20 spaced apart by about 5/8 inch. Repetition rates of prior art lasers, like the one described, are typically within the range of about 100 to 2000 pulses per second. These high repetition rate lasers are usually provided with a gas circulation system. In the above referred to laser, this is done with a long squirrel-cage type fan 46, having about 23 blades 48. The fan blade structure is slightly longer than the electrodes 18 and 20 and provides sufficient circulation so that at pulse operating rates, the discharge disturbed gas between the electrodes is cleared between pulses. The shaft 130 of fan 46 is supported by two ball bearings 132 as shown in FIG. 2A which is FIG. 9 of Patent '884. The gas used in the laser contains fluorine which is extremely reactive. The fan rotor driving fan shaft 130 is sealed, within the same environmental system provided by housing structure members 12 and 14, by sealing member 136 as explained at column 9, line 45 of Patent '884, and the motor stator 140 is outside sealing member 136 and thus protected from the corrosive action of the fluorine gas. However, bearing 132 is subjected to the corrosive action of the chamber gas as is the lubrication used in the bearing. Corrosion of the bearings and bearing lubrication can contaminate the gas.

Modular Design

These excimer lasers, when used for integrated circuit lithography, are typically operated on a fabrication line "around-the-clock"; therefore down time can be expensive. For this reason most of the components are organized into modules which can be replaced normally within a few minutes.

Line Narrowing

Excimer lasers used for lithography must have its output beam reduced in bandwidth to a fraction of a picometer. This "line-narrowing" is typically accomplished in a line narrowing module (called a "line narrowing package" or "LNP") which forms the back of the laser's resonant cavity. This LNP typically is comprised of delicate optical elements including prisms, a mirror and a grating. As repetition rates increase maintaining stable performance by the LNP becomes a serious challenge.

Pulse Power

Electric discharge gas lasers of the type described in U.S. Pat. No. 5,023,884 utilize an electric pulse power system such as that described in FIG. 3 to produce the electrical discharges, between the two electrodes. In such prior art systems, a direct current power supply 22 charges a capacitor bank called "the charging capacitor" or "$C_0$" 42 to a predetermined and controlled voltage called the "charging voltage" for each pulse. The magnitude of this charging voltage may be in the range of about 500 to 1000 volts. After $C_0$ has been charged to the predetermined voltage, a solid state switch 46 is closed allowing the electrical energy stored on $C_0$ to ring very quickly through a series of magnetic compression circuits comprising capacitor banks 52, 62 and 82 and inductors 48, 54 and 64 and a voltage transformer 56 to produce high voltage electrical potential in the range of about 16,000 volts across the electrode which produces the discharge which lasts about 50 ns.

In prior art systems on the market the time between the closing of the solid state switch and the discharge is in the range of about 5 microseconds; however, the charging of $C_0$ accurately to the pre-selected voltage has in the past required about 400 microseconds which was quick enough for pulse repetition rates of less than about 2,000 Hz. The reader should understand that accurate charging of $C_0$ is very important since the control of the voltage level on $C_0$ is in these systems the only practical control the laser operator has on the discharge voltage which in turn is the primary determiner of laser pulse energy.

Heat Exchanger

Prior art excimer lasers used for integrated circuit lithography typically require a system for cooling the laser gas which is heated both by the electric discharges and by the energy input through circulating fan discussed above. This is typically done with a water cooled, finned heat exchanger shown at 58 in FIG. 1. A doubling or more of the repetition rate of a laser more than doubles the heat generated in the laser primarily because power required to circulate the laser gas increases as the cube of the required gas velocity.

Control of Beam Quality

When used as a light source for integrated circuit lithography, the laser beam parameters (i.e., pulse energy, wavelength and bandwidth) typically are controlled to within very tight specifications. This requires pulse-to-pulse feedback control of pulse energy and somewhat slower feedback control of wavelength of the line narrowed output beam. A doubling or more of the pulse rate requires these feedback control systems to perform much faster.

What is needed is a better laser design for a pulse gas discharge laser for operation at repetition rates in the range of about 4,000 pulses per second.

SUMMARY OF THE INVENTION

The present invention provides an excimer laser system capable of producing a high quality pulsed laser beam at pulse rates of about 4,000 Hz at pulse energies of about 5 mJ or greater. The system can be configured to operate as a KrF or as an ArF laser with very minor changes. In a preferred embodiment the system is configured as a KrF excimer laser for operation at 4000 Hz and 6 mJ pulse energy and is specifically designed as a 248 nm (nominal) light source for integrated circuit lithography. An improved wavemeter with special software monitors output beam parameters and controls a very fast PZT driven tuning mirror and the pulse power charging voltage in feedback arrangements to maintain wavelength and pulse energy within desired limits. In a preferred embodiment two fan motors drive a single tangential fan which provides sufficient gas flow to clear discharge debris from the discharge region during the approximately 0.25 milliseconds between pulses. The system can be configured as an ArF laser without substantial changes in the system by changing the gas mixture, modifying the LNP output coupler and wavemeter for 193 nm (nominal) operation and preferably by making a slight adjustment in the electrode spacing. Almost all of the parts of the system for the two laser configurations are the same for both configurations.

BRIEF DESCRIPTION OF THE DRAWINGS

FIGS. 7, 7A and 8 show techniques for cooling pulse power components.

FIGS. 13 and 13A show views of the discharge region in the chamber of a preferred embodiment.

FIGS. 16A, 16B1 and 16B2 are drawings showing techniques for controlling the LNP tuning mirror.

FIGS. 19, 19A and 19B shows features of a preferred $N_2$ purge system.

FIGS. 19C–19G show features for sealing a beam path.

DETAILED DESCRIPTION OF PREFERRED EMBODIMENTS

FIRST PREFERRED EMBODIMENT

Described below is a first preferred embodiment of the present invention. It is an krypton fluoride (KrF) excimer laser designed to produce 7.5 mJ narrow-band approximately 248 nanometers (for example, 248.250 nm, 248,250 pm) pulses at pulse rates of up to about 4 KHz. Specifications for these lasers include a bandwidth specification range of less than 0.5 pm (FWHM bandwidth) and less than 1.4 pm (95% integral bandwidth). Specifications also call for 3 sigma wavelength stability of less than 0.05 pm and a 30-pulse dose stability of less than 0.5 mJ. FIG. 4B is a front view of this preferred embodiment with the doors removed and many of the laser components identified. The laser is a modular unit and designed so that complete modules can be replaced very quickly and easily in order to keep laser down time to a minimum. Going clockwise around FIG. 4B the identified components are:

status lamp 1K indicating the operational status of the laser, control module 2K which controls the functioning of the laser based on input control signals from a hand held terminal (not shown) or a master controller of a lithography machine, compression head module 3K which is part of the lasers pulse power system and provides the final stages of pulse compression of electrical pulses which charge a peaking capacitor bank located on top of the laser chamber, stabilization module 4K also called the wavemeter which monitors the laser pulses and provides feedback signals controlling wavelength and pulse energy, automatic shutter module 5K with power meter, MFT power supply 6K providing high voltage power to a metal fluoride trap (a filter) located on the laser chamber module, left side blower motor 7K, laser chamber module 8K, interface module 9K providing interface circuits to mate the laser controls with lithography machine controls, cooling supply module 10K, cooling water distribution module 11K, laser gas supply module 12K, ventilation assembly 13K for venting the laser cabinet gases to outside atmosphere including a smoke detector, right side blower motor 14K, line narrowing module 15K also called the line narrowing package or LNP, right side blower motor controller 16K, left side blower motor controller 17K, commutator module 18K which contains a Co changing capacitor bank and an electrical circuit for initiating electrical pulses and for providing early stage pulse compression and pulse voltage amplification, resonant charger module 19K for providing very fast resonant charging of the Co capacitor bank, high voltage power supply module 20K for producing high voltage DC power from standard facility three phase AC power, AC/DC distribution module 21K helium purge module (not shown)

wave stability module (not shown)

Figure 4A:
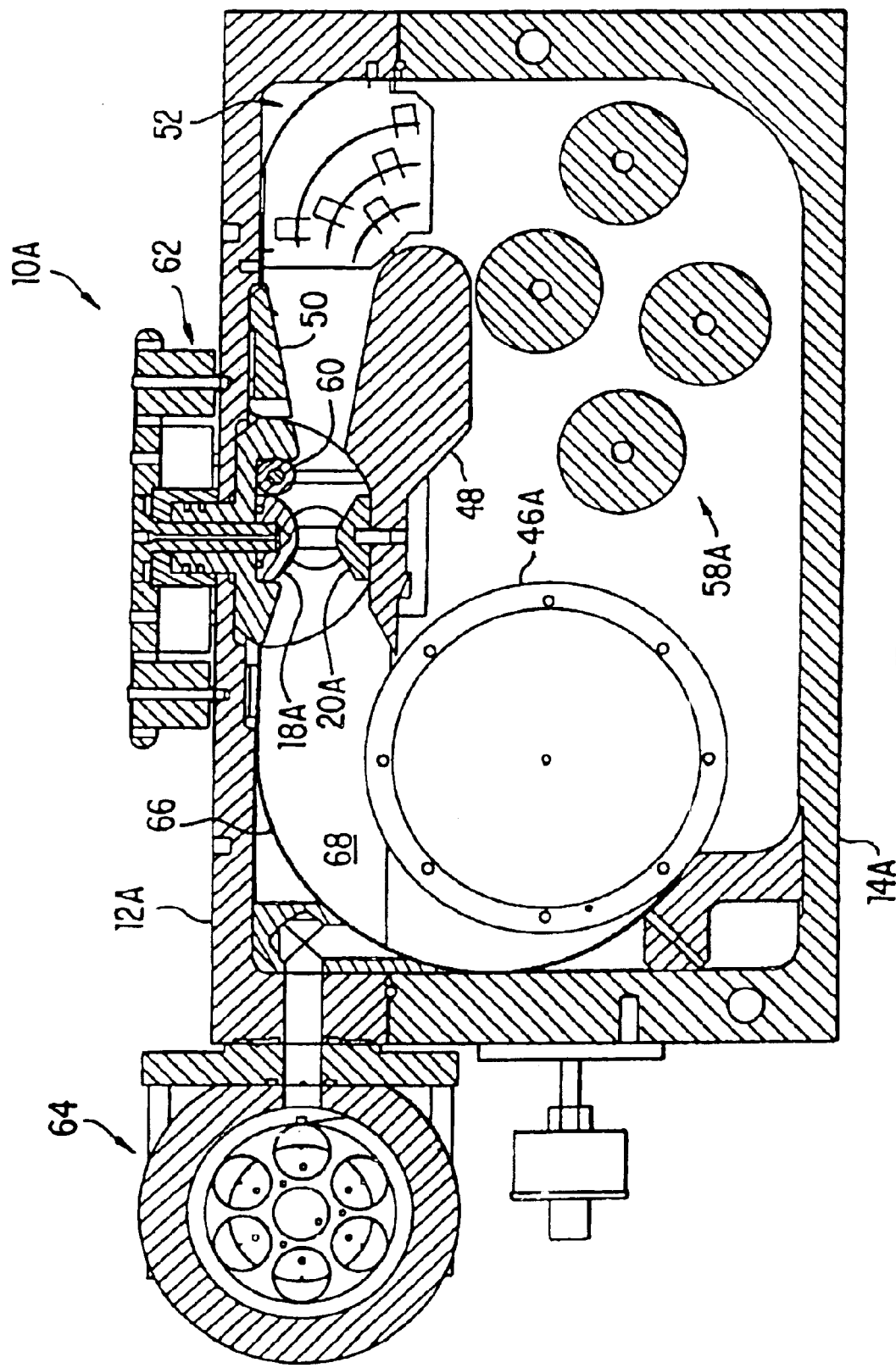
FIG. 4A shows a front view of a preferred embodiment of the present invention.
Figure 4B:
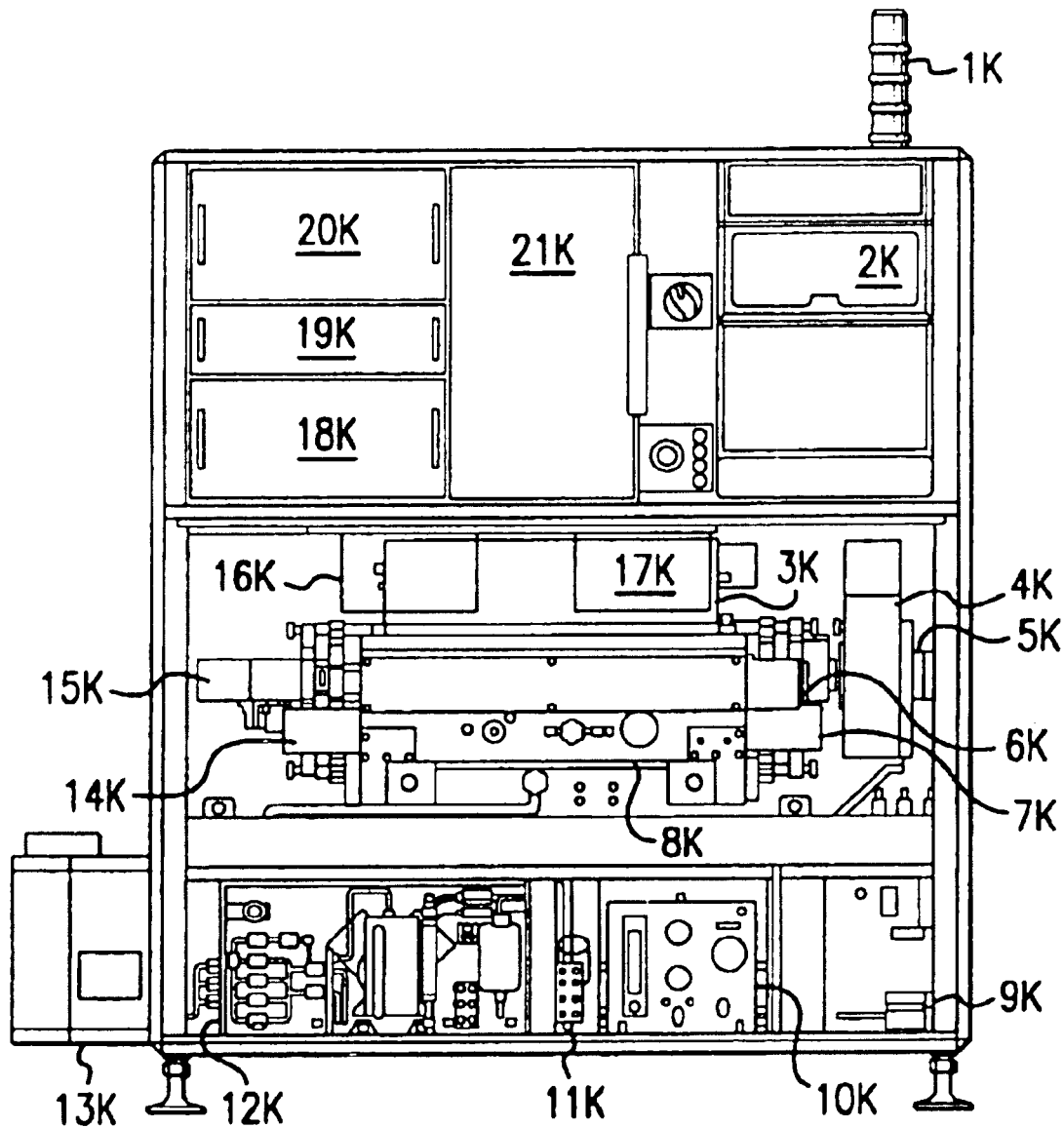
FIG. 4B shows a cross section of a laser chamber of the preferred embodiment.
Figure 13:
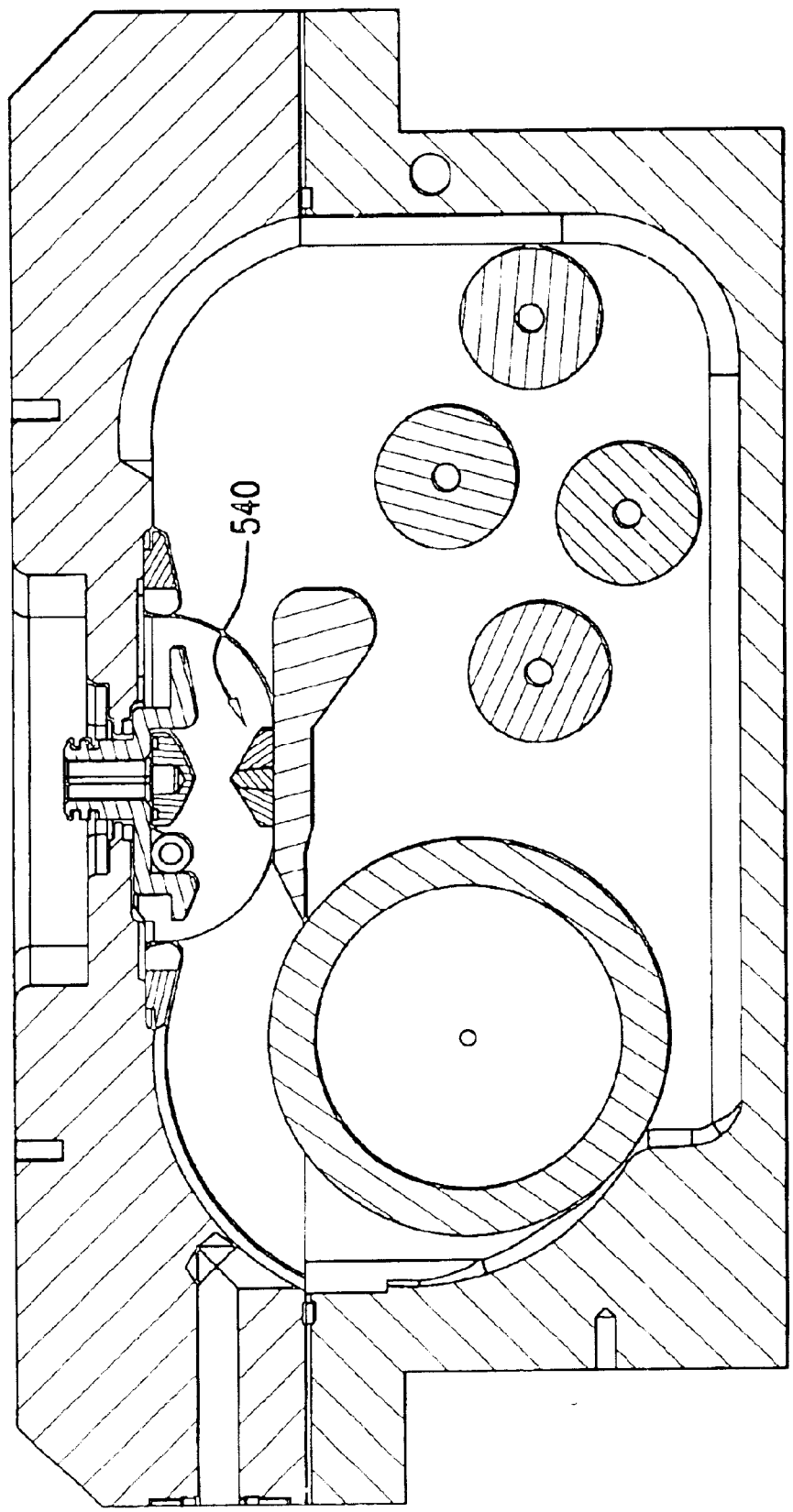

FIG. 4A is a cross section drawing of a laser chamber 10A of a first preferred embodiment of the present invention. The principal chamber components are housing structure members 12A and 14A, cathode 18A and anode 20A upstream preionizer tube 60, peaking capacitor bank 62 and electrostatic trap unit 64 (all of which are similar to the prior art corresponding components shown in FIG. 1). The chamber includes a new anode support flow shaping structure 48, a new upper flow shaping structure 50, gas turning vanes 52, a new 5 inch diameter tangential type fan blade structure 46A and four water cooled heat exchanger units 58A. FIG. 13 show a similar alternate chamber configuration with a new current return 548.

Figure 16:
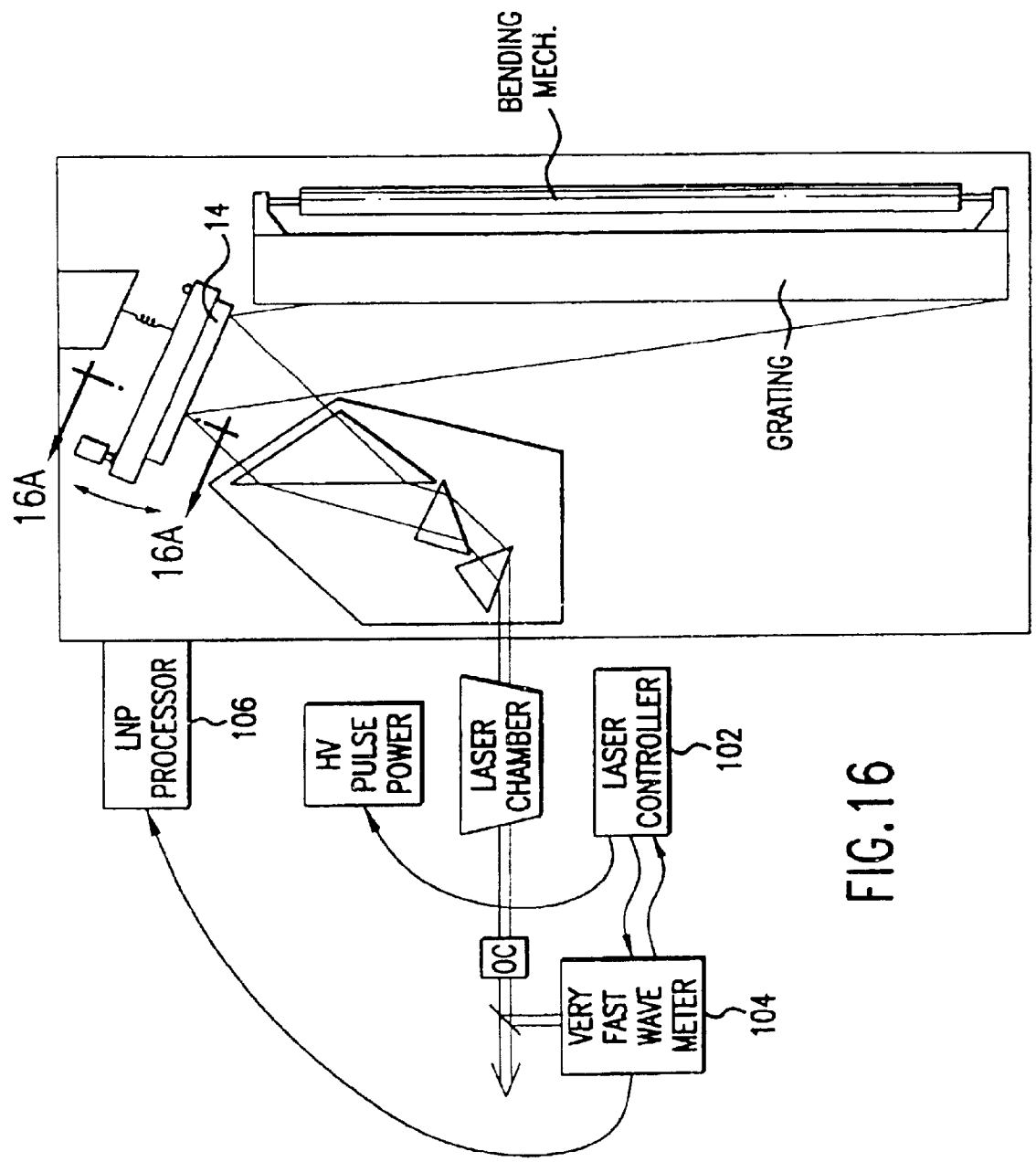
FIG. 16 is a block diagram showing features of the laser system used for controlling the wavelength and pulse energy of the laser beam.

FIG. 16 is a block diagram showing features of the laser system which are important for controlling the wavelength and pulse energy of the output beam.

Important improvements over prior art gas discharge lasers include:

1) Improved flow path for circulating chamber laser gas
2) Water cooled pulse power system
3) Ultra fast wavemeter with fast control algorithm
4) New high duty cycle LNP with combination PZT and stepper motor driven tuning mirror
5) Large tangential fan with dual water-cooled brushless DC drive blower motors with special controllers
6) Ultra pure nitrogen purge system for optics protection
7) Sealed shutter with power meter
8) Improved heat exchanger arrangement
9) Beam seal system
10) Helium purge for LNP
11) Current return with ribs parallel to gas flow
12) Inductance plate for chamber impedance optimization
13) Electrode optimization for performance life.

LASER CHAMBER

Heat Exchangers

This preferred embodiment is designed to operate at pulse repetition rates of 4,000. Clearing the discharge region of discharge affected gas between pulses requires a gas flow between the electrodes 18A and 20A of up to about 67 m/s. To achieve these speeds, the diameter of tangential fan unit has been set at 5 inches (the length of the blade structure is 26 inches) and the rotational speed has been increased to about 3500 rpm. To achieve this performance the embodiment utilizes two motors which together deliver up to about 4 kw of drive power to the fan blade structure. At a pulse rate of 4000 Hz, the discharge will add about 12 kw of heat energy to the laser gas. To remove the heat produced by the discharge along with the heat added by the fan four separate water cooled finned heat exchanger units 58A are provided. The motors and the heat exchangers are described in detail below.

Preferred embodiments of the present invention utilizes four finned water cooled heat exchangers 58A shown generally in FIG. 4A and FIG. 13. Each of these heat exchangers is somewhat similar to the single heat exchangers shown at 58 in FIG. 1 having however substantial improvements.

Heat Exchanger Components

Figures 21, 21A:
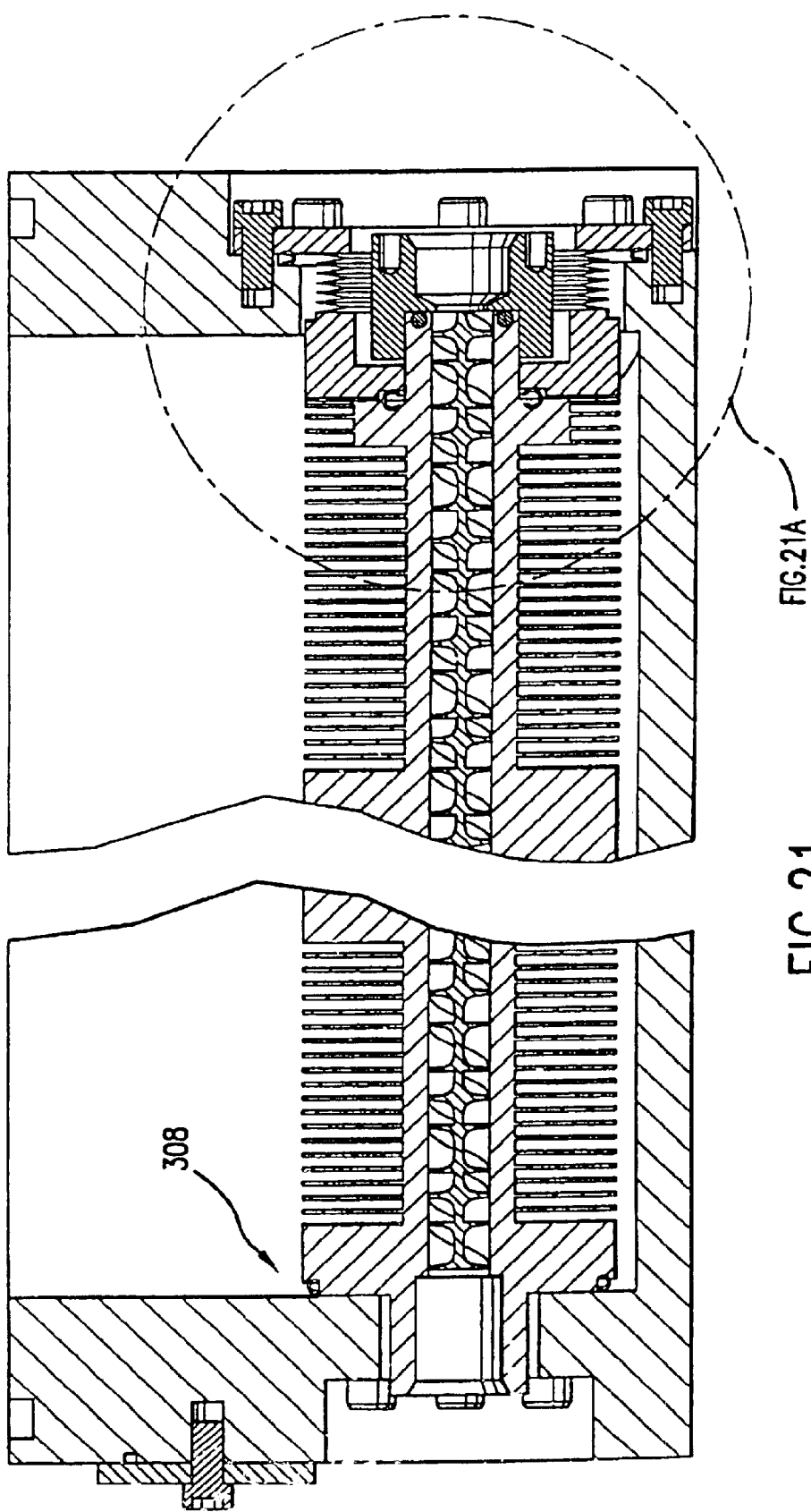
FIGS. 21 and 21A show features of preferred water cooled finned heat exchanges.
Figure 21A:
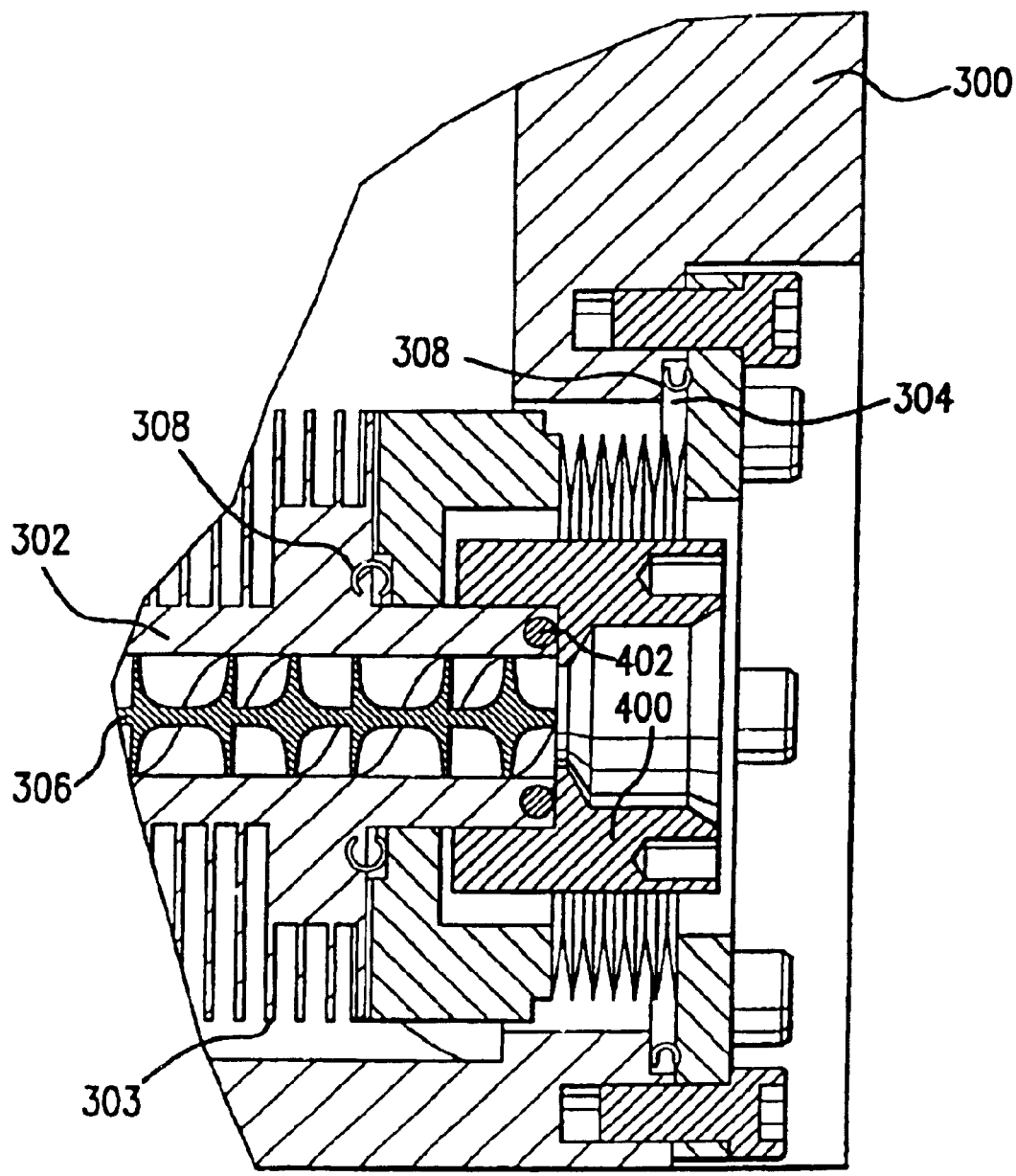

A cross sectional drawing of one of the heat exchangers is shown in FIG. 21. The middle section of the heat exchanger is cut out but both ends are shown. FIG. 21A shows an enlarged view of the end of the heat exchanger which accommodates thermal expansion and contraction.

The components of the heat exchanger includes a finned structure 302 which is machined from solid copper (CU 11000) and contains twelve fins 303 per inch. Water flow is through an axial passage having a bore diameter of 0.33 inch. A plastic turbulator 306 located in the axial passage prevents stratification of water in the passage and prevents the formation of a hot boundary layer on the inside surface of the passage. A flexible flange unit 304 is a welded unit comprised of inner flange 304A, bellows 304B and outer flange 304C. The heat exchanger unit includes three c-seals 308 to seal the water flowing in the heat exchanger from the laser gas. Bellows 304B permits expansion and contraction of the heat exchanger relative to the chamber. A double port nut 400 connects the heat exchanger passage to a standard $5/16$ inch positional elbow pipe fitting which in turn is connected to a water source. O-ring 402 provides a seal between nut 400 and finned structure 302.

The Turbulator

In a preferred embodiment, the turbulator is comprised of four off-the-shelf, long in-line mixing elements which are typically used to mix epoxy components and are available from 3M Corporation (Static Mixer, Part No. 06-D1229-00). The in-line mixers are shown at 306 in FIGS. 21 and 21A. The in-line mixers force the water to flow along a generally helical path which reverses its clockwise direction about every pitch distance (which is 0.3 inch). The turbulator substantially improves heat exchanger performance. Tests by Applicants have shown that the addition of the turbulator reduces the required water flow by a factor of roughly 5 to maintain comparable gas temperature conditions.

Flow Path

In this preferred embodiment, gas flow into and out of the discharge region has been greatly improved over prior art laser chambers. Vane structure 66 is designed to normalize gas velocity in the region 68, just downstream of the fan blade structure at about 20 m/s. In the FIG. 13 embodiment the chamber top is machined to provide a similar flow shaping surface. The velocity of the gas then speeds up in the discharge region to the design velocity of 67 m/s. At about 4 inches downstream of the center of the discharge region, the flow cross section increases at an angle of 20 degrees from about ⅝ inch to about 4 inches before the gas is turned by four turning vanes 52. This permits recovery of a large percentage of the pressure drop through the discharge region. Whale-bone shaped current return 548 as shown in FIG. 13A(1) is laser machined from 0.015 inch thick nickel alloy (UNS N04400) and bent into the shape as shown in FIGS. 13A(3) through 13A(8) so that the 23 ribs present minimum resistance to gas flow. Each rib has a cross section of 0.015 inch×0.090 inch with the long dimension in a direction parallel to the gas flow direction.

Blower Motors and Large Blower

This first preferred embodiment of the present invention provides a large tangential fan driven by dual motors for circulating the laser gas. This preferred arrangement as shown in FIG. 18 provides a gas flow between the electrode of 67 m/sec which is enough to clear a space of about 1.7 cm in the discharge region between 4,000 Hz pulses.

A cross section blade structure of the fan is shown as 64A in FIG. 4A. A prospective view is shown in FIG. 18A. The blade structure has a 5 inch diameter and is machined out of a solid aluminum alloy 6061-T6 bar stock. The individual blade in each section is slightly offset from the adjacent section as shown in FIG. 18A to minimize blade caused pressure perturbation in the discharge region. Preferably the individual blades have leading edges tapering to a knife edge so as to reduce reflections of discharge acoustic waves off the front edge of the blades during operation.

Figure 18:
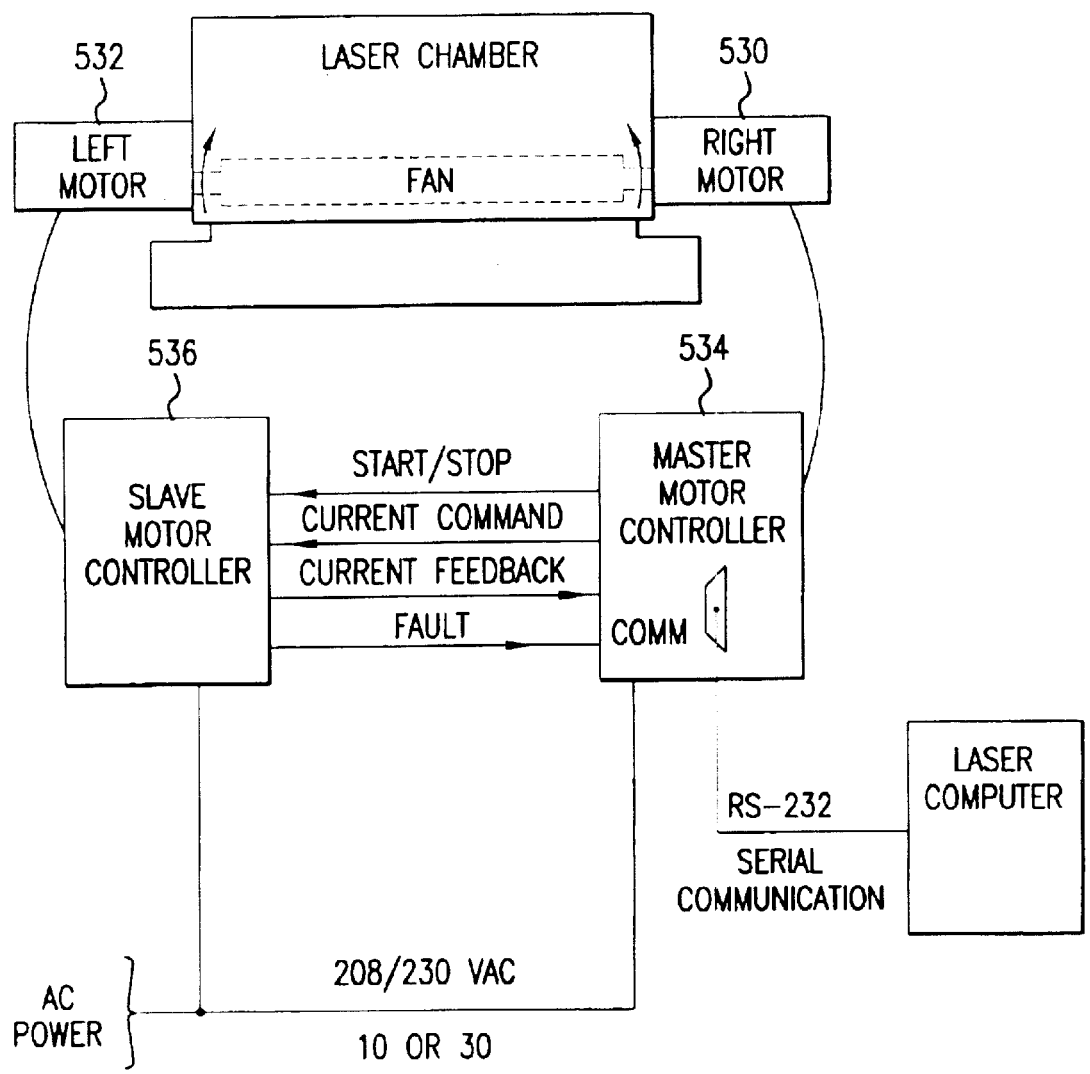
FIG. 18 shows a two-motor blower control system.
Figure 18A:
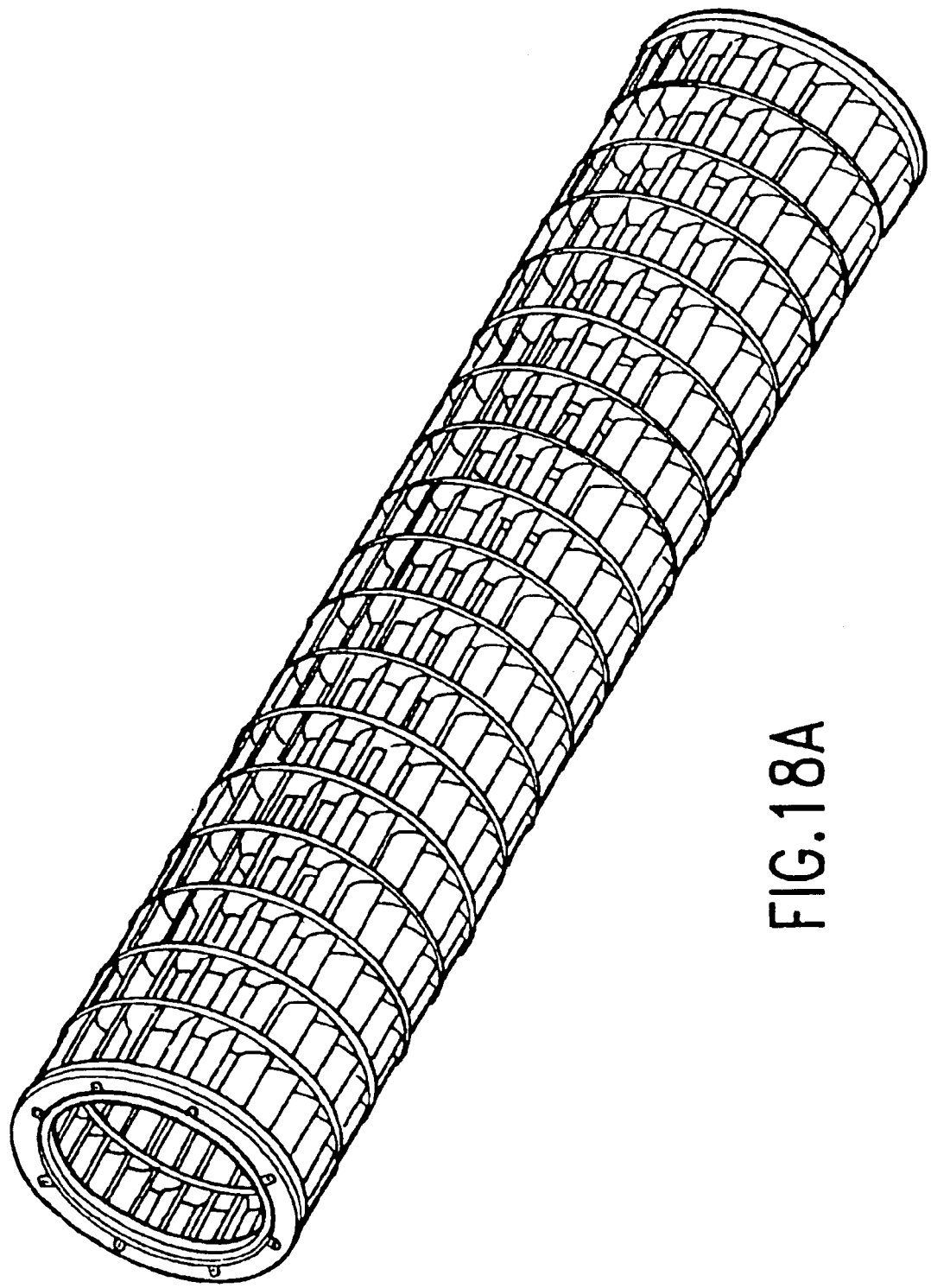
FIG. 18A shows a blower blade structure.

This embodiment as shown in FIG. 18 utilizes two 3 phase brushless DC motors each with a magnetic rotor contained within a metallic pressure cup which separates the stator portion of the motors from the laser gas environment as described in U.S. Pat. No. 4,950,840. In this embodiment, the pressure cup is thin-walled nickel alloy 400, 0.016 inch thick which functions as the laser gas barrier. The two motors 530 and 532 drive the same shaft and are programmed to rotate in opposite directions. Both motors are sensorless motors (i.e., they operate without position sensors). Right motor controller 534 which controls right motor 530 functions as a master controller controlling slave motor controller 536 via analog and digital signals to institute start/stop, current command, current feedback, etc. Communication with the laser controller 24A is via a RS-232 serial port into master controller 534.

WATER COOLED PULSE POWER SYSTEM

Four Thousand Hz Pulse Power System

Operation of laser systems in accordance with the present invention requires precisely controlled electrical potentials in the range of about 12,000 V to 30,000 V be applied between the electrodes at 4,000 Hz (i.e., at intervals of about 250 micro seconds). As indicated in the background section, in prior art pulse power systems a charging capacitor bank is charged to a precisely predetermined control voltage and the discharge is produced by closing a solid state switch which allows the energy stored on the charging capacitor to ring through a compression-amplification circuit to produce the desired potential across the electrodes. The time between the closing of the switch to the completion of the discharge is only a few microseconds, (i.e., about 5 microseconds) but the charging of $C_0$ in prior art systems required a time interval much longer than 250 microseconds. It is possible to reduce the charging time by using a larger power supply or several power supplies in parallel. For example, Applicants have been able to operate at 4,000 Hz using three prior art power supplies arranged in parallel.

Figure 3:
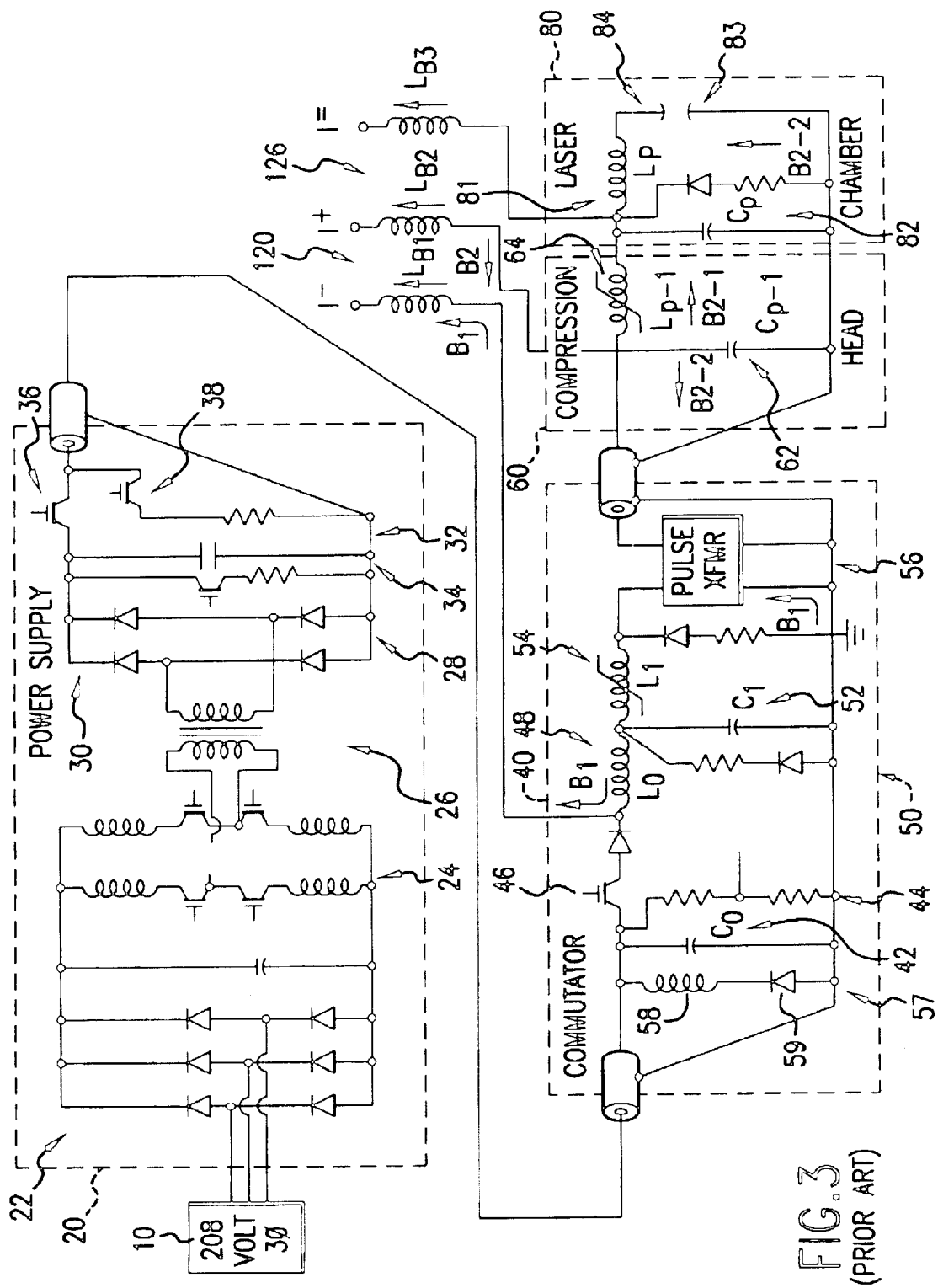
FIG. 3 is a circuit diagram of a prior art pulse power system.
Figure 5:
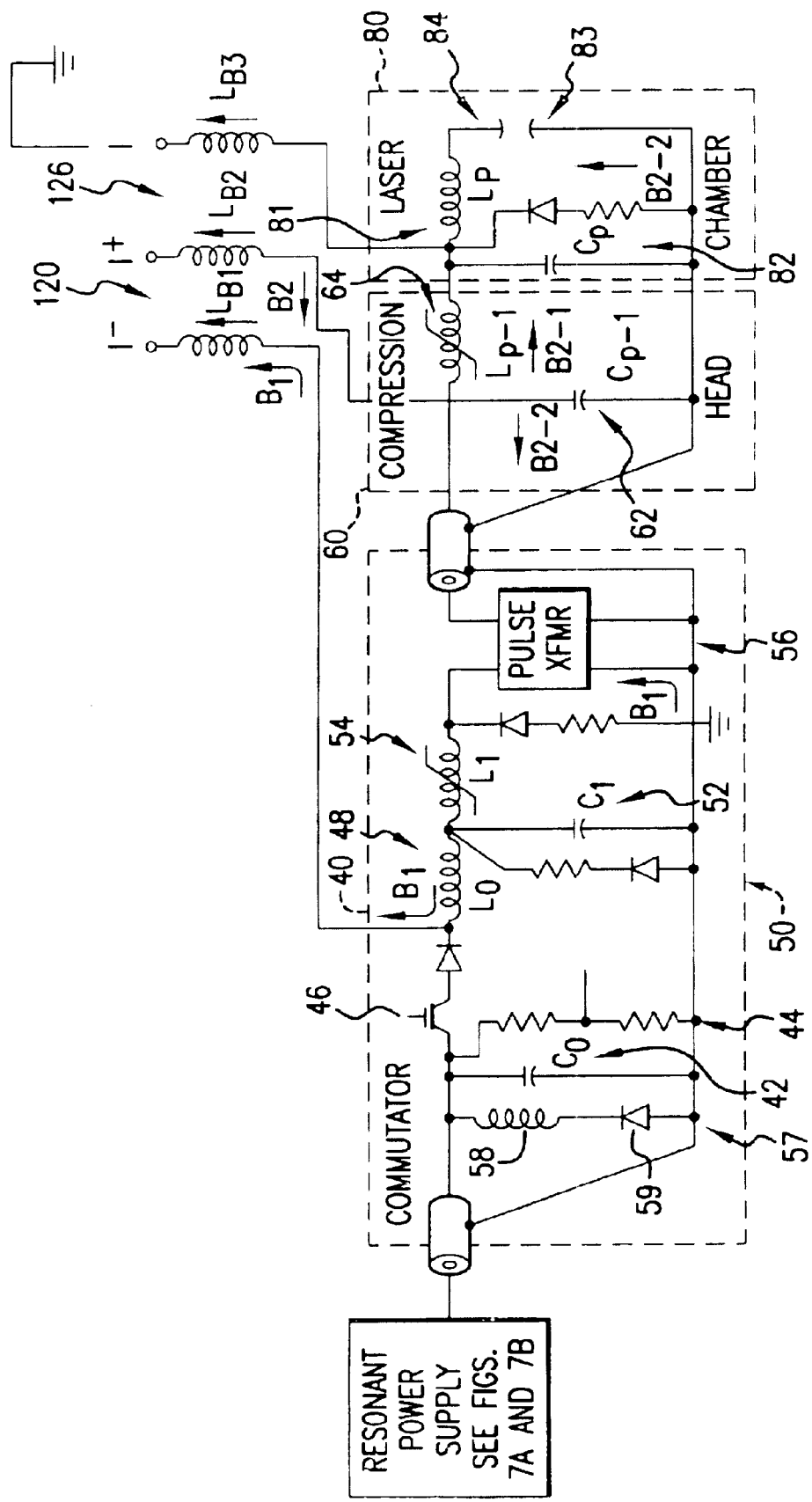
FIG. 5 shows an electrical circuit diagram of a preferred pulse power system.

In this preferred embodiment, as shown in FIG. 5 Applicants utilize the same basic design as in the prior art shown in FIG. 3 for the portion of the pulse power system downstream of the solid state switch, but Applicants utilize a radically different technique for charging $C_0$.

Resonant Charging

Applicants have utilized two types of resonant charging systems for very fast charging of $C_0$. These systems can be described by reference to FIGS. 6A and 6B.

First Resonant Charger

Figure 6A:
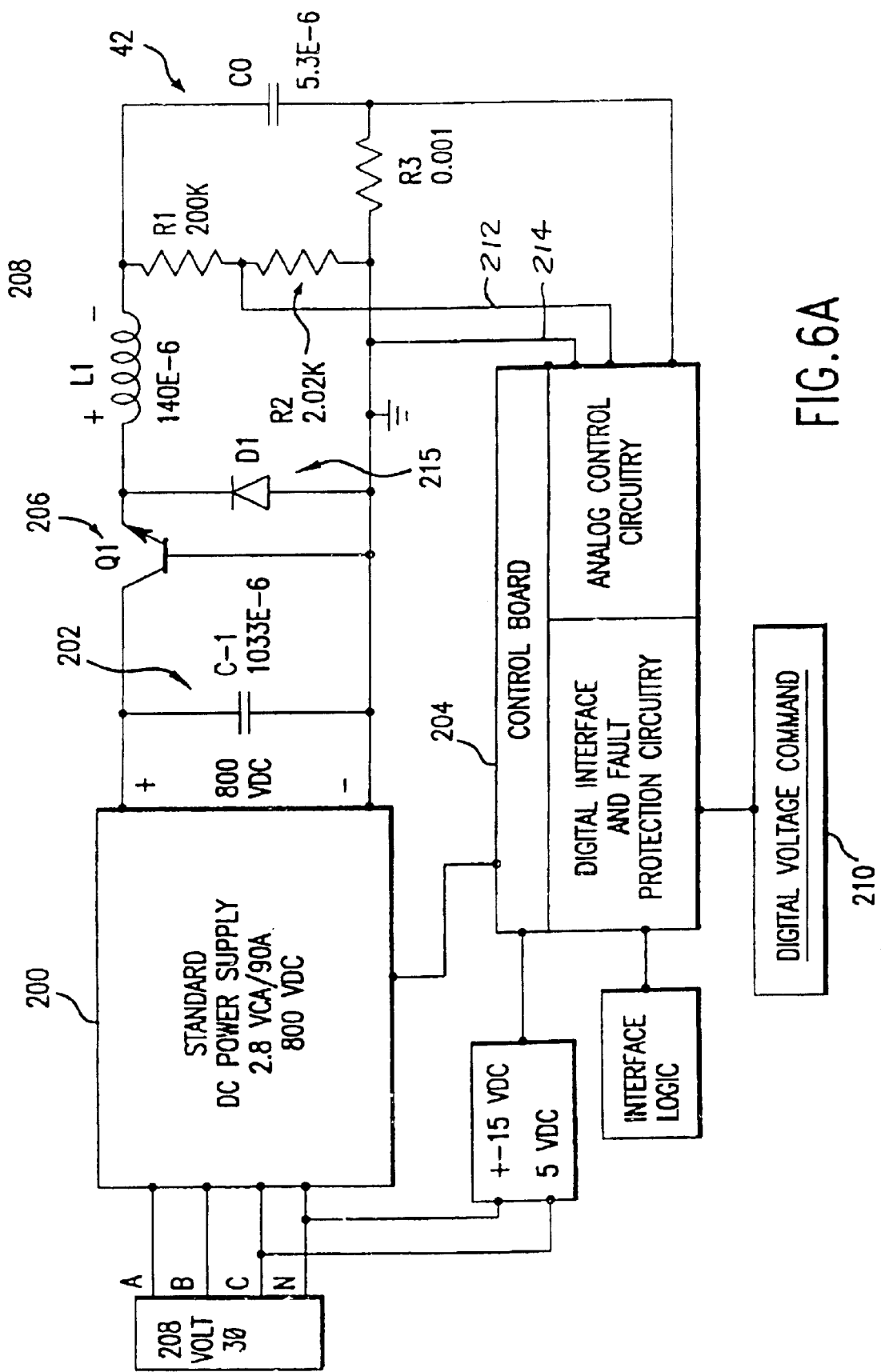
FIGS. 6A and 6B show two preferred resonant power supplies.

An electrical circuit showing this preferred resonant charges is shown in FIG. 6A. In this case, a standard dc power supply 200 having a 208 VAC/90 amp input and an 800 VDC 50 amp output is used. The power supply is a dc power supply adjustable from approximately 600 volts to 800 volts. The power supply is attached directly to C-1 eliminating the need for voltage feedback to the supply. When the supply is enabled it turns on and regulates a constant voltage on C-1 capacitor. The performance of the system is somewhat independent of the voltage regulation on C-1 therefore only the most basic control loop is necessary in the power supply. Secondly the supply will be adding energy into the system whenever the voltage on C-1 falls below the voltage setting. This allows the power supply the entire time between initiation of laser pulses, (and even during laser pulses), to replenish energy transferred from C-1 to $C_0$. This further reduces the power supply peak current requirements over the prior art pulse power systems. The combination of requiring a supply with the most basic control loop, and minimizing the peak current rating of the supply to the average power requirements of the system reduces the power supply cost an estimated 50%. Additionally this preferred design provides vendor flexibility since constant current, fixed output voltage power supplies are readily available from multiple sources. Such power supplies are available from suppliers such as Elgar, Universal Voltronics, Kaiser and EMI.

Control Board

This power supply continuously charges a 1033 μF capacitor 202 to the voltage level commanded by the control board 204. The control board 204 also commands IGBT switch 206 closed and open to transfer energy from capacitor 292 to capacitor 42. Inductor 208 sets up the transfer time constant in conjunction with capacitor 202 and 42 and limits the peak charging current. Control board 204 receives a voltage feedback 212 that is proportional to the voltage on capacitor 42 and a current feedback 214 that is proportional to the current flowing through inductor 208. From these two feedback signals control board 204 can calculate in real time the final voltage on capacitor 42 should IGBT switch 206 open at that instant of time. Therefore with a command voltage 210 fed into control board 204 a precise calculation can be made of the stored energy within capacitor 42 and inductor 208 to compare to the required charge voltage commanded 210. From this calculation, the control board 204 will determine the exact time in the charge cycle to open IGBT switch 206.

System Accuracy

After IGBT switch 206 opens the energy stored in the magnetic field of inductor 208 will transfer to capacitor 42 through the free-wheeling diode path 215. The accuracy of the real time energy calculation will determine the amount of fluctuation dither that will exist on the final voltage on capacitor 42. Due to the extreme charge rate of this system, too much dither may exist to meet a desired systems regulation need of ±0.05%. If so, additional circuitry may be utilized, such as for example, a de-qing circuit or a bleed-down circuit as discussed below.

Second Resonant Charger

Figure 6B:
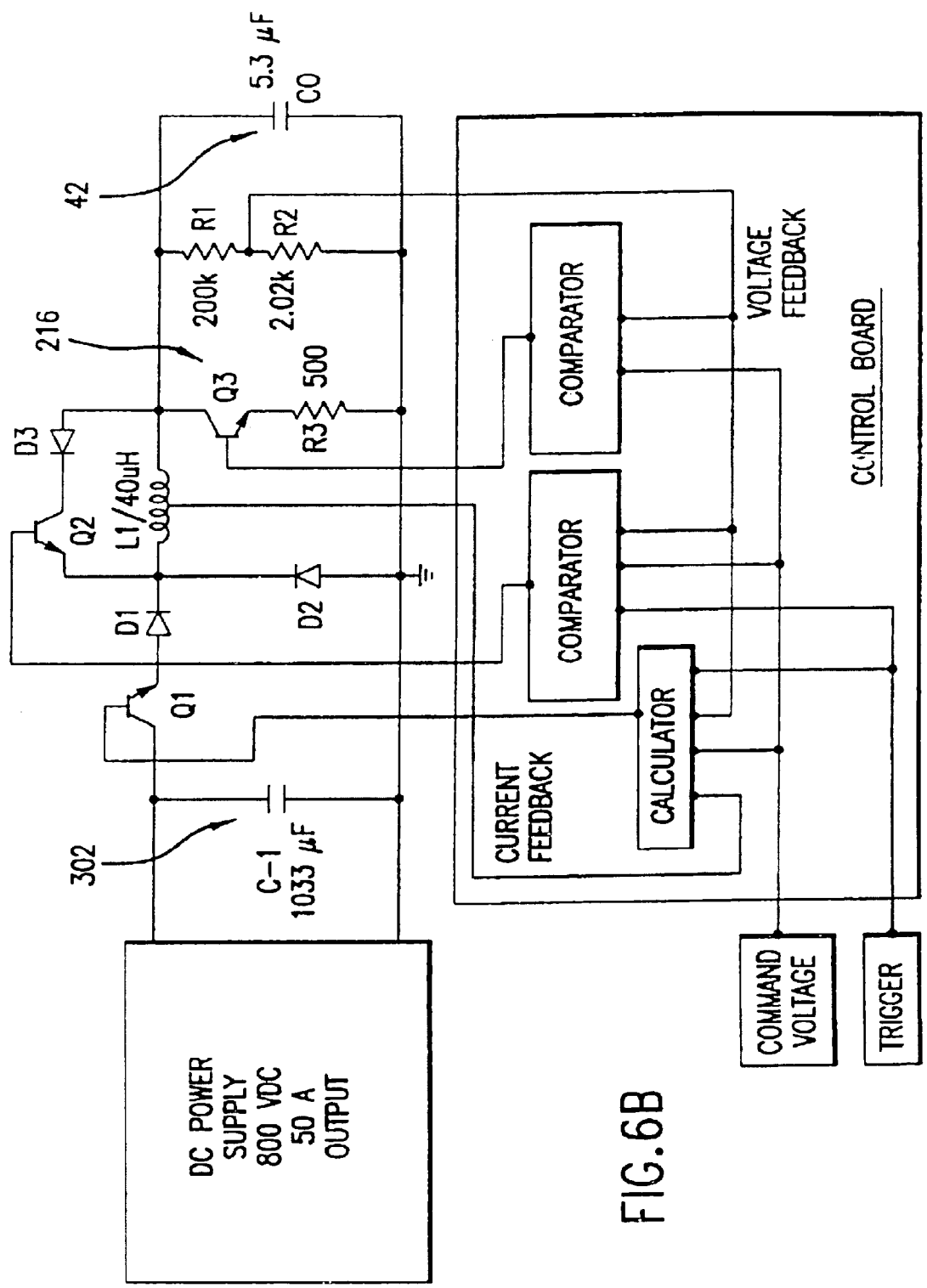

A second resonant charger system is shown in FIG. 6B. This circuit is similar to the one shown in FIG. 6A. The principal circuit elements are:

I1—A three-phase power supply 300 with a constant DC current output.

C-1—A source capacitor 302 that is an order of magnitude or more larger than the existing C0 capacitor 42.

Q1, Q2, and Q3—Switches to control current flow for charging and maintaining a regulated voltage on $C_0$.

D1, D2, and D3—Provides current single direction flow.

R1, and R2—Provides voltage feedback to the control circuitry.

R3—Allows for rapid discharge of the voltage on $C_0$ in the event of a small over charge.

L1—Resonant inductor between C-1 capacitor 302 and $C_0$ capacitor 4-2 to limit current flow and setup charge transfer timing.

Control Board 304—Commands Q1, Q2, and Q3 open and closed based upon circuit feedback parameters.

An example of operation is as follows:

The difference in the circuit of FIG. 6B from that of 6A is the addition of switch Q2 and diode D3, known as a De-Qing switch. This switch improves the regulation of the circuit by allowing the control unit to short out the inductor during the resonant charging process. This "de-qing" prevents additional energy stored in the current of the charging inductor, L1, from being transferred to capacitor $C_0$.

Prior to the need for a laser pulse the voltage on C-1 is charged to 600–800 volts and switches Q1–Q3 are open. Upon command from the laser, Q1 would close. At this time current would flow from C-1 to $C_0$ through the charge inductor L1. As described in the previous section, a calculator on the control board would evaluate the voltage on $C_0$ and the current flowing in L1 relative to a command voltage set point from the laser. Q1 will open when the voltage on $C_0$ plus the equivalent energy stored in inductor L1 equals the desired command voltage. The calculation is:

$$V_f = [V_{C0s}^2 + ((L_1 * I_{L1s}^2)/C_0)]^{0.5}$$

Where:

$V_f$=The voltage on $C_0$ after Q1 opens and the current in L1 goes to zero.

$V_{C0s}$=The voltage on $C_0$ when Q1 opens.

$I_{L1s}$=The current flowing through $L_1$ when Q1 opens.

After Q1 opens the energy stored in L1 starts transferring to $C_0$ through D2 until the voltage on $C_0$ approximately equals the command voltage. At this time Q2 closes and current stops flowing to $C_0$ and is directed through D3. In addition to the "de-qing" circuit, Q3 and R3 from a bleed-down circuit to allow additional fine regulation of the voltage on $C_0$.

Switch Q3 of bleed down circuit 216 will be commanded closed by the control board when current flowing through inductor L1 stops and the voltage on C0 will be bled down to the desired control voltage; then switch Q3 is opened. The time constant of capacitor $C_0$ and resistor R3 should be sufficiently fast to bleed down capacitor $C_0$ to the command voltage without being an appreciable amount of the total charge cycle.

As a result, the resonant charger can be configured with three levels of regulation control. Somewhat crude regulation is provided by the energy calculator and the opening of switch Q1 during the charging cycle. As the voltage on $C_0$ nears the target value, the de-qing switch is closed, stopping the resonant charging when the voltage on $C_0$ is at or slightly above the target value. In a preferred embodiment, the switch Q1 and the de-qing switch is used to provide regulation with accuracy better than +/-0.1%. If additional regulation is required, the third control over the voltage regulation could be utilized. This is the bleed-down circuit of switch Q3 and R3 (shown at 216 in FIG. 6B) to discharge $C_0$ down to the precise target value.

Improvements Downstream of $C_0$

As indicated above, the pulse power system of the present invention utilizes the same basic design as was used in the prior art systems described in FIG. 3. However, some significant improvements in that basic design were required for the approximate factor of 3 increase in heat load resulting from the greatly increased repetition rate. These improvements are discussed below.

Detailed Commutator and Compression Head Description

The principal components of commutator 40 and compression head 60 are shown in FIG. 3 and are discussed in the Background section with regard to the operation of the system. In this section, we describe details of fabrication of the commutator and the compression head.

Solid State Switch

Solid state switch 46 is an P/N CM 800 HA-34H IGBT switch provided by Powerex, Inc. with offices in Youngwood, Pa. In a preferred embodiment, two such switches are used in parallel.

Inductors

Inductors 48, 54 and 64 are saturable inductors similiar to those used in prior systems as described in U.S. Pat. Nos. 5,448,580 and 5,315,611 which are incorporated herein by reference. FIG. 7 shows a preferred design of the $L_0$ inductor 48. In this inductor four conductors from the two IGBT switches 46B pass through sixteen ferrite toroids 49 to form part 48A an 8 inch long hollow cylinder of very high permability material with an ID of about 1 inch and an Od of about 1.5 inch. Each of the four conductors are then wrapped twice around an insulating doughnut shaped core to form part 48B. The four conductors then connect to a plate which is in turn connected to the high voltage side of the $C_1$ capacitor bank 52.

Figure 8:
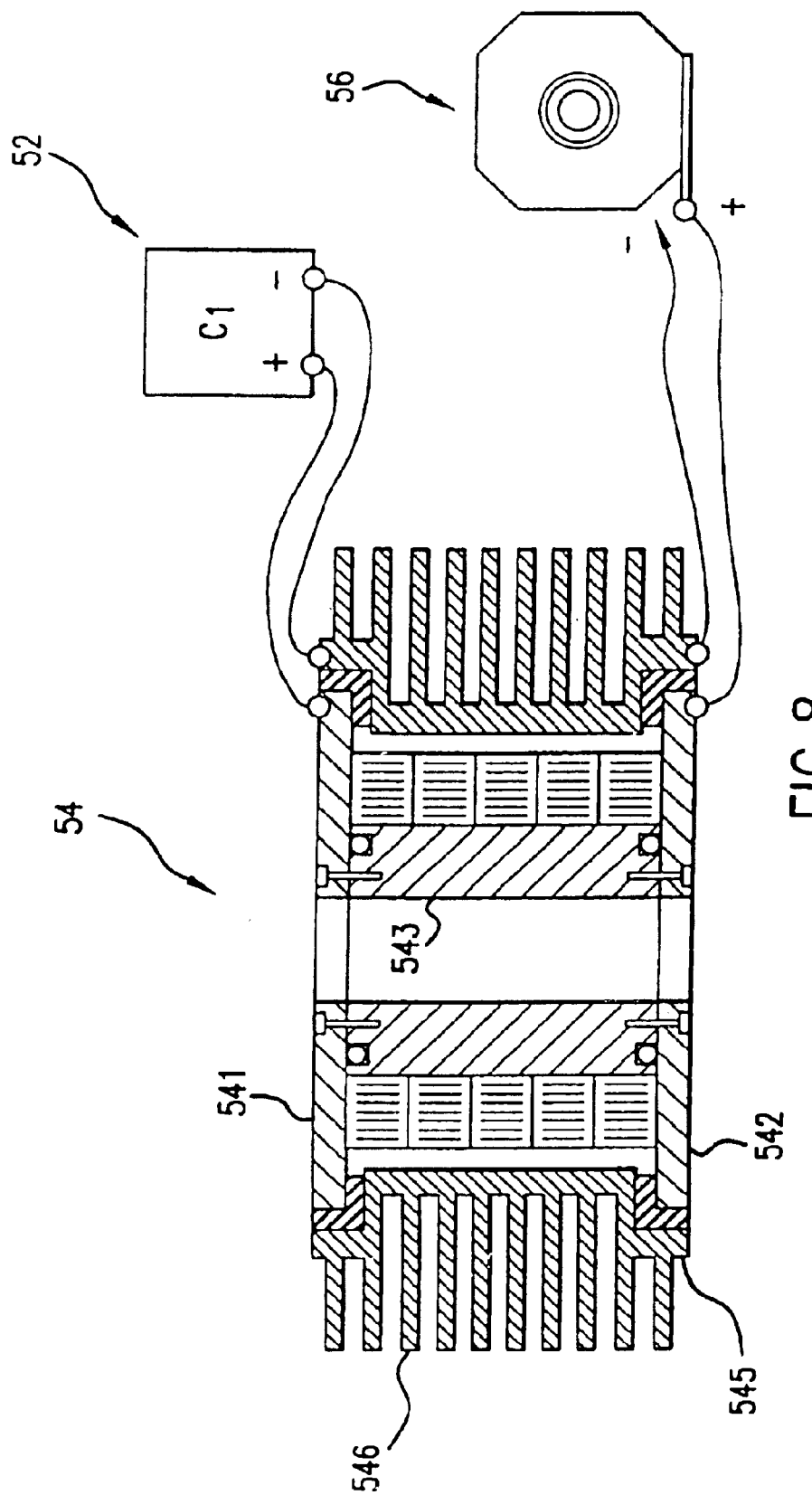

A preferred sketch of saturable inductor 54 is shown in FIG. 8. In this case, the inductor is a single turn geometry where the assembly top and bottom lids 541 and 542 and center mandrel 543, all at high voltage, form the single turn through the inductor magnetic cores. The outer housing 545 is at ground potential. The magnetic cores are 0.0005" thick tape wound 50—50% Ni—Fe alloy provided by Magnetics of Butler, Pa. or National Arnold of Adelanto, Calif. Fins 546 on the inductor housing facilitate transfer of internally dissipated heat to forced air cooling. In addition, a ceramic disk (not shown) is mounted underneath the reactor bottom lid to help transfer heat from the center section of the assembly to the module chassis base plate. FIG. 8 also shows the high voltage connections to one of the capacitors of the $C_1$ capacitor bank 52 and to a high voltage lead on one of the induction units of the 1:25 step up pulse transformer 56. The housing 54S is connected to the ground lead of unit 56.

Figure 9A:
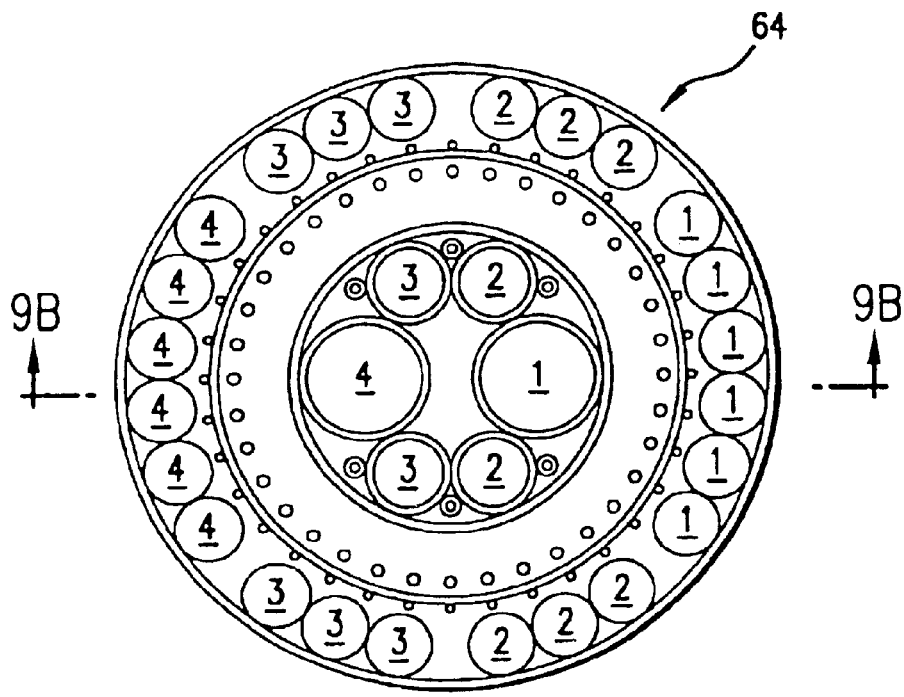
FIGS. 9A and 9B show views of a saturable inductor.
Figure 9B:
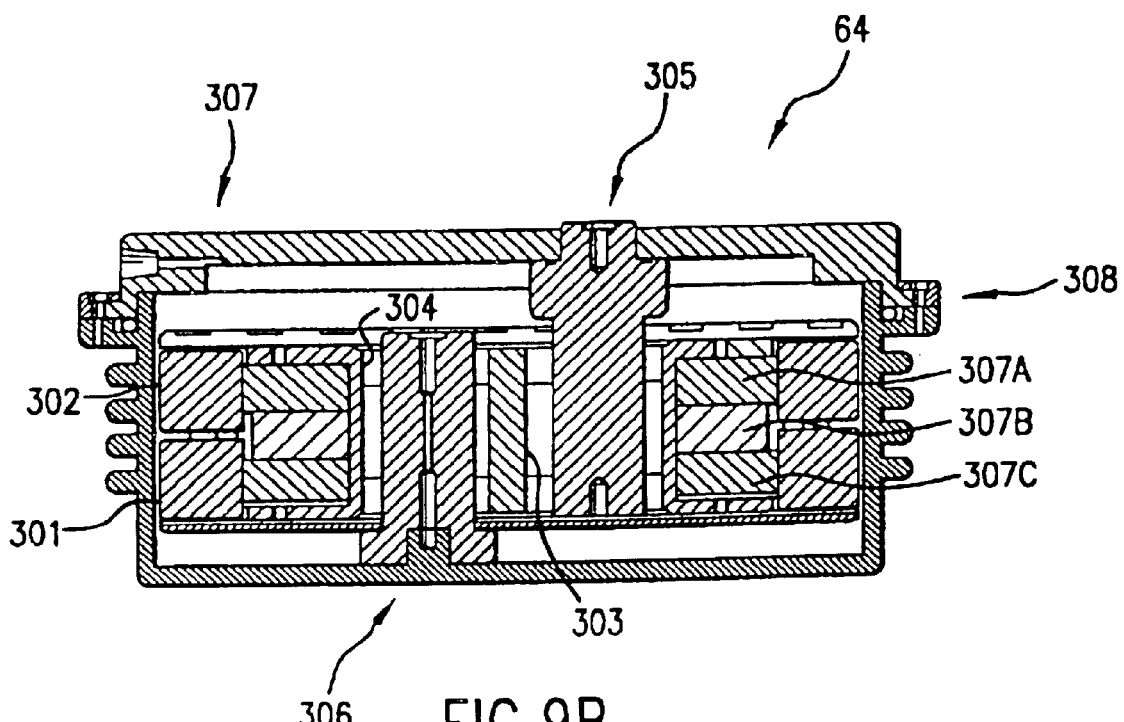

A top and section view of the saturable inductor 64 is shown respectively in FIGS. 9A and 9B. In the inductors of this embodiment, flux excluding metal pieces 301, 302, 303 and 304 are added as shown in FIG. 9B in order to reduce the leakage flux in the inductors. These flux excluding pieces substantially reduce the area which the magnetic flux can penetrate and therefore help to minimize the saturated inductance of the inductor. The current makes five loops through vertical conductor rods in the inductor assembly around magnetic core 307. The current enters at 305 travels down a large diameter conductor in the center labeled "1" and up six smaller conductors on the circumference also labeled "1" as shown in FIG. 9A. The current then flows down two conductors labeled 2 on the inside, then up the six conductors labeled 2 on the outside then down flux exclusion metal on the inside then up the six conductors labeled 3 on the outside, then down the two conductors labeled 3 on the inside, then up the six conductors labeled 4 on the outside, then down the conductor labeled 4 on the inside. The flux exclusion metal components are held at half the full pulsed voltage across the conductor allowing a reduction in the safe hold-off spacing between the flux exclusion metal parts and the metal rods of the other turns. The magnetic core 307 is made up of three coils 307A, B and C formed by windings of 0.0005" thick tape 80–20% Ni—Fe alloy provided by Magnetics, Inc. of Butler, Pa. or National Arnold of Adelanto, Calif. The reader should note that nanocrystoline materials such as VITROPEAN™ available from VACUUM SCHITELZE GmbH, Germany and FINEMET™ from Hitachi Mekels, Japan could be used for inductors 54 and 64.

In prior art pulse power systems, oil leakage from electrical components has been a potential problem. In this preferred embodiment, oil insulated components are limited to the saturable inductors. Furthermore, the saturable inductor 64 as shown in FIG. 9B is housed in a pot type oil containing housing in which all seal connections are located above the oil level to substantially eliminate the possibility of oil leakage. For example, the lowest seal in inductor 64 is shown at 308 in FIG. 9B. Since the normal oil level is below the top lip of the housing 306, it is almost impossible for oil to leak outside the assembly as long as the housing is maintained in an upright condition.

Capacitors

Capacitor banks 42, 52, 62 and 82 (i.e., $C_0$, $C_1$, $C_{p-1}$ and $C_p$) as shown in FIG. 5 are all comprised of banks of off-the-shelf capacitors connected in parallel. Capacitors 42 and 52 are film type capacitors available from suppliers such as Vishay Roederstein with offices in Statesville, N.C. or Wima of Germany. Applicants preferred method of connecting the capacitors and inductors is to solder them to positive and negative terminals on special printed circuit board having heavy nickel coated copper leads in a manner similar to that described in U.S. Pat. No. 5,448,580. Capacitor bank 62 and 82 is typically composed of a parallel array of high voltage ceramic capacitors from vendors such as Murata or TDK, both of Japan. In a preferred embodiment for use on this KrF laser, capacitor bank 82 (i.e., $C_p$) comprised of a bank of thirty three 0.3 nF capacitors for a capacitance of 9.9 nF; $C_{p-1}$ is comprised of a bank of twenty four 0.40 nF capacitors for a total capacitance of 9.6 nF; $C_1$ is a 5.7 µF capacitor bank and $C_0$ is a 5.3 µF capacitor bank.

Pulse Transformer

Figure 10:
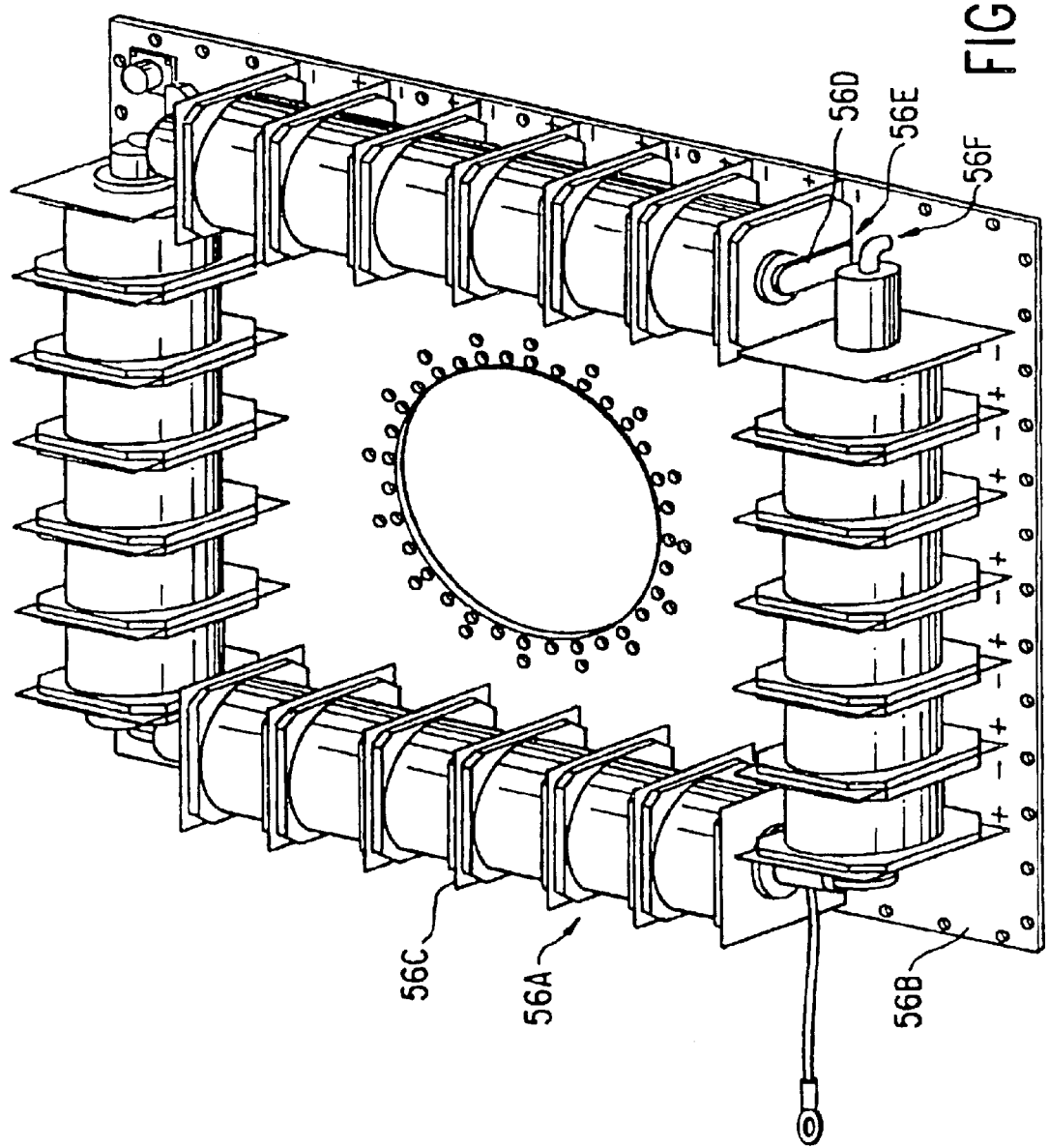
FIG. 10 shows a pulse transformer.
Figure 10A:
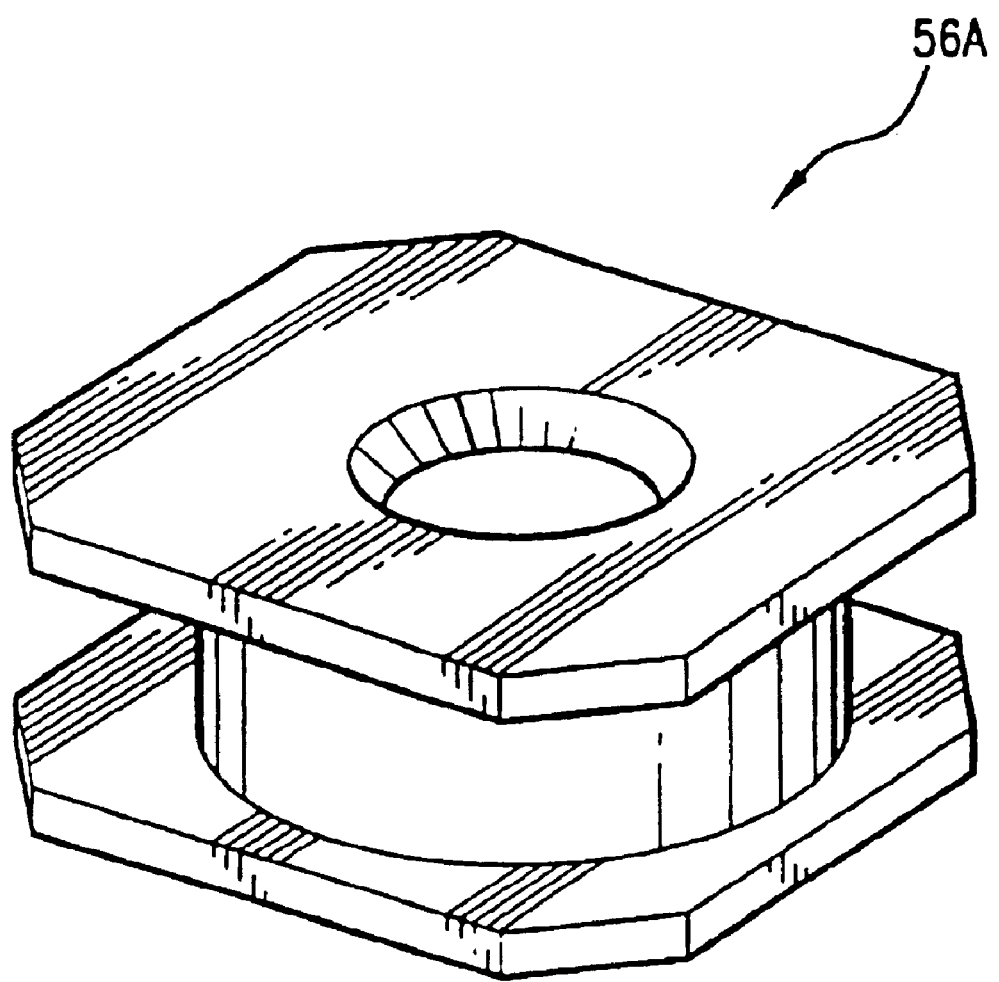
FIG. 10A shows a pulse transformer core.

Pulse transformer 56 is also similar to the pulse transformer described in U.S. Pat. Nos. 5,448,580 and 5,313,481; however, the pulse transformers of the present embodiment has only a single turn in the secondary winding and 24 induction units equivalent to 1/24 of a single primary turn for an equivalent step-up ratio of 1:24. A drawing of pulse transformer 56 is shown in FIG. 10. Each of the 24 induction units comprise an aluminum spool 56A having two flanges (each with a flat edge with threaded bolt holes) which are bolted to positive and negative terminals on printed circuit board 56B as shown along the bottom edge of FIG. 10. (The negative terminals are the high voltage terminals of the twenty four primary windings.) Insulators 56C separates the positive terminal of each spool from the negative terminal of the adjacent spool. Between the flanges of the spool is a hollow cylinder 1 1/16 inches long with a 0.875 OD with a wall thickness of about 1/32 inch. The spool is wrapped with one inch wide, 0.7 mil thick Metglas™ 2605 S3A and a 0.1 mil thick mylar film until the OD of the insulated Metglas™ wrapping is 2.24 inches. A prospective view of a single wrapped spool forming one primary winding is shown in FIG. 10A.

The secondary of the transformer is a single OD stainless steel rod mounted within a tight fitting insulating tube of PTFE (Teflon®). The winding is in four sections as shown in FIG. 10. The low voltage end of stainless steel secondary shown as 56D in FIG. 10 is tied to the primary HV lead on printed circuit board 56B at 56E, the high voltage terminal is shown at 56F. As a result, the transformer assumes an auto-transformer configuration and the step-up ratio becomes 1:25 instead of 1:24. Thus, an approximately −1400 volt pulse between the + and − terminals of the induction units will produce an approximately −35,000 volt pulse at terminal 56F on the secondary side. This single turn secondary winding design provides very low leakage inductance permitting extremely fast output rise time.

Details of Laser Chamber Electrical Components

The Cp capacitor 82 is comprised of a bank of thirty-three 0.3 nf capacitors mounted on top of the chamber pressure vessel. The electrodes are about 28 inches long which are separated by about 0.5 to 1.0 inch. The preferred gap separation is 16.5 mm for KrF. (The preferred separation for ArF is 13.5 mm.) Preferred electrodes are described below. In this embodiment, the top electrode is referred to as the cathode and the bottom electrode is connected to ground as indicated in FIG. 5 and is referred to as the anode.

Water Cooling of Components

To accommodate greater heat loads a water cooling presented here which is better able to support operation at this higher average power mode in addition to the normal forced air cooling provided by cooling fans inside the laser cabinet.

One disadvantage of water cooling has traditionally been the possibility of leaks near the electrical components or high voltage wiring. This specific embodiment substantially avoids that potential issue by utilizing a single solid piece of cooling tubing that is routed within a module to cool those components that normally dissipate the majority of the heat deposited in the module. Since no joints or connections exist inside the module enclosure and the cooling tubing is a continuous piece of solid metal (e.g. copper, stainless steel, etc.), the chances of a leak occurring within the module are greatly diminished. Module connections to the cooling water are therefore made outside the assembly sheet metal enclosure where the cooling tubing mates with a quick-disconnect type connector.

Detailed Commutator Description

Figure 11:
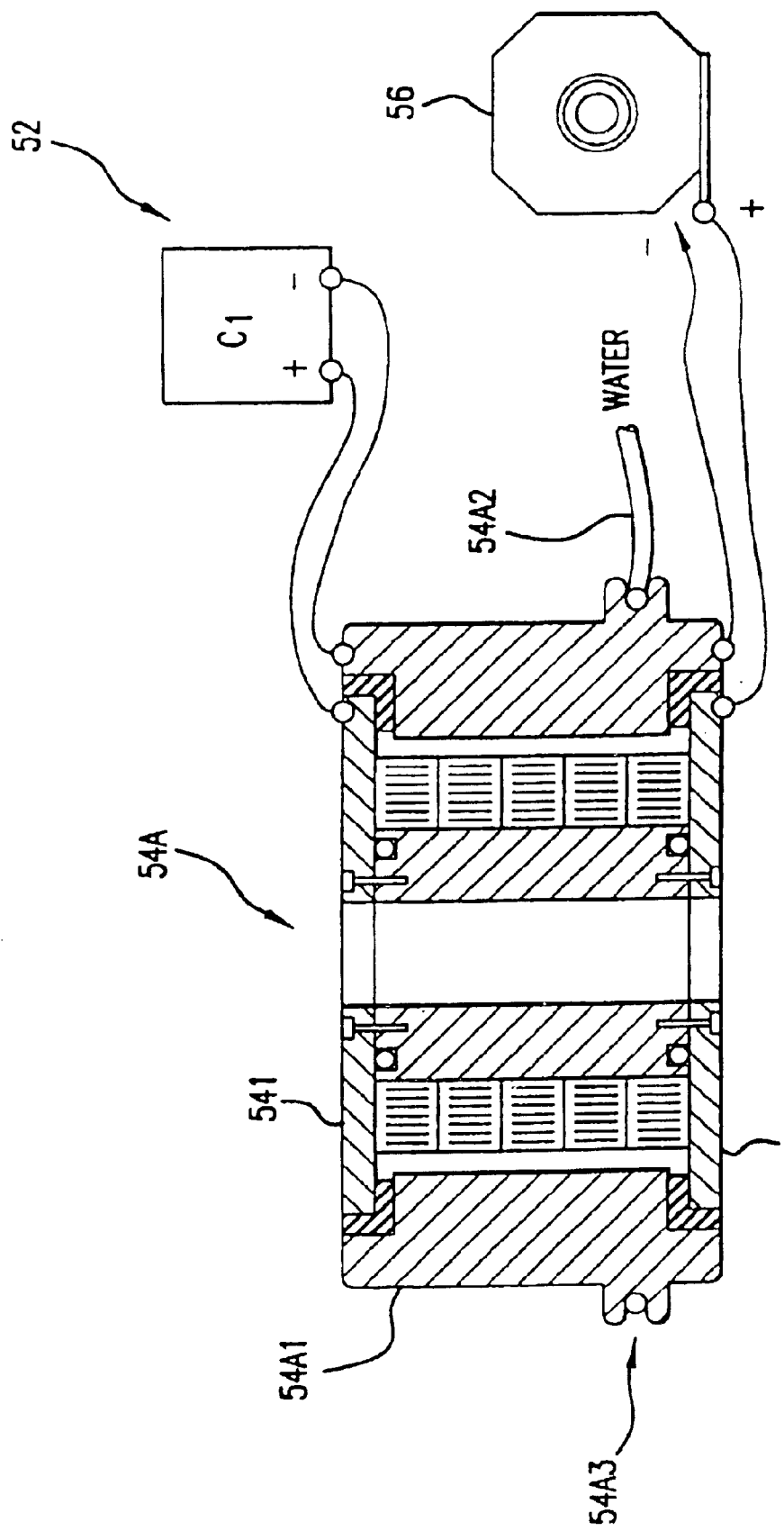
FIG. 11 shows a technique for cooling a first saturable inductor.

In the case of the commutator module a water cooled saturable inductor 54A is provided as shown in FIG. 11A which is similar to the inductor 54 shown in FIG. 8 except the fins of 54 are replaced with a water cooled jacket 54A1 as shown in FIG. 11A. The cooling line 54A2 is routed within the module to wrap around jacket 54A1 and through aluminum base plate where the IGBT switches and Series diodes are mounted. These three components make up the majority of the power dissipation within the module. Other items that also dissipate heat (snubber diodes and resistors, capacitors, etc.) are cooled by forced air provided by the two fans in the rear of the module.

Since the jacket 54A1 is held at ground potential, there are no voltage isolation issues in directly attaching the cooling tubing to the reactor housing. This is done by press-fitting the tubing into a dovetail groove cut in the outside of the housing as shown at 54A3 and using a thermally conductive compound to aid in making good thermal contact between the cooling tubing and the housing.

Cooling High Voltage Components

Although the IGBT switches "float" at high voltage, they are mounted on an aluminum base electrically isolated from the switches by a ¹/₁₆ inch thick alumina plate. The aluminum base plate which functions as a heat sink and operates at ground potential and is much easier to cool since high voltage isolation is not required in the cooling circuit. A drawing of a water cooled aluminum base plate is shown in FIG. 7A. In this case, the cooling tubing is pressed into a groove in an aluminum base on which the IGBT's are mounted. As with the inductor 54a, thermally conductive compound is used to improve the overall joint between the tubing and the base plate.

The series diodes also "float" at high potential during normal operation. In this case, the diode housing typically used in the design provides no high voltage isolation. To provide this necessary insulation, the diode "hockey puck" package is clamped within a heat sink assembly which is then mounted on top of a ceramic base that is then mounted on top of the water-cooled aluminum base plate. The ceramic base is just thick enough to provide the necessary electrical isolation but not too thick to incur more than necessary thermal impedance. For this specific design, the ceramic is ¹/₁₆" thick alumina although other more exotic materials, such as beryllia, can also be used to further reduce the thermal impedance between the diode junction and the cooling water.

A second embodiment of a water cooled commutator utilizes as single cold plate assembly which is attached to the chassis baseplate for the IGBT's and the diodes. The cold plate may be fabricated by brazing single piece nickel tubing to two aluminum "top" and "bottom" plates. As described above, the IGBT's and diodes are designed to transfer their heat into the cold plate by use of the previously mentioned ceramic disks underneath the assembly. In a preferred embodiment of this invention, the cold plate cooling method is also used to cool the IGBT and the diodes in the resonant charger. Thermally conductive rods or a heat pipe can also be used to transfer heat from the outside housing to the chassis plate.

Detailed Compression Head Description

Figure 12:
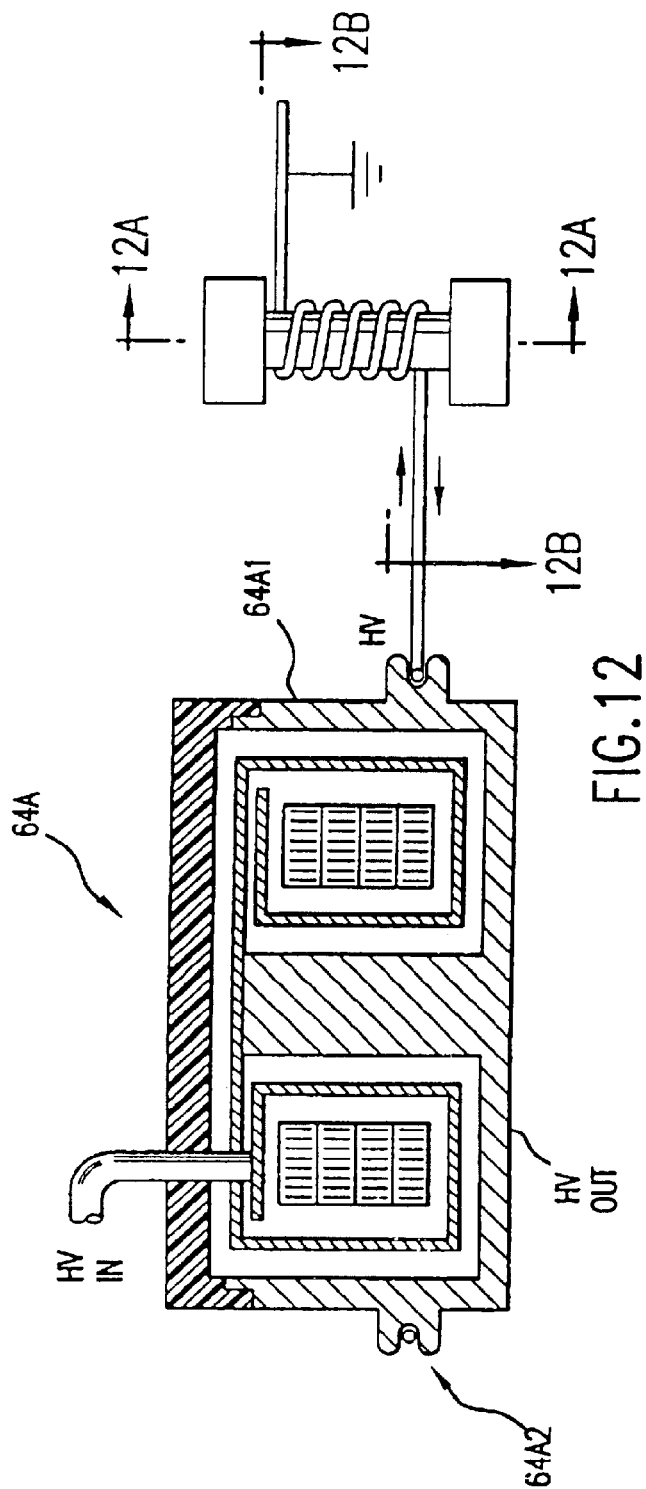
FIGS. 12, 12A and 12B show a technique for cooling a second saturable inductor.
Figure 12B:
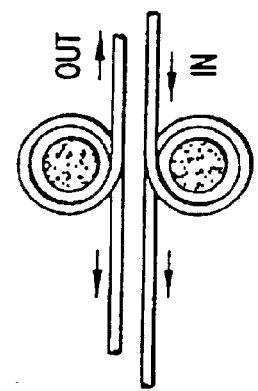
Figure 12A:
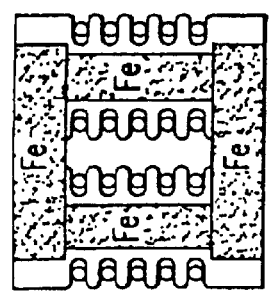

The water-cooled compression head is similar in the electrical design to a prior art air-cooled version (the same type ceramic capacitors are used and similar material is used in the reactor designs). The primary differences in this case are that the module must run at higher rep-rates and therefore, higher average power. In the case of the compression head module, the majority of the heat is dissipated within the modified saturable inductor 64A. Cooling the subassembly is not a simple matter since the entire housing operates with short pulses of very high voltages. The solution to this issue as shown in FIGS. 12, 12A and 12B is to inductively isolate the housing from ground potential. This inductance is provided by wrapping the cooling tubing around two cylindrical forms that contain a ferrite magnetic core. Both the input and output cooling lines are coiled around cylindrical portions of a ferrite core formed of the two cylindrical portions and the two ferrite blocks as shown in FIGS. 12, 12A and 12B.

The ferrite pieces are made from CN-20 material manufactured by Ceramic Magnetics, Inc. of Fairfield, N.J. A single piece of copper tubing (0.187" diameter) is press fit and wound onto one winding form, around the housing 64A1 of inductor 64A and around the second winding form. Sufficient length is left at the ends to extend through fittings in the compression head sheet metal cover such that no cooling tubing joints exist within the chassis.

The inductor 64A comprises a dovetail groove as shown at 64A2 similar to that used in the water-cooled commutator first stage reactor housing. This housing is much the same as previous air-cooled versions with the exception of the dovetail groove. The copper cooling-water tubing is press fit into this groove in order to make a good thermal connection between the housing and the cooling-water tubing. Thermally conductive compound is also added to minimize the thermal impedance.

The electrical design of inductor 64A is changed slightly from that of 64 shown in FIGS. 9A and 9B. Inductor 64A provides only two loops (instead of five loops) around magnetic core 64A3 which is comprised of four coils of tape (instead of three).

As a result of this water-cooled tubing conductive path from the output potential to ground, the bias current circuit is now slightly different. As before, bias current is supplied by a dc-dc converter in the commutator through a cable into the compression head. The current passes through the "positive" bias inductor $L_{B2}$ and is connected to the Cp-1 voltage node. The current then splits with a portion returning to the commutator through the HV cable (passing through the transformer secondary to ground and back to the dc-dc converter). The other portion passes through the compression head reactor Lp-1 (to bias the magnetic switch) and then through the cooling-water tubing "negative" bias inductor $L_{B3}$ and back to ground and the dc-dc converter. By balancing the resistance in each leg, the designer is able to ensure that sufficient bias current is available for both the compression head reactor and the commutator transformer.

The "positive" bias inductor $L_{B2}$ is made very similarly to the "negative" bias inductor $L_{B3}$. In this case, the same ferrite bars and blocks are used as a magnetic core. However, two 0.125" thick plastic spacers are used to create an air gap in the magnetic circuit so that the cores do not saturate with the dc current. Instead of winding the inductor with cooling-water tubing, 18 AWG teflon wire is wound around the forms.

Quick Connections

In this preferred embodiment, three of the pulse power electrical modules utilize blind mate electrical connections so that all electrical connections to the portions of the laser system are made merely by sliding the module into its place in the laser cabinet. These are the AC distribution module, the power supply module and the resonant charger module. In each case a male or female plug on the module mates with the opposite sex plug mounted at the back of the cabinet. In each case two approximately 3-inch end tapered pins on the module guide the module into its precise position so that the electrical plugs properly mate. The blind mate connectors such as AMP Model No. 194242-1 are commercially available from AMP, Inc. with offices in Harrisburg, Pa. In this embodiment connectors are for 208 volt AC, 400 volt AC, 800 volt DC (power supply out and resonant charger in) and several signal voltages. These blind mate connections permit these modules to be removed for servicing and replacing in a few seconds or minutes. In this embodiment blind mate connections are not used for the commutator module since the output voltage of the module is in the range of 20,000 to 30,000 volts. Instead, a typical high voltage connector is used.

Feeds to Cathode

Technique for Increasing Inductance

As indicated in FIG. 5 and explained above, the peaking capacitor bank, $C_p$, 82 consists of a bank of 33 0.3 nF capacitors. These are connected on the bottom of the capacitors to ground (i.e., the chamber head) and at the top to a metal plate called the corona shield. The corona shield is in turn connected to the cathode with 15 metal rods which are called down-comers which pass through a single piece main insulator and are screwed into the top of cathode 514 as shown in FIG. 13A. The single piece insulator is as described in U.S. Pat. No. 6,208,674 incorporated herein by reference. In some cases increased inductance in the high voltage portion of the pulse power circuit is desirable. Such an increase can result in an increase in the laser pulse duration. Applicants have determined that a preferred method of producing this increased inductance is to provide short (for example, about 1¼ inch) standoff rods connecting each of the capacitors in the $C_p$ capacitor bank and the down-comer rods to the corona plate. This increases the length of the electrical path between $C_p$ and the cathode substantially increasing the inductance in this part of the circuit. The amount of increase in inductance can be tailored by choice of length of the stand-off rods.

Discharge Components

FIGS. 13 and 13A(1) show details of an improved discharge configuration utilized in preferred embodiments of the present invention. This configuration includes an electrode configuration that Applicants call a blade-dielectric electrode. In this design, the anode 540 comprises a blunt blade shaped electrode 542 with dielectric spacers 544 mounted on both sides of the anode as shown to improve the gas flow in the discharge region. The spacers are attached to anode support bar 546 with screws at each end of the spacers beyond the discharge region. The screws allow for thermal expansion slippage between the spacers and the bar. The anode is 26.4 inches long and 0.439 inches high. It is 0.284 inches wide at the bottom and 0.141 inches wide at the top. It is attached to flow shaping anode support bar 546 with screws through sockets that allow differential thermal expansion of the electrode from its center position. The anode is comprised of a copper based alloy preferably C36000, C95400, or C19400. Cathode 541 has a cross section shape as shown in FIG. 13A. A preferred cathode material is C36000. Additional details of this blade dielectric configuration are provided in U.S. patent application Ser. No. 09/768,753 incorporated herein by reference. The current return 548 in this configuration is comprised of a whale bone shaped part with 27 ribs equally spaced along the length of electrode 542, the cross section of which is shown in FIG. 13A (1). As described above, the current return is fabricated from sheet metal and the whale-bone ribs (each having cross-section dimensions of about 0.15 inch×0.09 inch) are twisted so that the long dimension of each rib is in the direction of current flow.

Figure 2:
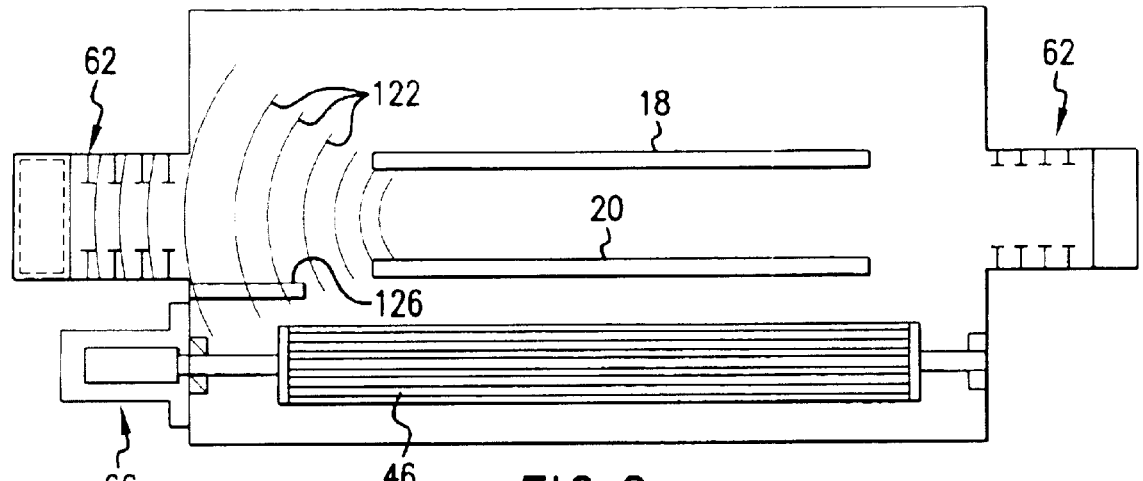
Figure 2A:
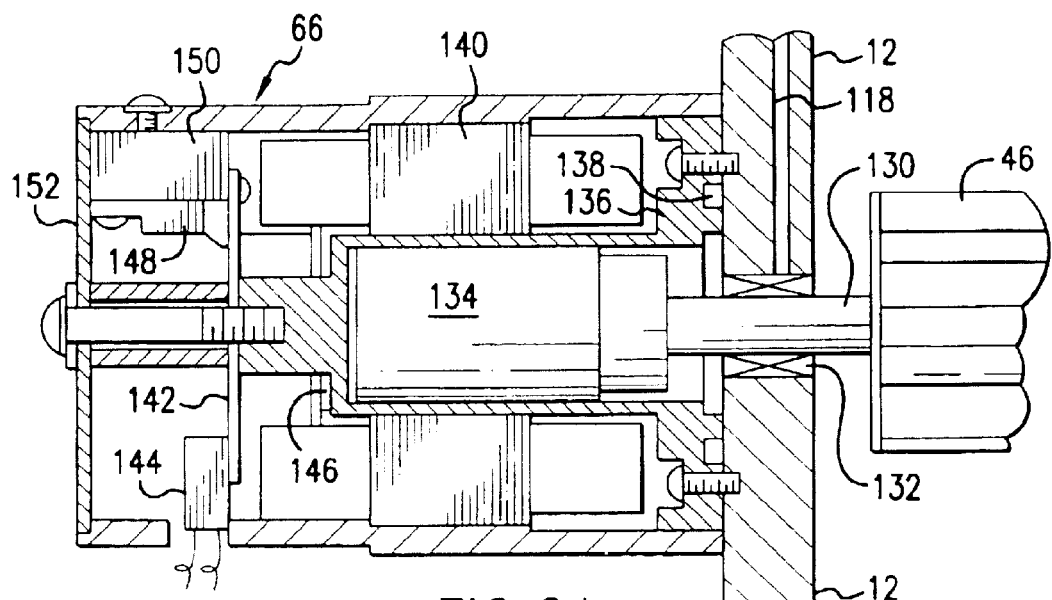

An alternative dielectric spacer design for the anode is shown in FIG. 13A2 to improve flow even more. In this case the spacers mate more perfectly with the flow shaping anode support bar to provide a better gas flow path. Applicants call this their "fast back" blade dielectric anode design.

ULTRA FAST WAVEMETER WITH FAST CONTROL ALGORITHM

Controlling Pulse Energy, Wavelength and Bandwidth

Prior art excimer lasers used for integrated circuit lithography are subject to tight specifications on laser beam parameters. This has typically required the measurement of pulse energy, bandwidth and center wavelength for every pulse and feedback control of pulse energy and bandwidth. In prior art devices the feedback control of pulse energy has been on a pulse-to-pulse basis, i.e., the pulse energy of each pulse is measured quickly enough so that the resulting data can be used in the control algorithm to control the energy of the immediately following pulse. For a 1,000 Hz system this means the measurement and the control for the next pulse must take less than $\frac{1}{1000}$ second. For a 4000 Hz system speeds need to be four times as fast. A technique for controlling center wavelength and measuring wavelength and bandwidth is described in U.S. Pat. No. 5,025,455 System, and Method of Regulating the Wavelength of a Light Beam and in U.S. Pat. No. 5,978,394, Wavelength and System for an Excimer Laser. These patents are incorporated herein by reference.

Wavelength and bandwidths have been measured on a pulse to pulse basis for every pulse, but typically the feedback control of wavelength has taken about 7 milli-seconds because prior art techniques for controlling center wavelength have taken several milli-seconds. Faster control is needed.

Preferred Embodiment for Fast Measurement and Control of Beam Parameters

A preferred embodiment of the present invention is an excimer laser system capable of operation in the range of 4,000 Hz to 6,000 Hz with very fast measurement of laser beam parameters and very fast control of pulse energy and center wavelength. The beam parameter measurement and control for this laser is described below.

The wavemeter used in the present embodiment is similar to the one described in U.S. Pat. No. 5,978,394 and some of the description below is extracted from that patent.

Measuring Beam Parameters

Figure 14:
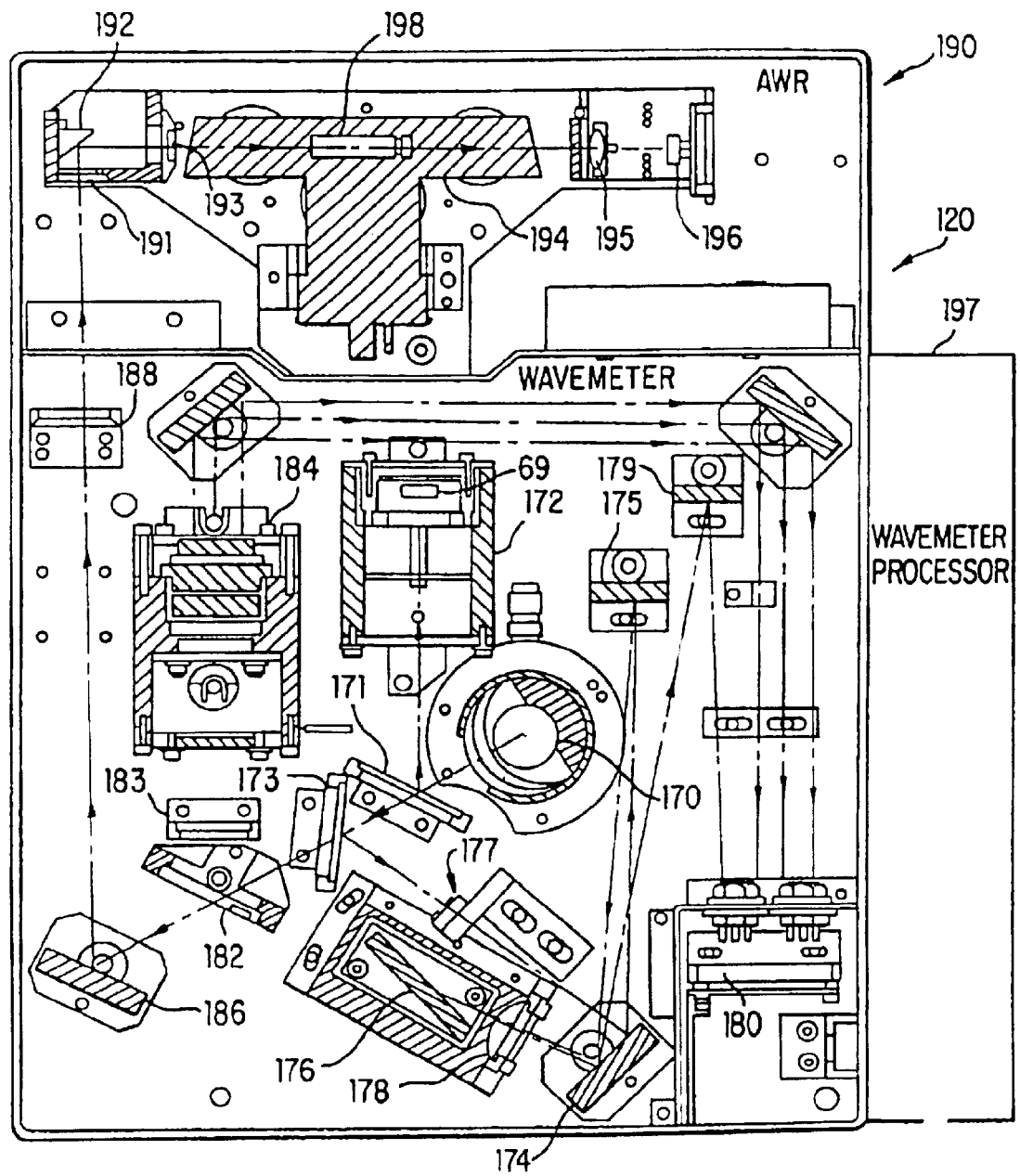
FIG. 14 shows the logout of a preferred embodiment.

FIG. 14 shows the layouts of a preferred wavemeter unit 120, an absolute wavelength reference calibration unit 190, and a wavemeter processor 197.

The optical equipment in these units measure pulse energy, wavelength and bandwidth. These measurements are used with feedback circuits to maintain pulse energy and wavelength within desired limits. The equipment calibrates itself by reference to an atomic reference source on the command from the laser system control processor.

As shown in FIG. 14, the laser output beam intersects partially reflecting mirror 170, which passes about 95.5% of the beam energy as output beam 33 and reflects about 4.5% for pulse energy, wavelength and bandwidth measurement.

Pulse Energy

About 4% of the reflected beam is reflected by mirror 171 to energy detector 172 which comprises a very fast photo diode 69 which is able to measure the energy of individual pulses occurring at the rate of 4,000 pulses per second. The pulse energy is about 7.5 mJ, and the output of detector 69 is fed to a computer controller which uses a special algorithm to adjust the laser charging voltage to precisely control the pulse energy of future pulses based on stored pulse energy data in order to limit the variation of the energy of individual pulses and the integrated energy of bursts of pulses.

Linear Photo Diode Array

Figure 14A:
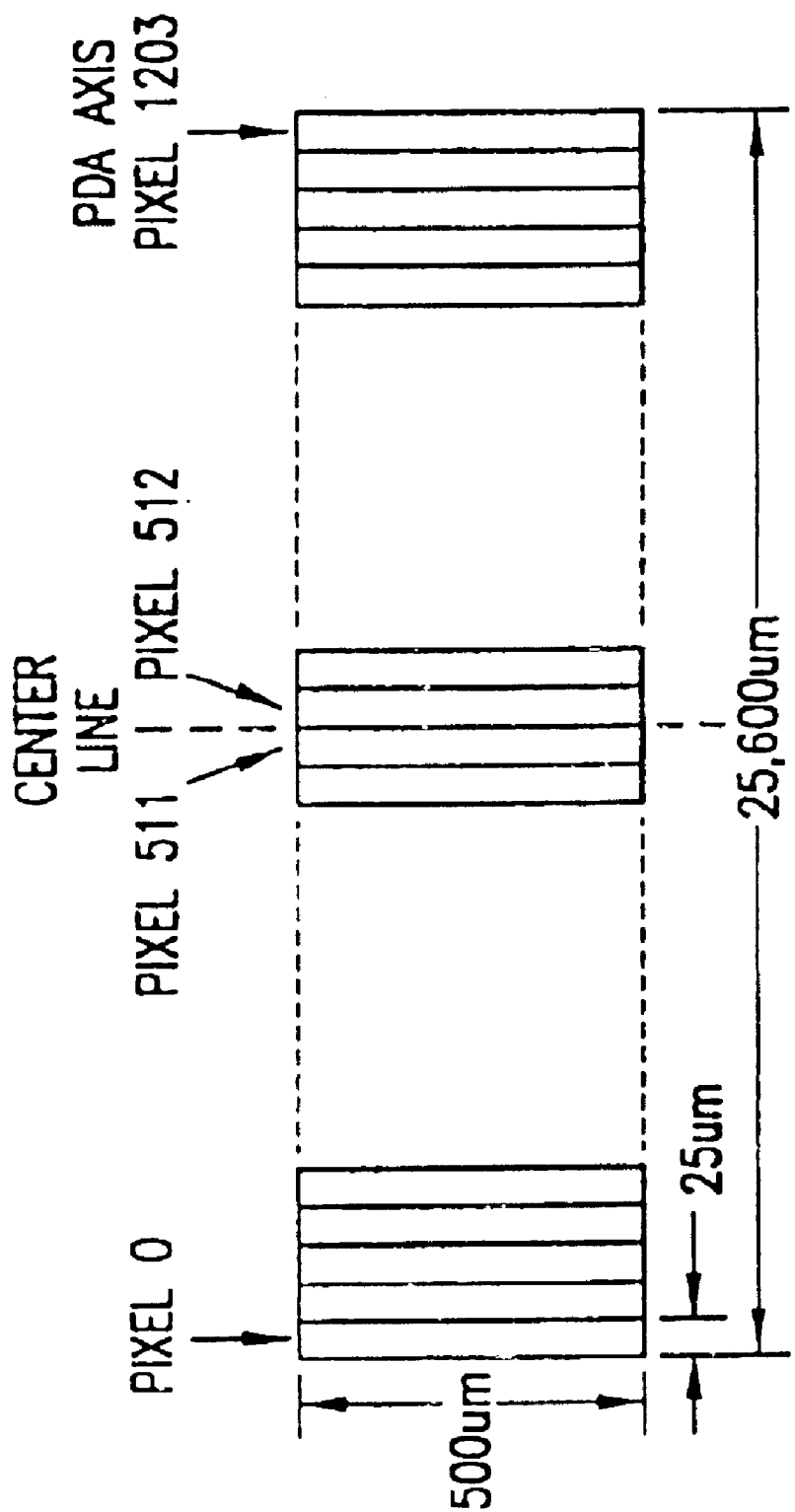
FIGS. 14A, 14B, 14C and 14D are charts and graphs explaining the calculation of wavelengths and bandwidths.

The photo sensitive surface of linear photo diode array 180 is depicted in detail in FIG. 14A. The array is an integrated circuit chip comprising 1024 separate photo diode integrated circuits and an associated sample and hold readout circuit. The photo diodes are on a 25 micrometer pitch for a total length of 25.6 mm (about one inch). Each photo diode is 500 micrometer long.

Photo diode arrays such as this are available from several sources. A preferred supplier is Hamamatsu. In our preferred embodiment, we use a Model S3903-1024Q which can be read at the rate of up to $4 \times 10^6$ pixels/sec on a FIFO basis in which complete 1024 pixel scans can be read at rates of 4,000 Hz or greater. The PDA is designed for $2 \times 10^6$ pixel/sec operation but Applicants have found that it can be over-clocked to run much faster, i.e., up to $4 \times 10^6$ pixel/sec. For pulse rates greater than 4,000 Hz, Applicants can use the same PDA but only a fraction (such as 60%) of the pixels are normally read on each scan.

Coarse Wavelength Measurement

Figure 14B:
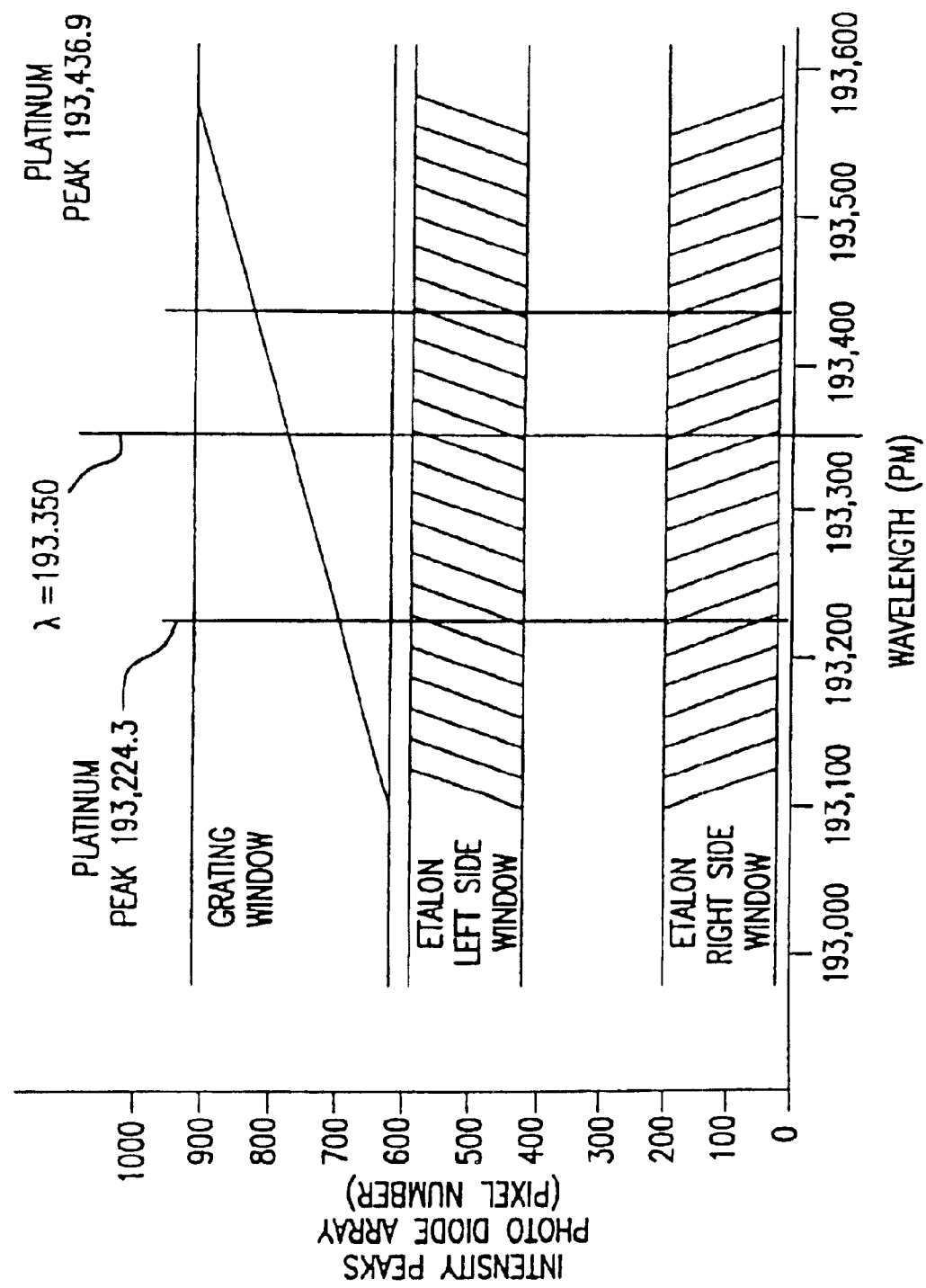

About 4% of the beam which passes through mirror 171 is reflected by mirror 173 through slit 177 to mirror 174, to mirror 175, back to mirror 174 and onto echelle grating 176. The beam is collimated by lens 178 having a focal length of 458.4 mm. Light reflected from grating 176 passes back through lens 178, is reflected again from mirrors 174, 175 and 174 again, and then is reflected from mirror 179 and focused onto the left side of 1024-pixel linear photo diode array 180 in the region of pixel 600 to pixel 950 as shown in the upper part of FIG. 14B (Pixels 0–599 are reserved for fine wavelength measurement and bandwidth.) The spatial position of the beam on the photo diode array is a coarse measure of the relative nominal wavelength of the output beam. For example, as shown in FIG. 14B, light in the wavelength range of about 193.350 pm would be focused on pixel 750 and its neighbors.

Calculation of Coarse Wavelength

Figure 14C:
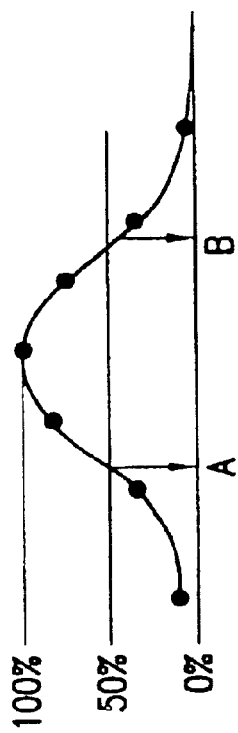

The coarse wavelength optics in wavemeter module 120 produces a rectangular image of about 0.25 mm×3 mm on the left side of photo diode array 180. The ten or eleven illuminated photo diodes will generate signals in proportion to the intensity of the illumination received (as indicated in FIG. 14C) and the signals are read and digitized by a processor in wavemeter controller 197. Using this information and an interpolation algorithm controller 197 calculates the center position of the image.

This position (measured in pixels) is converted into a coarse wavelength value using two calibration coefficients and assuming a linear relationship between position and wavelength. These calibration coefficients are determined by reference to an atomic wavelength reference source as described below. For example, the relationship between image position and wavelength might be the following algorithm:

$$\lambda = (2.3 \text{ pm/pixel})P + 191{,}625 \text{ pm}$$

where P=coarse image central positions.

Alternatively, additional precision could be added if desired by adding a second order term such as "+( ) $P^2$.

Fine Wavelength Measurement

About 95% of the beam which passes through mirror 173 as shown in FIG. 14 is reflected off mirror 182 through lens 183 onto a diffuser (preferably a diffraction diffuser as explained in a following section entitled "Improved Etalon") at the input to etalon assembly 184. The beam exiting etalon 184 is focused by a 458.4 mm focal length lens in the etalon assembly and produces interference fringes on the middle and right side of linear photo diode array 180 after being reflected off two mirrors as shown in FIG. 14.

The spectrometer must measure wavelength and bandwidth substantially in real time. Because the laser repetition rate may be 4,000 Hz to 6,000 Hz, it is necessary to use algorithms which are accurate but not computationally intensive in order to achieve the desired performance with economical and compact processing electronics. Calculational algorithm therefore preferably should use integer as opposed to floating point math, and mathematical operations should preferably be computation efficient (no use of square root, sine, log, etc.).

Figure 14D:
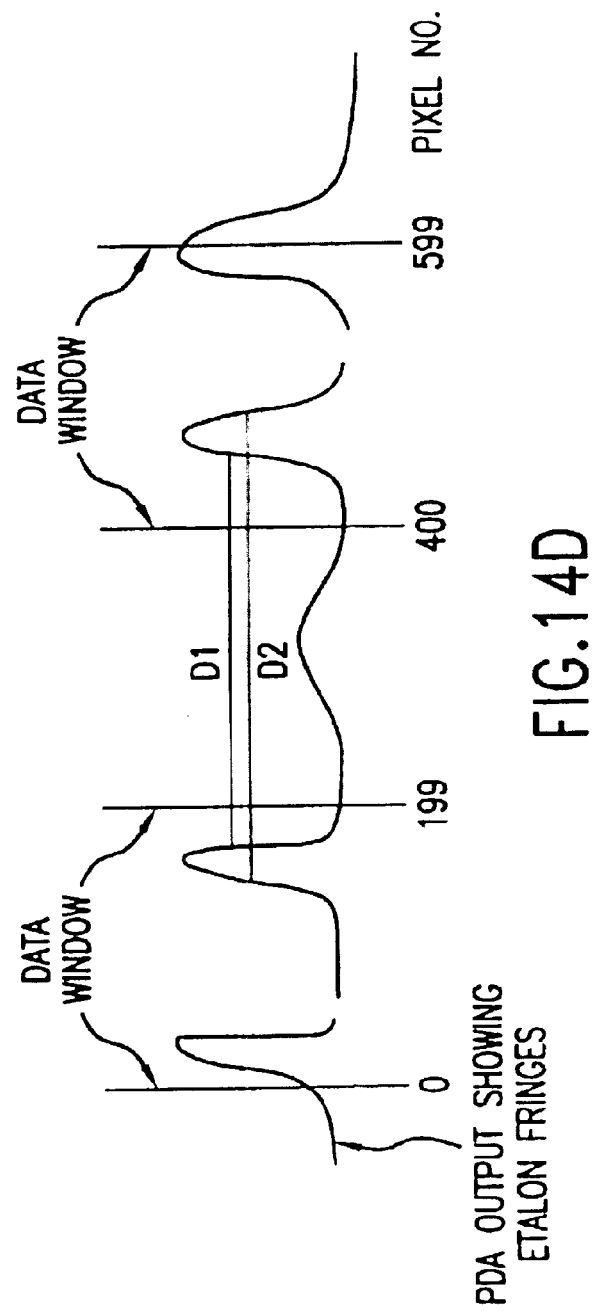

The specific details of a preferred algorithm used in this preferred embodiment will now be described. FIG. 14D is a curve with 5 peaks as shown which represents a typical etalon fringe signal as measured by linear photo diode array 180. The central peak is drawn lower in height than the others. As different wavelengths of light enter the etalon, the central peak will rise and fall, sometimes going to zero. This aspect renders the central peak unsuitable for the wavelength measurements. The other peaks will move toward or away from the central peak in response to changes in wavelength, so the position of these peaks can be used to determine the wavelength, while their width measures the bandwidth of the laser. Two regions, each labeled data window, are shown in FIG. 14D. The data windows are located so that the fringe nearest the central peak is normally used for the analysis. However, when the wavelength changes to move the fringe too close to the central peak (which will cause distortion and resulting errors), the first peak is outside the window, but the second closest peak will be inside the window, and the software causes the processor in control module 197 to use the second peak. Conversely, when the wavelength shifts to move the current peak outside the data window away from the central peak the software will jump to an inner fringe within the data window. The data windows are also depicted on FIG. 14B.

Figure 15:
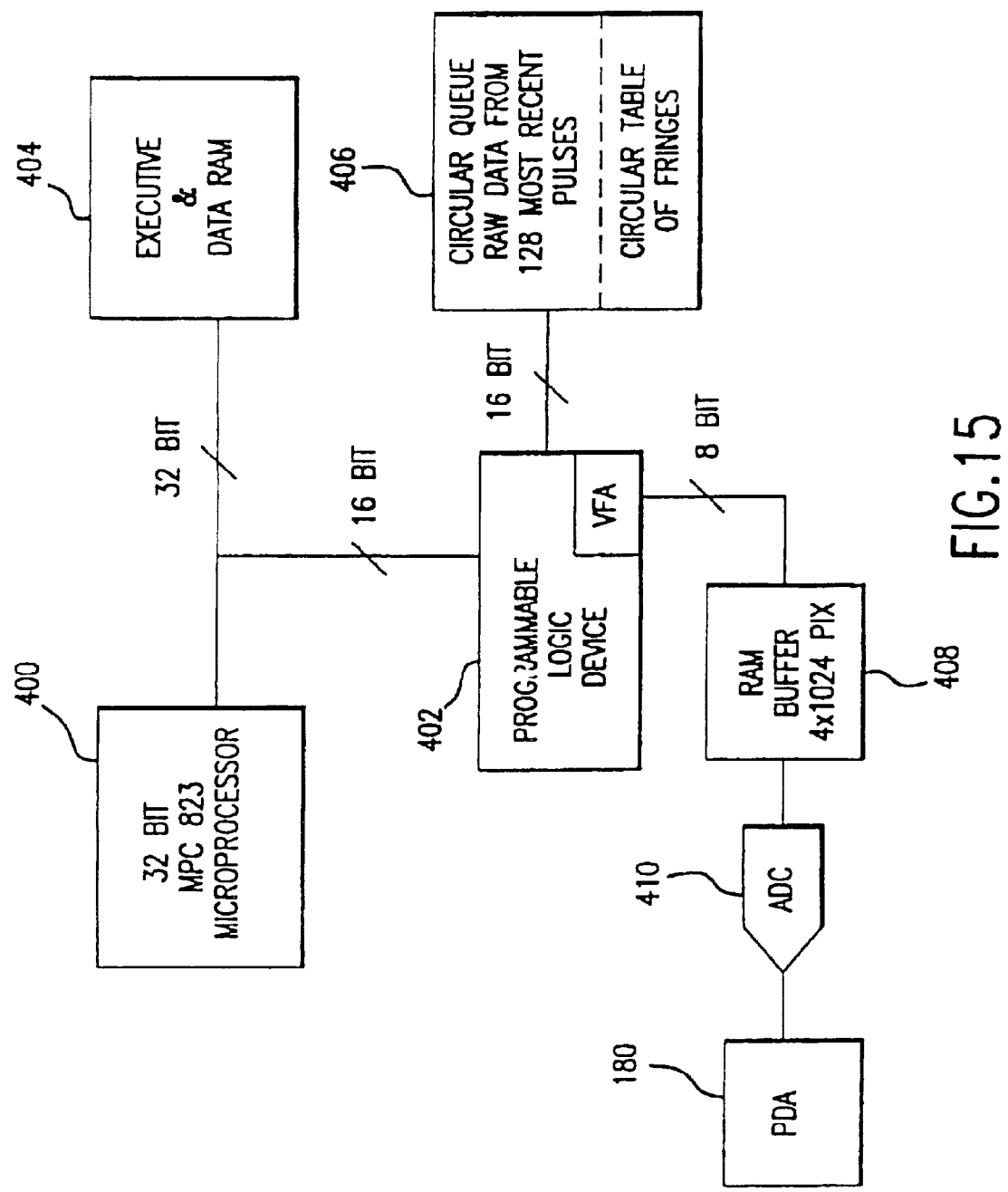
FIG. 15 is a block diagram showing components used for wavelength and bandwidth calculation.

For very fast computation of bandwidth for each pulse at repetition rates up to the range of 4,000 Hz to 6,000 Hz a preferred embodiment uses the hardware identified in FIG. 15. The hardware includes a microprocessor 400, Model MPC 823 supplied by Motorola with offices in Phoenix, Ariz.; a programmable logic device 402, Model EP 6016QC240 supplied by Altera with offices in San Jose, Calif.; an executive and data memory bank 404; a special very fast RAM 406 for temporary storage of photodiode array data in table form; a third 4×1024 pixel RAM memory bank 408 operating as a memory buffer; and an analog to digital converter 410.

As explained in U.S. Pat. No. 5,025,446 and U.S. Pat. No. 5,978,394, prior art devices were required to analyze a large mass of PDA data pixel intensity data representing interference fringes produced by etalon 184 an photodiode array 180 in order to determine center line wavelength and bandwidth. This was a relatively time consuming process even with a computer processor because about 400 pixel intensity values had to be analyzed to look for and describe the etalon fringes for each calculation of wavelength and bandwidth. A preferred embodiment of the present invention greatly speeds up this process by providing a for finding the important fringes which operates in parallel with the processor, microprocessor 400, calculating the wavelength information.

The basic technique is to use programmable logic device 402 to continuously produce a fringe data table from the PDA pixel data as the pixel data are produced. Logic device 402 also identifies which of the sets of fringe data represent fringe data of interest. Then when a calculation of center wavelength and bandwidth are needed, microprocessor merely picks up the data from the identified pixels of interest and calculates the needed values of center wavelength and bandwidth. This process reduces the calculation time for microprocessor by about a factor of about 10.

Specific stops in the process of calculating center wavelength and bandwidth are as follows:

1) With PDA 180 clocked to operate at 2.5 MHz, PDA 180 is directed by processor 400 to collect data at a from pixels 1 to 600 at a scan rate of 4,000 Hz and to read pixels 1 to 1028 at a rate of 100 Hz.
2) The analog pixel intensity data produced by PDA 180 is converted from analog intensity values into digital 8 bit values (0 to 255) by analog to digital converter 410 and the digital data are stored temporarily in RAM buffer 408 as 8 bit values representing intensity at each pixel of photodiode array 180.
3) Programmable logic device 402 analyzes the data passing out of RAM buffer 408 continuously on an almost real time basis looking for fringes, stores all the data in RAM memory 406, identifies all fringes for each pulse, produces a table of fringes for each pulse and stores the tables in RAM 406, and identifies for further analysis one best set of two fringes for each pulse. The technique used by logic device 402 is as follows:
   A) PLD 402 analyzes each pixel value coming through buffer 408 to determine if it exceeds an intensity threshold while keeping track of the minimum pixel intensity value. If the threshold is exceeded this is an indication that a fringe peak is coming. The PLD identifies the first pixel above threshold as the "rising edge" pixel number and saves the minimum pixel value of the pixels preceding the "rising edge" pixel. The intensity value of this pixel is identified as the "minimum" of the fringe.
   B) PLD 402 then monitors subsequent pixel intensity values to search for the peak of the fringe. It does this by keeping track of the highest intensity value until the intensity drops below the threshold intensity.
   C) When a pixel having a value below threshold is found, the PLD identifies it as the falling edge pixel number and saves the maximum value. The PLD than calculates the "width" of the fringe by subtracting the rising edge pixel number from the falling edge pixel number.
   D) The four values of rising edge pixel number, maximum fringe intensity, minimum fringe intensity and width of the fringe are stored in the circular table of fringes section of RAM memory bank 406. Data representing up to 15 fringes can be stored for each pulse although most pulses only produce 2 to 5 fringes in the two windows.
   E) PLD 402 also is programmed to identify with respect to each pulse the "best" two fringes for each pulse. It does this by identifying the last fringe completely within the 0 to 199 window and the first fringe completely within the 400 to 599 window.

The total time required after a pulse for (1) the collection of the pixel data, and (2) the formation of the circular table of fringes for the pulse is only about 200 micro seconds. The principal time saving advantages of this technique is that the search for fringes is occurring as the fringe data is being read out, digitized and stored. Once the two best fringes are identified for a particular pulse, microprocessor 400 secures the raw pixel data in the region of the two fringes from RAM memory bank 406 and calculates from that data the bandwidth and center wavelength. The calculation is as follows:

Typical shape of the etalon fringes are shown in FIG. 14D. Based on the prior work of PLD 402 the fringe having a maximum at about pixel 180 and the fringe having a maximum at about pixel 450 will be identified to microprocessor 400. The pixel data surrounding these two maxima are analyzed by microprocessor 400 to define the shape and location of the fringe. This is done as follows:

A) A half maximum value is determined by subtracting the fringe minimum from the fringe maximum dividing the difference by 2 and adding the result to the fringe minimum. For each rising edge and each falling edge of the two fringes the two pixels having values of closest above and closest below the half maximum value. Microprocessor then extrapolates between the two pixel values in each case to define the end points of D1 and D2 as shown in FIG. 18B with a precision of 1/32 pixel. From these values the inner diameter D1 and the outer diameter D2 of the circular fringe are determined.

Fine Wavelength Calculation

The fine wavelength calculation is made using the course wavelength measured value and the measured values of D1 and D2.

The basic equation for wavelength is:

$$\lambda = (2*n*d/m) \cos(R/f) \quad (1)$$

where $\lambda$ is the wavelength, in picometers, n is the internal index of refraction of the etalon, about 1.0003, d is the etalon spacing, about 1542 um for KrF lasers and about 934 μm for ArF lasers, controlled to +/−1 um, m is the order, the integral number of wavelengths at the fringe peak, about 12440, R is the fringe radius, 130 to 280 PDA pixels, a pixel being 25 microns, f is the focal distance from the lens to the PDA plane.

Expanding the cos term and discarding high order terms that are negligibly small yields:

$$\lambda = (2*n*d/m)\,[1-(\tfrac{1}{2})(R/f)^2] \quad (2)$$

Restating the equation in terms of diameter D=2*R yields:

$$\lambda = (2*n*d/m)\,[1-(\tfrac{1}{8})(D/f)^2] \quad (3)$$

The wavemeter's principal task is to calculate λ from D. This requires knowing f, n, d and m. Since n and d are both intrinsic to the etalon we combine them into a single calibration constant named ND. We consider f to be another calibration constant named FD with units of pixels to match the units of D for a pure ratio. The integer order m varies depending on the wavelength and which fringe pair we choose. m is determined using the coarse fringe wavelength, which is sufficiently accurate for the purpose.

A couple of nice things about these equations is that all the big numbers are positive values. The WCM's microcontroller is capable of calculating this while maintaining nearly 32 bits of precision. We refer to the bracketed terms as FRAC.

$$FRAC = [1-(\tfrac{1}{8})(D/FD)^2] \quad (4)$$

Internally FRAC is represented as an unsigned 32 bit value with its radix point to the left of the most significant bit. FRAC is always just slightly less than one, so we get maximal precision there. FRAC ranges from [1−120E-6] to [1−25E-6] for D range of {560~260} pixels.

When the ND calibration is entered, the wavemeter calculates an internal unsigned 64 bit value named 2ND=2*ND with internal wavelength units of femtometers (fm)=10^−15 meter=0.001 pm. Internally we represent the wavelength λ as FWL for the fine wavelength, also in fm units. Restating the equation in terms of these variables:

$$FWL = FRAC*2ND/m \quad (5)$$

The arithmetic handles the radix point shift in FRAC yielding FWL in fm. We solve for m by shuffling the equation and plugging in the known coarse wavelength named CWL, also in fm units:

$$m = \text{nearest integer}\,(FRAC*2ND/CWL) \quad (6)$$

Taking the nearest integer is equivalent to adding or subtracting FSRs in the old scheme until the nearest fine wavelength to the coarse wavelength was reached. Calculate wavelength by solving equation (4) then equation (6) then equation (5). We calculate WL separately for the inner and outer diameters. The average is the line center wavelength, the difference is the linewidth.

Bandwidth Calculation

The bandwidth of the laser is computed as $(\lambda_2-\lambda_1)/2$. A fixed correction factor is applied to account for the intrinsic width of the etalon peak adding to the true laser bandwidth. Mathematically, a deconvolution algorithm is the formalism for removing the etalon intrinsic width from the measured width, but this would be far too computation-intensive, so a fixed correction $\Delta\lambda\epsilon$ is subtracted, which provides sufficient accuracy. Therefore, the bandwidth is:

$$\Delta\lambda = \left(\frac{D_2 - D_1}{2}\right) - \Delta\lambda\epsilon$$

$\Delta\lambda\epsilon$ depends on both the etalon specifications and the true laser bandwidth. It typically lies in the range of 0.1–1 pm for the application described here.

Improved Etalon

This embodiment utilizes an improved etalon. Conventional etalon mounting schemes typically employ an elastomer to mount the optical elements to the surrounding structure, to constrain the position of the elements but minimize forces applied to the elements. A compound commonly used for this is room-temperature vulcanizing silicone (RTV). However, various organic vapors emitted from these elastomers can deposit onto the optical surfaces, degrading their performance. In order to prolong etalon performance lifetime, it is desirable to mount the etalon in a sealed enclosure that does not contain any elastomer compounds.

Figure 14E:
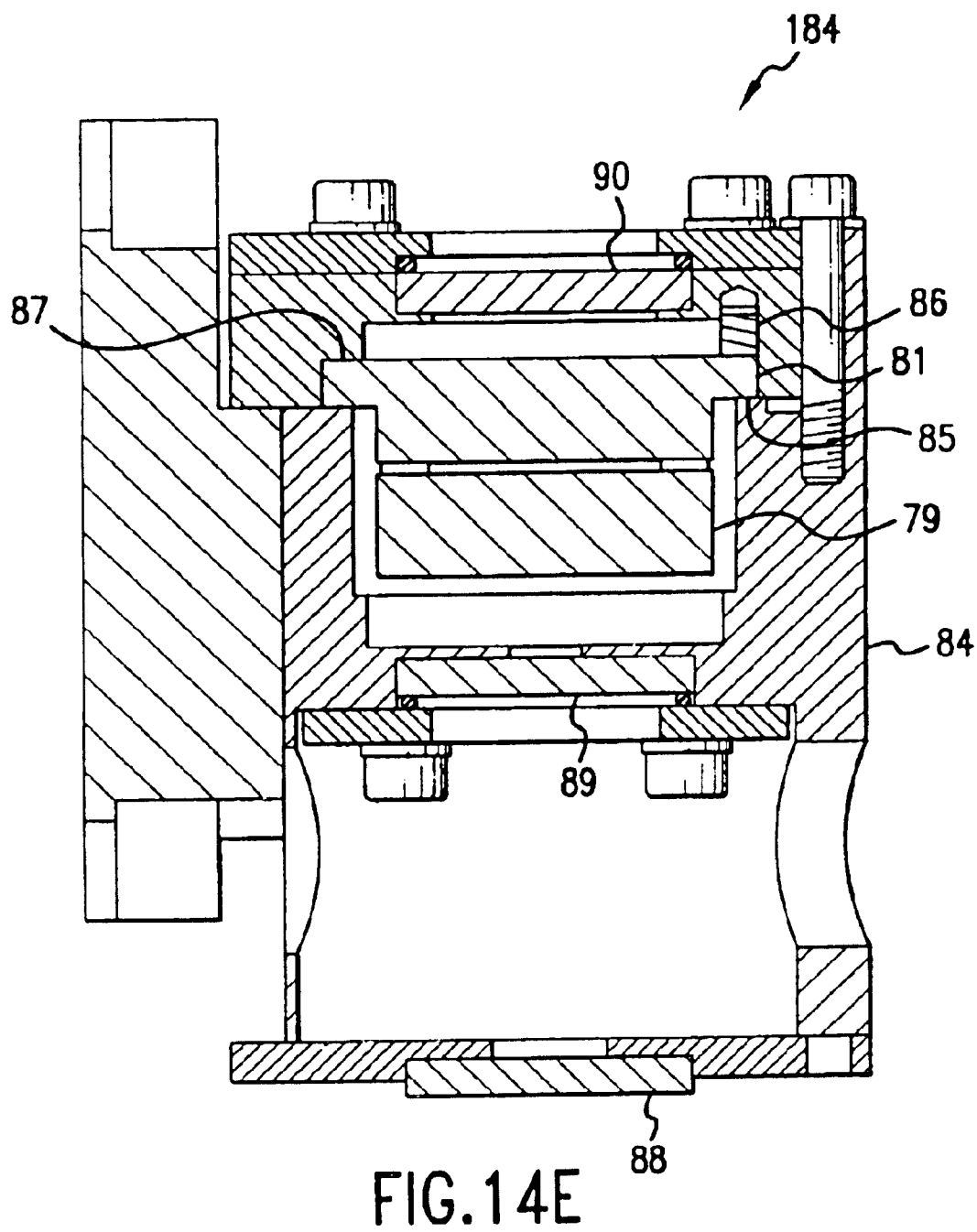
FIGS. 14E, 14F, 14G and 14H show view of an etalon used for wavelength and bandwidth monitoring.
Figure 14F:
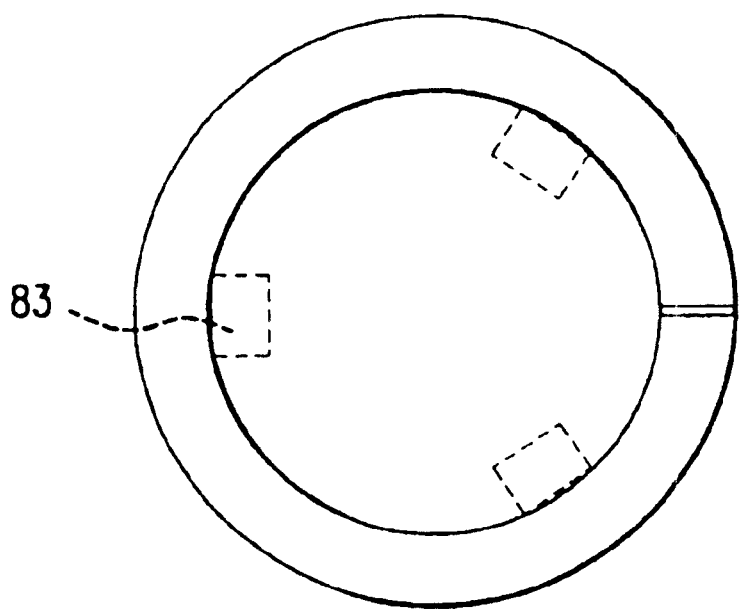
Figure 14G:
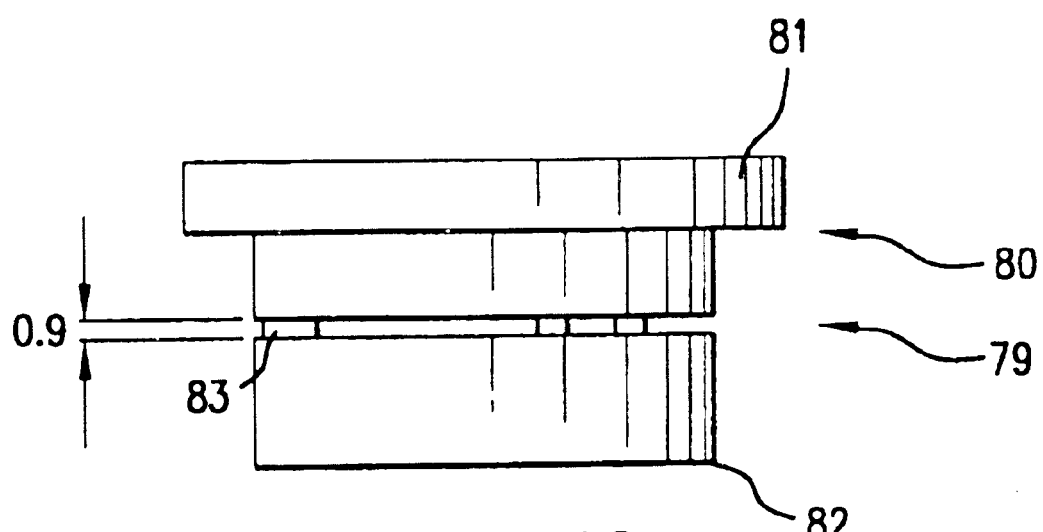

A preferred embodiment includes an improved etalon assembly shown at 184 in FIGS. 14 and 14E. The fused silica etalon 79 shown in FIG. 14G itself is comprised of a top plate 80 having a flange 81 and a lower plate 82, both plates being comprised of premium grade fused silica. The etalon is designed to produce fringes having free spectral range of 20.00 pm at 193.35 nm when surrounded by gas with an index of refraction of 1.0003 and a finesse equal to or greater than 25. Three fused silica spacers 83 with ultra low thermal expansion separate the plates and are 934 micrometer ±1 micrometer thick. These hold the etalon together by optical contact using a technique well known in the optics manufacturing art. The reflectance of the inside surfaces of the etalon are each about 88 percent and the outside surfaces are anti-reflection coated. The transmission of the etalon is about 50 percent.

The etalon 79 is held in place in aluminum housing 84 only by gravity and three low force springs 86 pressing the flange against three pads not shown but positioned on 120 degree centers under the bottom edge of flange 81 at the radial location indicated by leader 85. A clearance of only 0.004 inch along the top edge of flange 81 at 87 assures that the etalon will remain approximately in its proper position. This close tolerance fit also ensures that if any shock or impulse is transferred to the etalon system through the mounting, the relative velocities between the optical components and the housing contact points will be kept to a minimum. Other optical components of etalon assembly 184 include diffuser 88, window 89 and focusing lens 90 having a focal length of 458.4 mm.

The diffuser 88 may be a standard prior art diffuser commonly used up-stream of an etalon to produce a great variety of incident angles needed for the proper operation of the etalon. A problem with prior art diffusers is that about 90 percent of the light passing through the diffuser is not at a useful angle and consequently is not focused on the photo diode array. This wasted light, however, adds to the heating of the optical system and can contribute to degradation of optical surfaces.

In a much preferred embodiment, a diffractive lens array is used as the diffuser 88. With this type of diffuser, a pattern is produced in the diffractive lens array which scatters the light thoroughly but only within an angle of about 5 degrees.

The result is that about 90 percent of the light falling on the etalon is incident at useful angles and a much greater portion of the light incident on the etalon is ultimately detected by the photo diode array. The result is the light incident on the etalon can be greatly reduced which greatly increases optical component life. Applicants estimate that the incident light can be reduced to less than 5% or 10% of prior art values with equivalent light on the photo diode array.

Better Collimation With Diffractive Diffuser

Figure 14H:
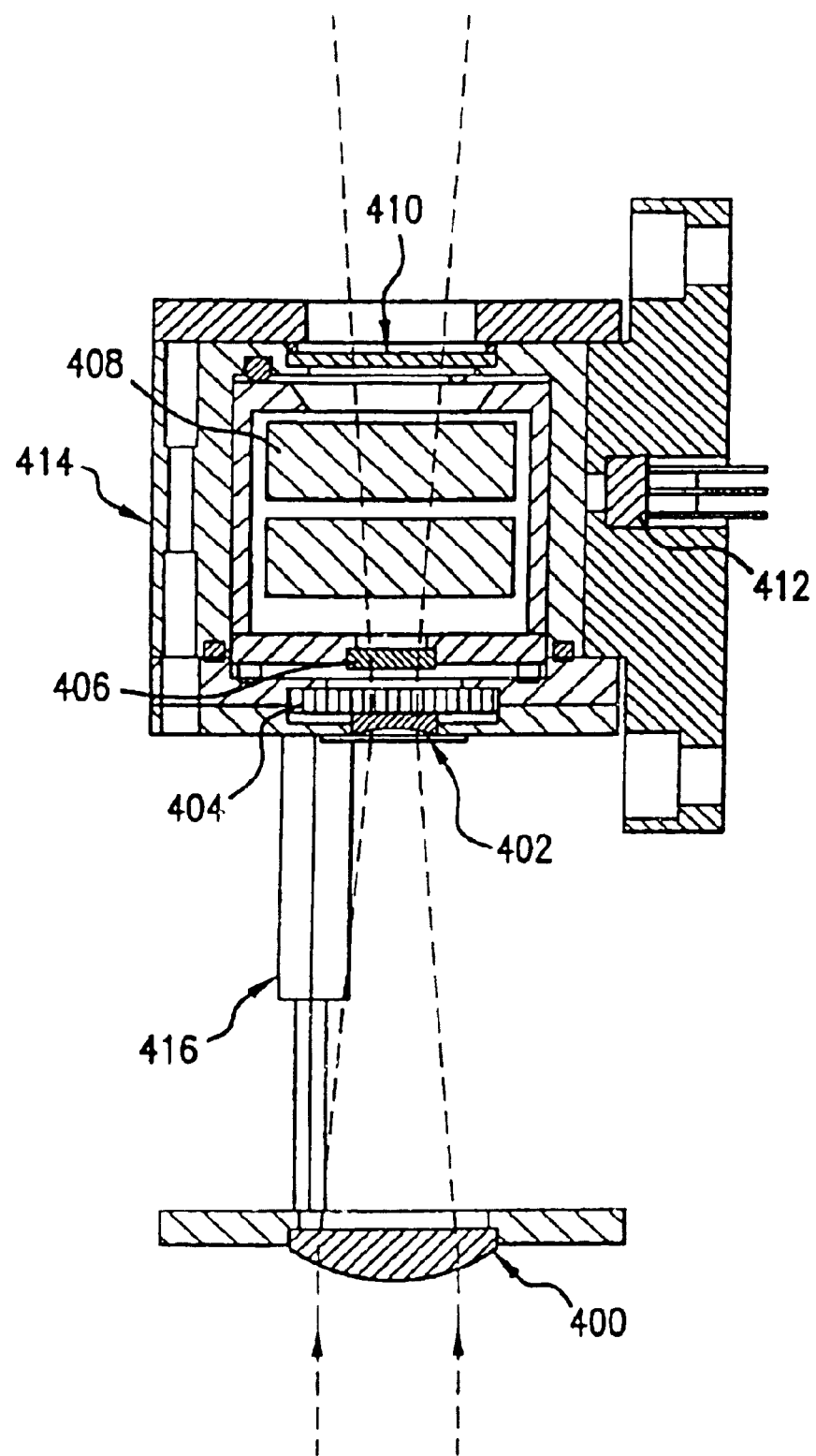

FIG. 14H shows features of a preferred embodiment providing even further reduction of light intensity passing through the etalon. This embodiment is similar to the embodiment discussed above. The sample beam from mirror 182 (approximately 15 mm×3 mm) passes upward through condensing lens 400 and is then re-collimated by lens 402. The beam now collimated and reduced in dimension to about 5 mm×1 mm passes through etalon housing window 404 and then passes through a diffractive diffusing element 406 which in this case (for an ArF laser) is a diffractive diffusing element provided by Mems Optical, Inc. with offices in Huntsville, Ala. The element is part number D023-193 which converts substantially all 193 nm light in any incoming collimated beam of any cross sectional configuration into a beam expanding in a first direction at 2° and in a second direction perpendicular to the first direction at 4°. Lens 410 then "focuses" the expanding beam onto a rectangular pattern covering photodiode array 180 shown in FIG. 14. The active area of the photo diode array is about 0.5 mm wide and 25.6 mm long and the spot pattern formed by lens 410 is about 15 mm×30 mm. Diffractive diffusing element thoroughly mixes the spacial components of the beam but maintains substantially all of the beam energy within the 2° and 4° limits so that the light passing through the etalon can be substantially reduced and efficiently utilized. The reader should recognize that further reductions in beam energy passing through the etalon could be realized by reducing the spot pattern in the short dimension of the photo diode array. However, further reductions to less than 15 mm will make optical alignment more difficult. Therefore, the designer should consider the spot pattern size to be a trade-off issue.

In another system designed for a KrF laser operating at about 248.327 nm a similar design is provided with adjustments for wavelength. In this embodiment lens 400 has a focal length of about 50 mm. (The lens is Melles Griot Corporation part number OILQP001.) Collimating lens 402 has a focal length of −20 mm (EVI Laser Corporation part number PLCC-10.0–10.3-UV). The diffractive diffusing element 406 is Mems Optical Corporation part number DO23–248. In this embodiment and in the ArF embodiment, the spacing between the two lenses can be properly positioned with spacer 416. Applicants estimate that the energy of the beam passing through the etalon with the laser operating at 2000 Hz is about 10 mw and is not sufficient to cause significant thermal problems in the etalon.

In other preferred embodiments, the beam could be allowed to come to a focus between lenses 400 and 402. Appropriate lenses would in this case be chosen using well known optical techniques.

Feedback Control of Pulse Energy and Wavelength

Based on the measurement of pulse energy of each pulse as described above, the pulse energy of subsequent pulses are controlled to maintain desired pulse energies and also desired total integrated dose of a specified number of pulses all as described in U.S. Pat. No. 6,005,879, Pulse Energy Control for Excimer Laser which is incorporated by reference herein.

Figure 16A:
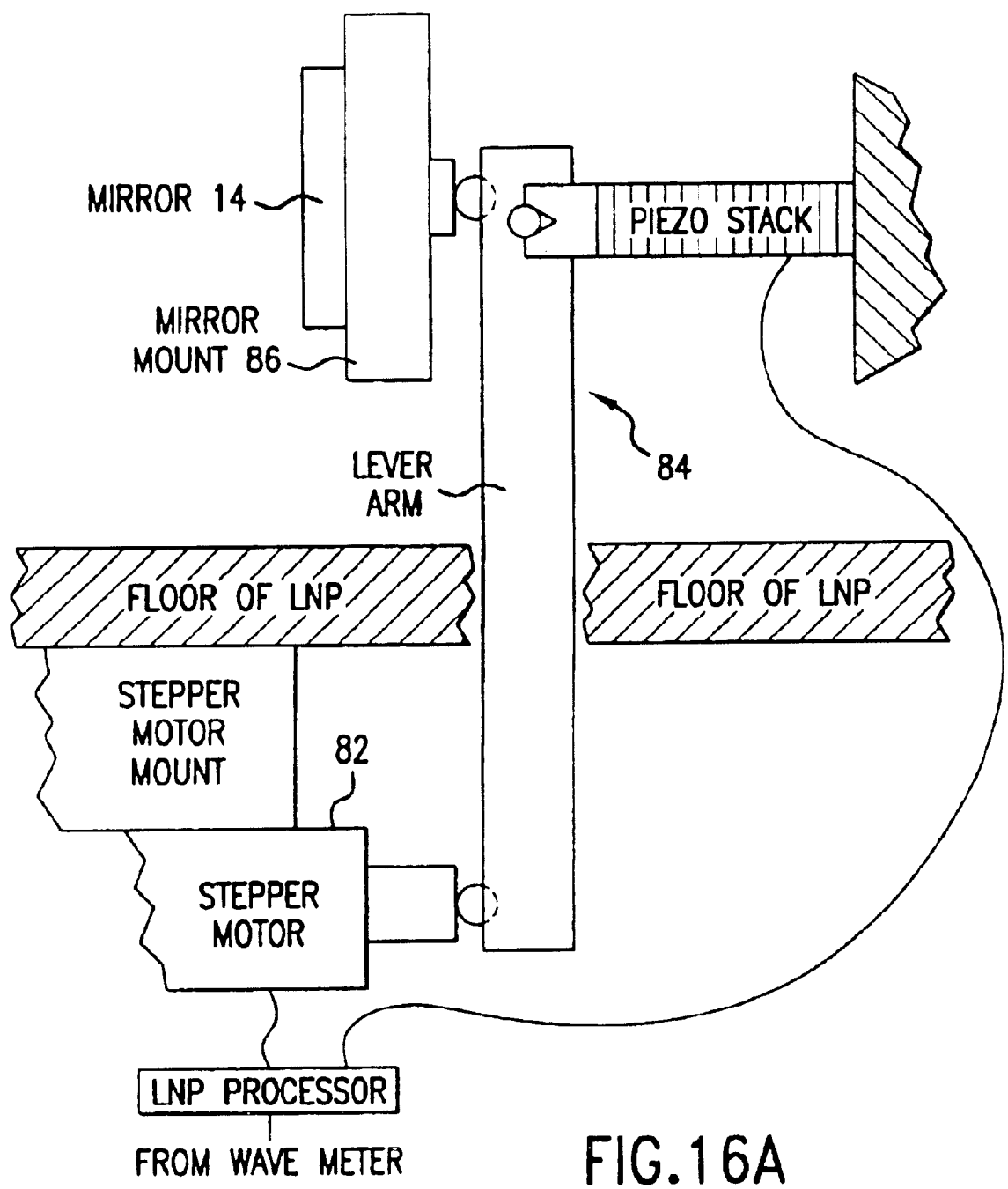

Wavelength of the laser may be controlled in a feedback arrangement using measured values of wavelengths and techniques known in the prior art such as those techniques described in U.S. Pat. No. 5,978,394, Wavelength System for an Excimer Laser also incorporated herein by reference. Applicants have recently developed techniques for wavelength tuning which utilize a piezoelectric driver to provide extremely fast movement of tuning mirror. Some of these techniques are described in U.S. patent application Ser. No. 608,543, Bandwidth Control Technique for a Laser, filed Jun. 30, 2000 which is incorporated herein by reference. FIGS. 16A and 16B are extracted from that application and show the principal elements of this technique. A piezoelectric stack is used for very fast mirror adjustment and larger slower adjustments are provided by a prior art stepper motor operating a lever arm. The piezoelectric stack adjusts the position of the fulcrum of the lever arm.

NEW LNP WITH COMBINATION PZT-STEPPER MOTOR DRIVEN TUNING MIRROR

Detail Design with Piezoelectric Drive

FIG. 16 is a block diagram showing features of the laser system which are important for controlling the wavelength and pulse energy of the output laser beam. Shown are a line narrowing module 15K which contains a three prism beam expander, a tuning mirror 14 and a grating. Wavemeter 104 monitors the output beam wavelength and provides a feedback signal to LNP processor 106 which controls the position of tuning mirror 14 by operation of a stepper motor and a PZT stack as described below. Operational wavelengths can be selected by laser controller 102. Pulse energy is also measured in wavemeter 104 which provides a signal used by controller 102 to control pulse energy in a feedback arrangement as described above. FIG. 16A is a block diagram showing PZT stack 80, stepper motor 82, mirror 14 and mirror mount 86.

Figure 1:
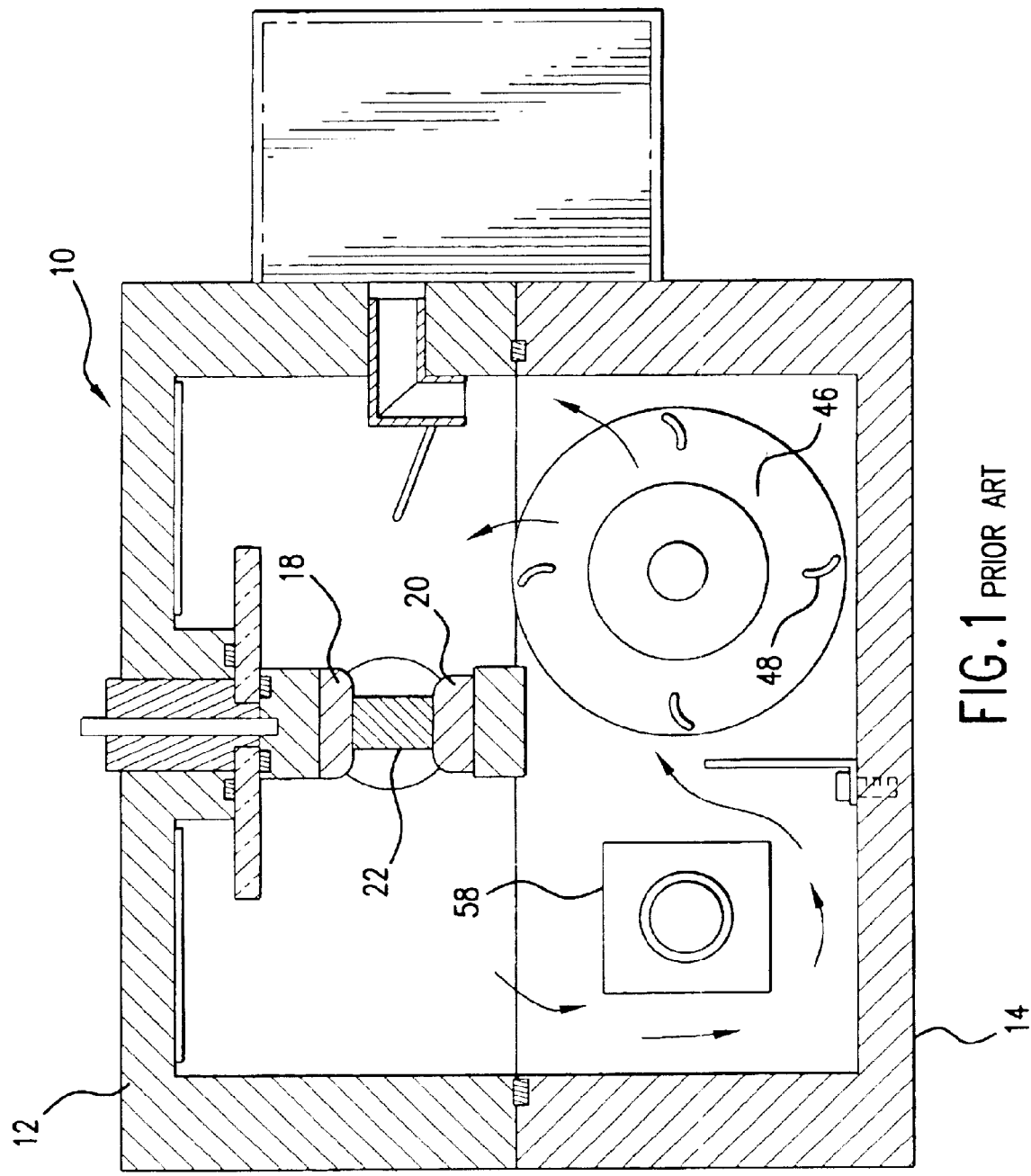
FIGS. 1, 2 and 2A show features of a prior art laser system.

FIG. 16B1 is a drawing showing detail features of a preferred embodiment of the present invention. Large changes in the position of mirror 14 are produced by stepper motor through a 26.5 to 1 lever arm 84. In this case a diamond pad 81 at the end of piezoelectric drive 80 is provided to contact spherical tooling ball at the fulcrum of lever arm 84. The contact between the top of lever arm 84 and mirror mount 86 is provided with a cylindrical dowel pin on the lever arm and four spherical ball bearings mounted (only two of which are shown) on the mirror mount as shown at 85. Piezoelectric drive 80 is mounted on the LNP frame with piezoelectric mount 80A and the stepper motor is mounted to the frame with stepper motor mount 82A. Mirror 14 is mounted in mirror mount 86 with a three point mount using three aluminum spheres, only one of which are shown in FIG. 16B1. Three springs 14A apply the compressive force to hold the mirror against the spheres.

FIG. 16B2 is a preferred embodiment slightly different from the one shown in FIG. 16B1. This embodiment includes a bellows 87 to isolate the piezoelectric drive from the environment inside the LNP. This isolation prevents UV damage to the piezoelectric element and avoid possible contamination caused by out-gassing from the piezoelectric materials. Also see FIG. 19D and the accompanying text below for an alternate LNP design providing greatly improved sealing of the LNP.

Single Prism Plate

Preferred embodiments of the present invention include a single prism plate on which the three beam expanding three prisms are located. Each of the three prisms are precisely located on plate 7 during fabrication by inserting the prism between three removable positioning pins inserted through precision drilled positioning holes from the bottom of the plate. Each prism is then glued (with 3M 2216 2-part epoxy) to the plate at three small (0.1 inch diameter) spots and after the glue hardens, the pins are removed. This technique assures precise location of the prisms relative to each other and simplifies LNP fabrication. During the glue step, each prism is held off the plate a distance of 0.004 inch using a one pound test fishing line shim so that the resulting glue spots produce three very short legs which are very slightly flexible and during use minimize stress on the prisms resulting from temperature changes. The position of the prism plate is manually adjustable for alignment in directions perpendicular to the laser beam direction through the chamber as shown at 7A in FIG. 16.

Test Results

Figure 16C:
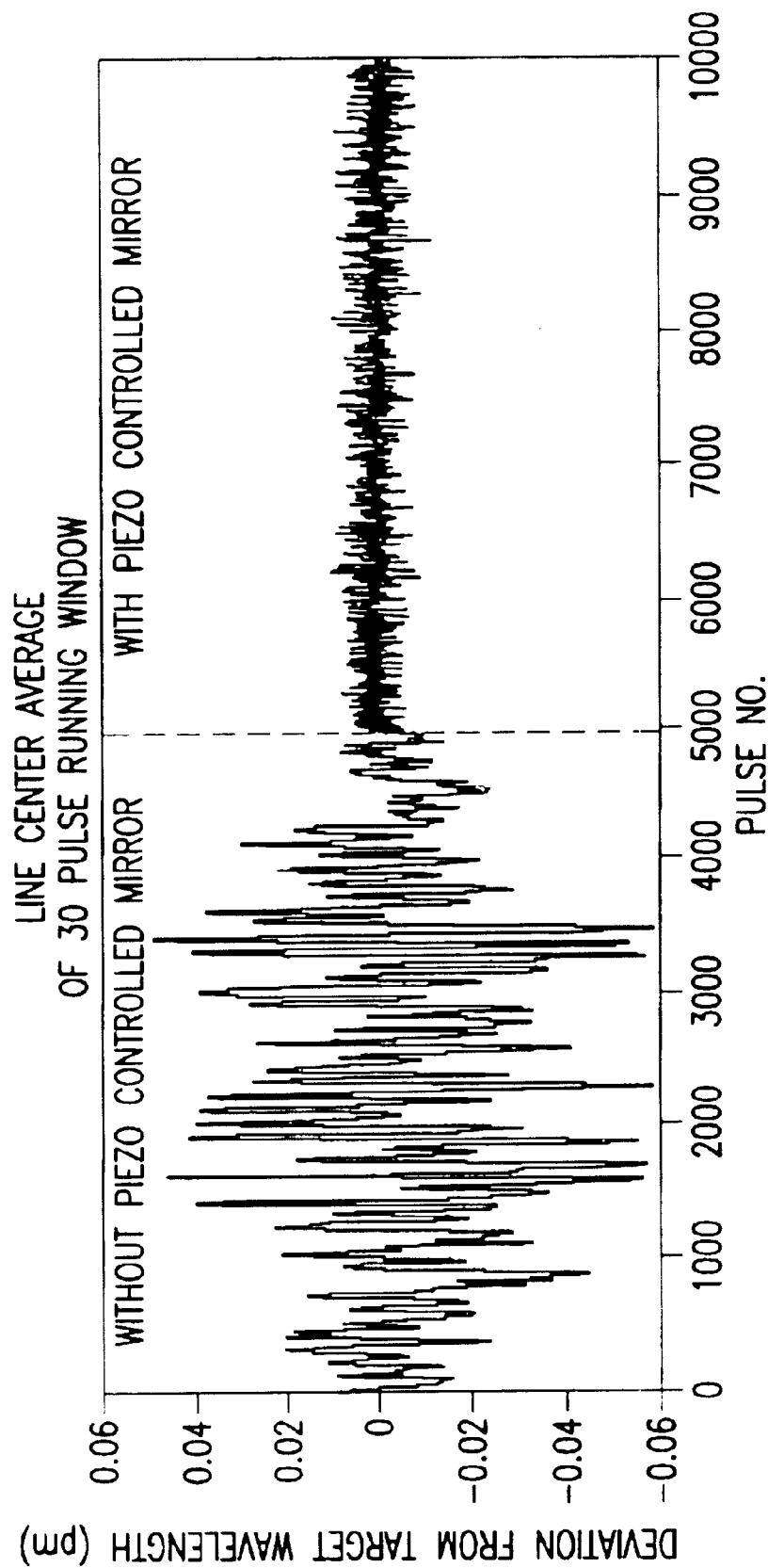
FIG. 16C shows the effect of piezoelectric control of the tuning mirror.

FIG. 16C shows actual test data from a laser fitted with the FIG. 16B2 embodiment. The graph is a plot of the deviation from target wavelength of the average of 30 pulse windows. The deviation is reduced from about 0.05 pm to about 0.005 pm.

This embodiment is a major speed up as compared to the stepper motor drive system described above but not quite fast enough for pulse-to-pulse adjustment. Earlier methods of mirror positioning required about 7 ms to move mirror 14, making pulse-to-pulse wavelength correction at 2000 Hz out of the question. In that earlier technique, a lever arm pivoted about a pivot axis to produce a 1 to 26.5 reduction in the mirror movement compared to the stepper position movement. The prior art stepper has a total travel of ½ inch (12.7 mm) and 6000 steps so that each step is a distance of about 2 microns. With the 1–26.5 reduction, one step moves the mirror about 75 nm which typically changes the wavelength of the laser wavelength about 0.1 pm. In the fast acting technique shown in FIG. 12A, a piezo stack 80 has been added at the pivot position of the lever arm. A preferred piezo stack is Model P-840.10 supplied by Physik Instrumente GmbH with offices in Waldbronn, Germany. This stack will produce linear adjustment of about 3.0 microns with a drive voltage change of 20 volts. This range is equivalent to about ±20 steps of the stepper motor.

Figure 16D:
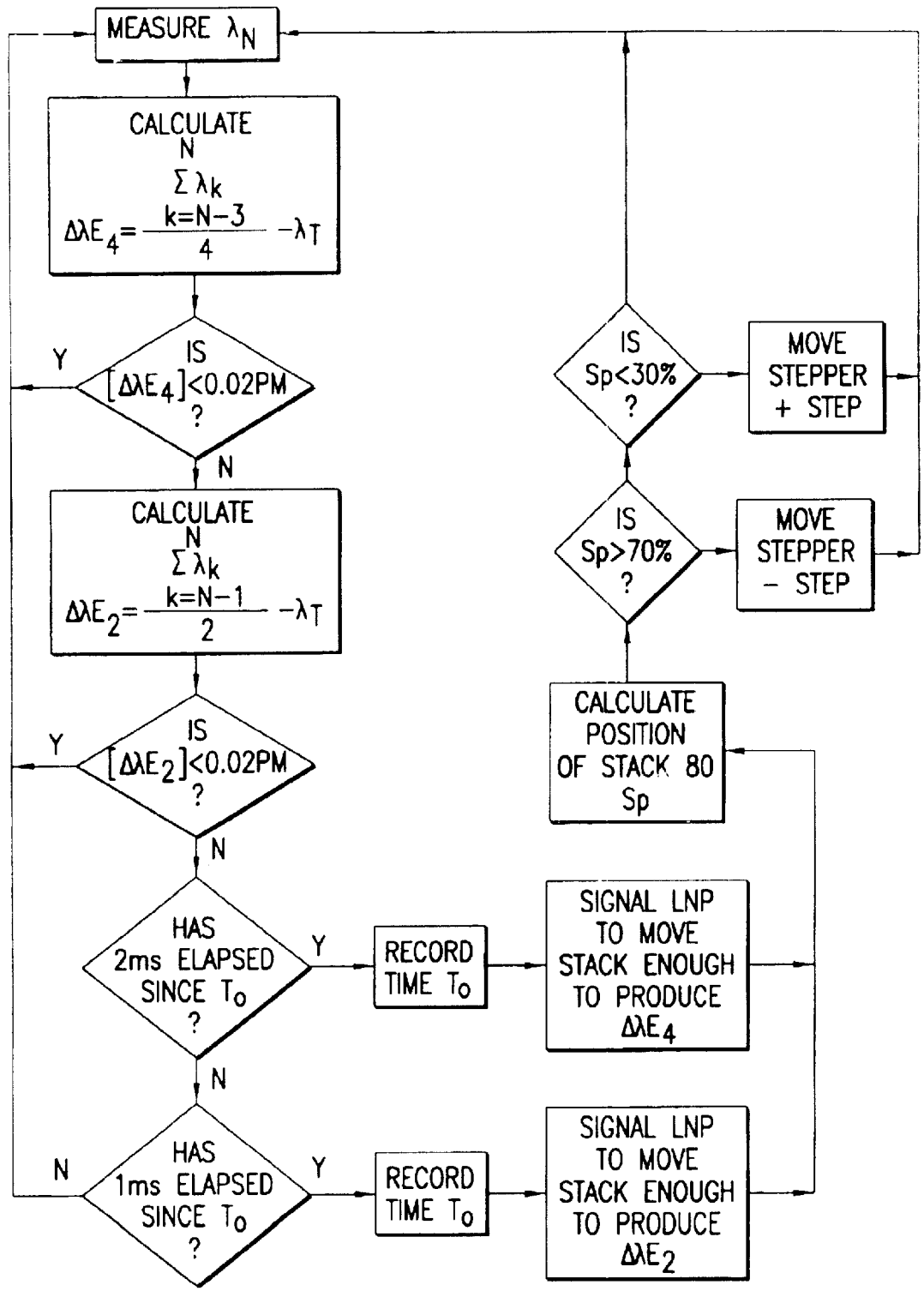
FIGS. 16D and 16E are diagrams showing wavelength control algorithms.

The stack responds to a control signal within less than 1 microsecond and the system can easily respond to updated signals at a frequency of 4000 Hz. In a preferred embodiment the control for each pulse at 4000 Hz pulse rate is based not on the previous pulse but the pulse prior to the previous pulse to allow plenty of time for the wavelength calculation. However, this embodiment provides a factor of 7 improvement over the prior art design with a 7 millisecond latency. Therefore, much faster feedback control can be provided. One preferred feedback control algorithm is described in FIG. 16D. In this algorithm the wavelength is measured for each pulse and an average wavelength for the last four and last two pulses is calculated. If either of the averages deviate from the target wavelength by less than 0.02 pm, no adjustment is made. If both deviate more than 0.02 pm from the target, an adjustment is made to the mirror assembly by piezoelectric stack 80 to provide a wavelength correction. Which of the two averages is used is determined by how much time had elapsed since the last adjustment. The piezoelectric stack is maintained within its control range by stepping the stepper motor as the stack approaches 30 and 70 percent of its range (or to provide more available range, 45 and 55 percent could be used instead of the 30 and 70 percent range values). Since the stepper motor requires about 7 ms to complete a step, the algorithm may make several piezo adjustments during a stepper motor step.

Pretuning and Active Tuning

The embodiments described above can be used for purposes other than chirp corrections. In some cases the operator of a integrated circuit lithography machine may desire to change wavelength on a predetermined basis. In other words the target wavelength $\lambda_T$ may not be a fixed wavelength but could be changed as often as desired either following a predetermined pattern or as the result of a continuously or periodically updating learning algorithm using early historical wavelength data or other parameters.

Adaptive Feedforward

Preferred embodiments of the present invention includes feedforward algorithms. These algorithms can be coded by the laser operator based on known burst operation patterns. Alternatively, this algorithm can be adaptive so that the laser control detects burst patterns such as those shown in the above charts and then revises the control parameters to provide adjustment of mirror 14 in anticipation of wavelength shifts in order to prevent or minimize the shifts. The adaptive feedforward technique involves building a model of the chirp at a given rep rate in software, from data from one or more previous bursts and using the PZT stack to invert the effect of the chirp.

To properly design the chirp inversion, two pieces of information are needed: (1) the pulse response of the PZT stack, and (2) the shape of the chirp. For each repetition rate, deconvolution of the chirp waveform by the pulse response of the PZT stack will yield a sequence of pulses, which, when applied to the PZT stack (with appropriate sign), will cancel the chirp. This computation can be done off line through a survey of behavior at a set of repetition rates. The data sequences could be saved to tables indexed by pulse number and repetition rate. This table could be referred to during operation to pick the appropriate waveform data to be used in adaptive feedforward inversion. It is also possible, and in fact may be preferable, to obtain the chirp shape model in almost real-time using a few bursts of data at the start of operation each time the repetition rate is changed. The chirp shape model, and possibly the PZT pulse response model as well, could then be updated (e.g. adapted) every N-bursts based on accumulated measured error between model and data. A preferred algorithm is described in FIG. 16E.

Figure 16E:
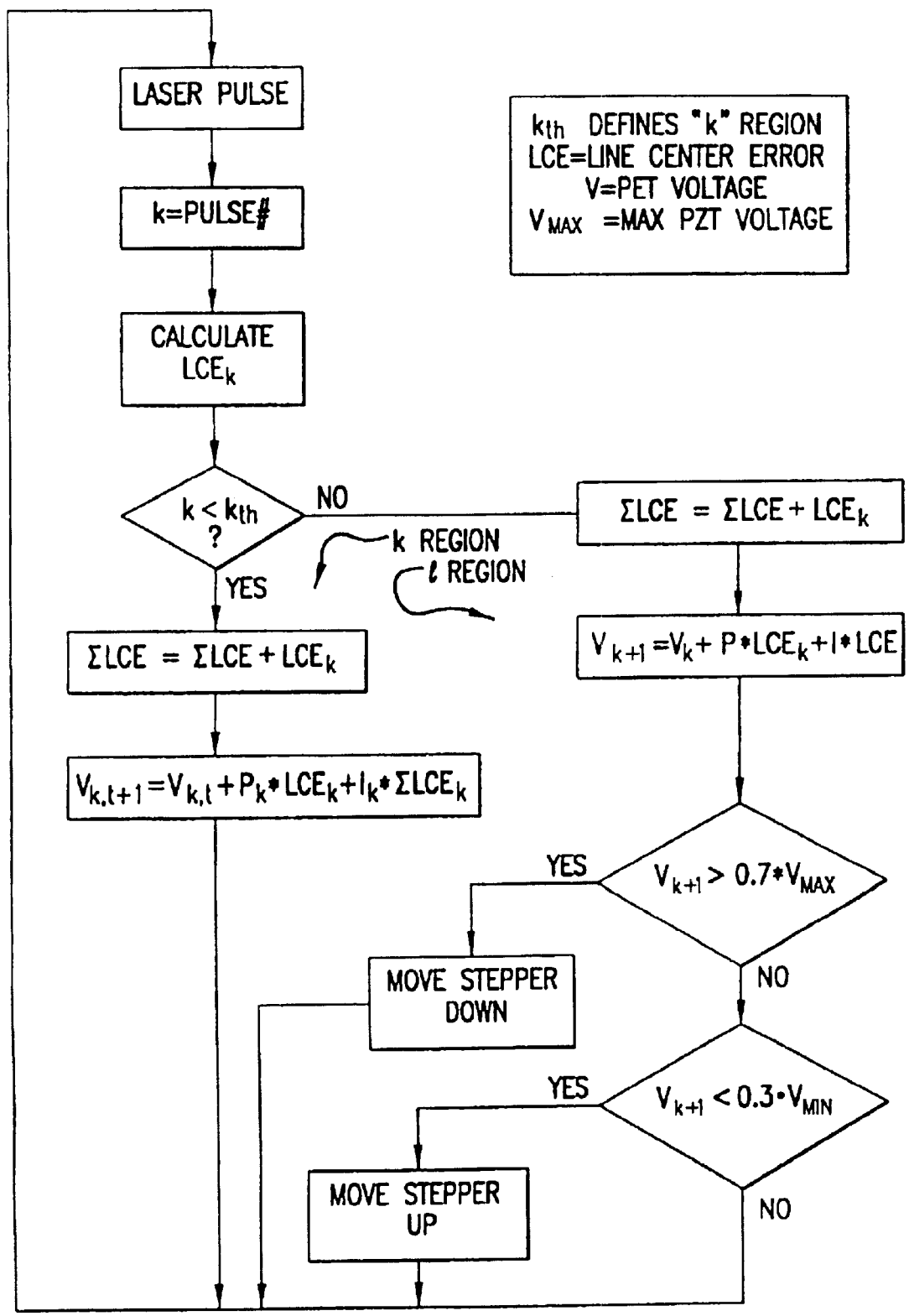

The chirp at the beginning of bursts of pulses can be controlled using the algorithm described in FIG. 16E. The letter k refers to the pulse number in a burst. The burst is separated into two regions, a k region and an l region. The k region is for pulse numbers less than $k_{th}$ (defining a time period long enough to encompass the chirp). Separate proportional constant $P_k$, integral constant $I_k$ and integral sum of the line center error $\Sigma LCE_k$ are used for each pulse number. The PZT voltage for the corresponding pulse number in the k region in the next burst is determined by these constants and sums. After the kth pulse, a traditional proportional integral routine controls the PZT voltage. The voltage for next pulse in the burst will be the current voltage plus P*LCE+I*ΣLCE. A flow diagram explaining the major steps in this algorithm is provided in FIG. 16E.

HIGH DUTY CYCLE LNP

Figure 17:
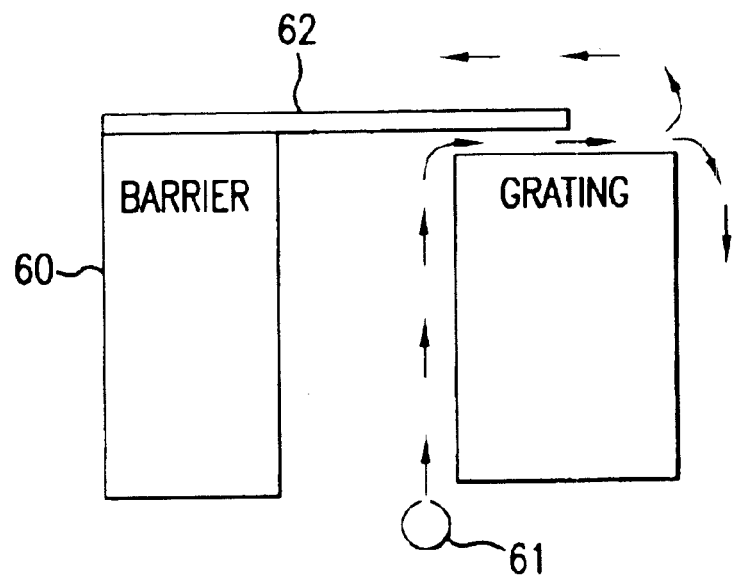
FIGS. 17, 17A, 17B and 17C show techniques for purging a grating face.
Figure 17A:
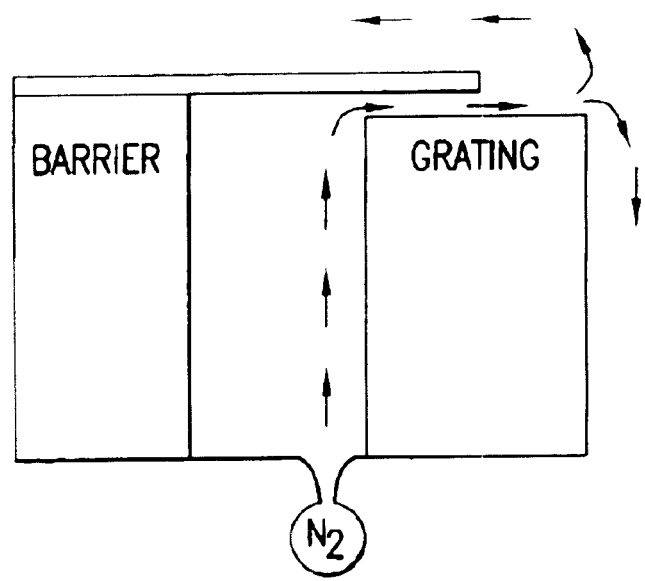
Figure 17B:
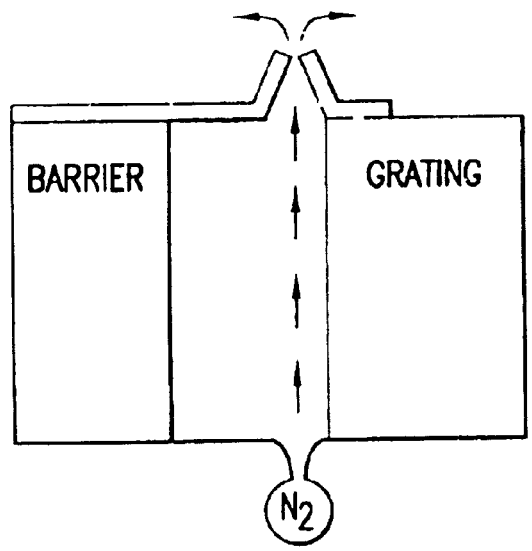
Figure 17C:
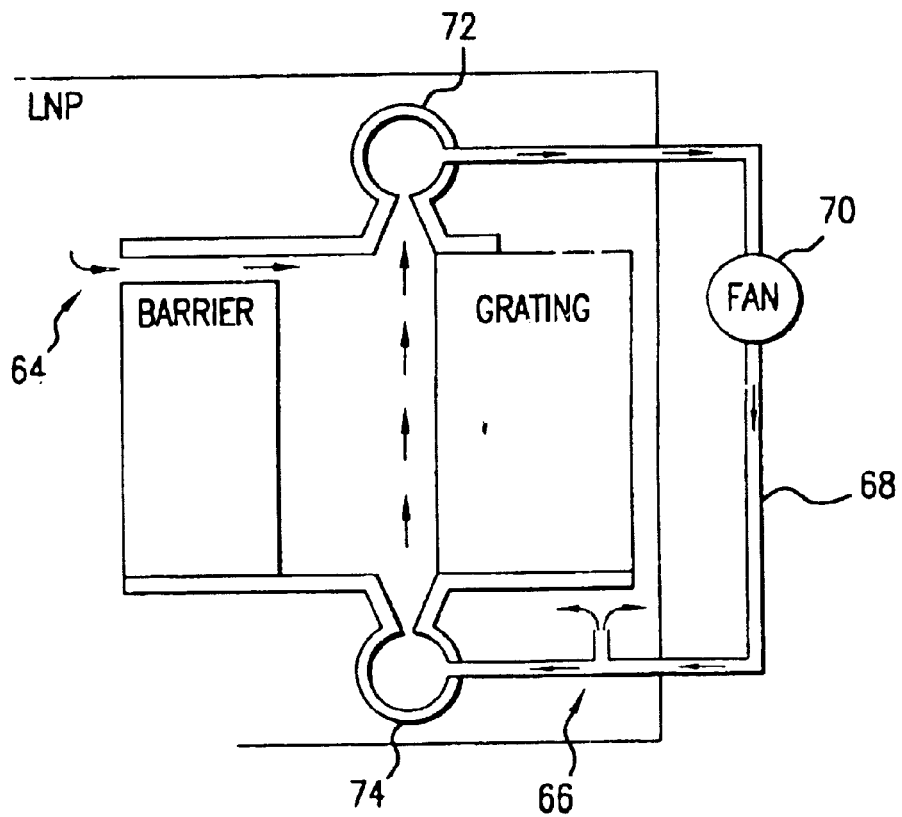

It is known to purge line narrowing packages; however, the prior art teaches keeping the purge flow from flowing directly on the grating face so that purge flow is typically provided through a port located at positions such as behind the face of the grating. Applicants have discovered, however, that at very high repetition rates a layer of hot gas (nitrogen) develops on the face of the grating distorting the wavelength. This distortion can be corrected at least in part by the active wavelength control discussed above. Another approach is to purge the face of the grating as shown in FIG. 17. In FIG. 17, small holes (1 mm on ¼ inch spacings) in the top of 10-inch long ⅜ inch diameter purge tube 61 provides the purge flow. The purge gas can be nitrogen from a pure nitrogen supply as described in a following section. Also, in a preferred embodiment the LNP is purged with helium as described below. Other techniques are shown in FIGS. 17A, 17B and 17C.

Specific techniques useful for controlling wavelength and bandwidth are described in the following patent applications which are incorporated by reference herein U.S. Ser. No. 09/794,782, filed Feb. 27, 2003, entitled "Laser Wavelength Control With Piezoelectric Driver", U.S. Ser. No.: 10/027,210, filed Dec. 21, 2001, entitled "Laser Wavelength Control With Piezoelectric Driver" and U.S. Ser. No.: 10/036,925 filed Dec. 21, 2001, entitled "Laser Spectral Engineering For Lithographic Process".

PURGE SYSTEM

This first embodiment of the present invention includes an ultra-pure $N_2$ purge system which provides greatly improved performance and substantially increases component lifetime.

FIG. 19 is a block diagram showing important features of a first preferred embodiment the present invention. Five excimer laser components which are purged by nitrogen gas in this embodiment of the present system are LNP 2P, high voltage components 4P mounted on laser chamber 6P, high voltage cable 8P connecting the high voltage components 4P with upstream pulse power components 10P, output coupler 12P and wavemeter 14P. Each of the components 2P, 4P, 8P, 12P, and 14P are contained in sealed containers or chambers each having only two ports an $N_2$ inlet port and an $N_2$ outlet port. An $N_2$ source 16P which typically is a large $N_2$ tank (typically maintained at liquid nitrogen temperatures) at a integrated circuit fabrication plant but may be a relatively small bottle of $N_2$. $N_2$ source gas exits $N_2$ source 16P, passes into $N_2$ purge module 17P and through $N_2$ filter 18P to distribution panel 20P containing flow control valves for controlling the $N_2$ flow to the purged components. With respect to each component the purge flow is directed back to the module 17P to a flow monitor unit 22P where the flow returning from each of the purge units is monitored and in case the flow monitored is less than a predetermined value an alarm (not shown) is activated.

Figure 19A:
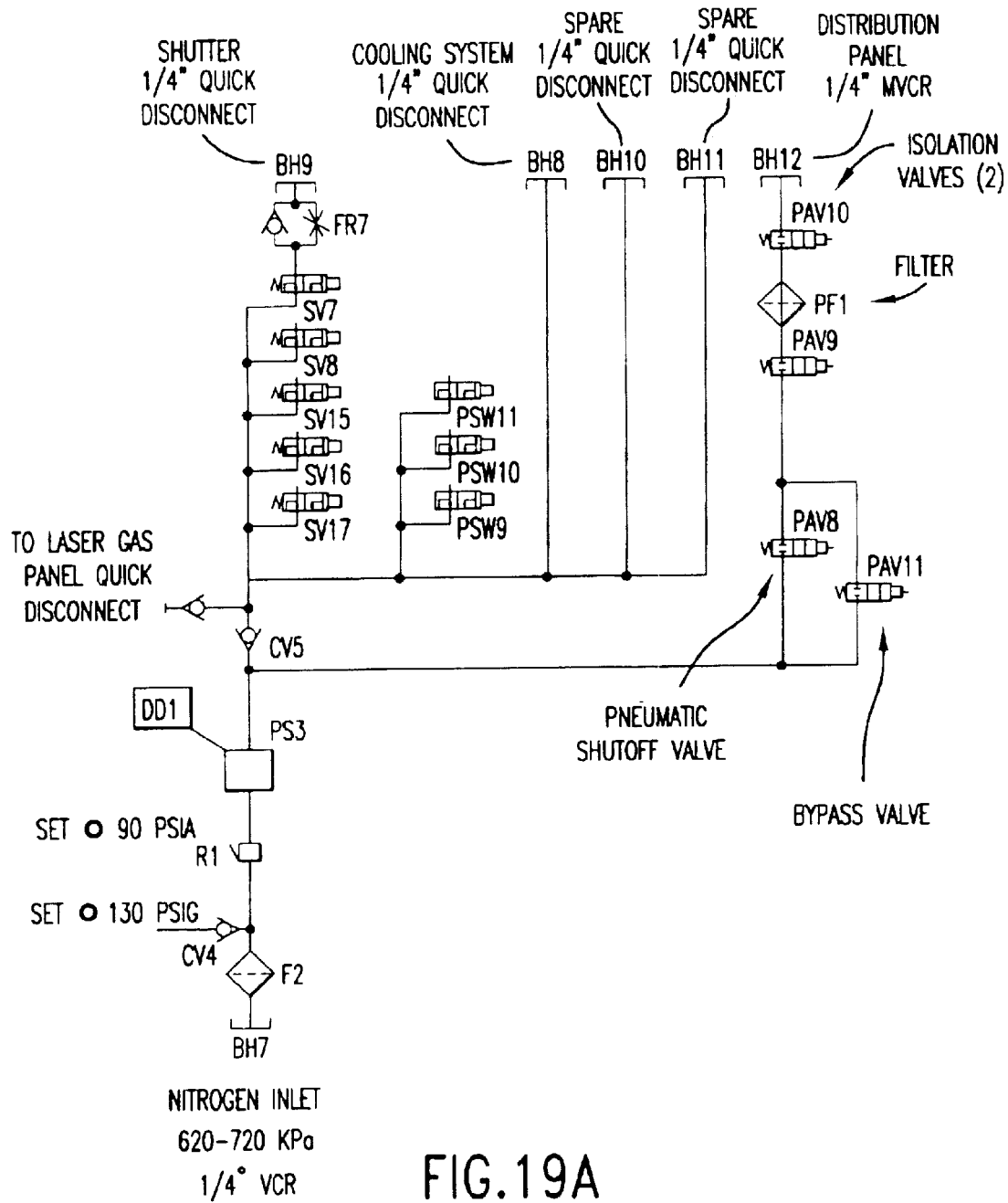

FIG. 19A is a line diagram showing specific components of this preferred embodiment including some additional $N_2$ features not specifically related to the purge features of the present invention.

$N_2$ Filter

An important feature of the present invention is the inclusion of $N_2$ filter 18. In the past, makers of excimer lasers for integrated circuit lithography have believed that a filter for $N_2$ purge gas was not necessary since $N_2$ gas specification for commercially available $N_2$ is almost always good enough so that gas meeting specifications is clean enough. Applicants have discovered, however, that occasionally the source gas may be out of specification or the $N_2$ lines leading to the purge system may contain contamination. Also lines can become contaminated during maintenance or operation procedures. Applicants have determined that the cost of the filter is very good insurance against an even low probability of contamination caused damage.

A preferred $N_2$ filter is Model 500K Inert Gas Purifier available from Aeronex, Inc. with offices in San Diego, Calif. This filter removes $H_2O$, $O_2$, CO, $CO_2$, $H_2$ and non-methane hydrocarbons to sub-parts-per-billion levels. It removes 99.9999999 percent of all particulate 0.003 microns or larger.

Flow Monitors

A flow monitor in unit 22 is provided for each of the five purged components. These are commercially available units having an alarm feature for low flow.

Piping

Preferably all piping is comprised of stainless steel (316SST) with electro polished interior. Certain types of plastic tubing, comprised of PFA 400 or ultra-high purity Teflon, may be used.

Recirculation

A portion or all of the purge gas could be recirculated as shown in FIG. 19B. In this case, a blower and a water cooled heat exchanger is added to the purge module. For example, purge flow from the optical components could be recirculated and purge flow from the electrical components could be exhausted or a portion of the combined flow could be exhausted.

Helium Purge of LNP

In preferred embodiments the LNP is purged with helium and the remainder of the beam path is purged with nitrogen. Helium has a much lower index of refraction than nitrogen so thermal effects in the LNP are minimized with the use of helium. However, helium is about 1000 times more expensive than nitrogen.

Improved Seals

Figure 19C:
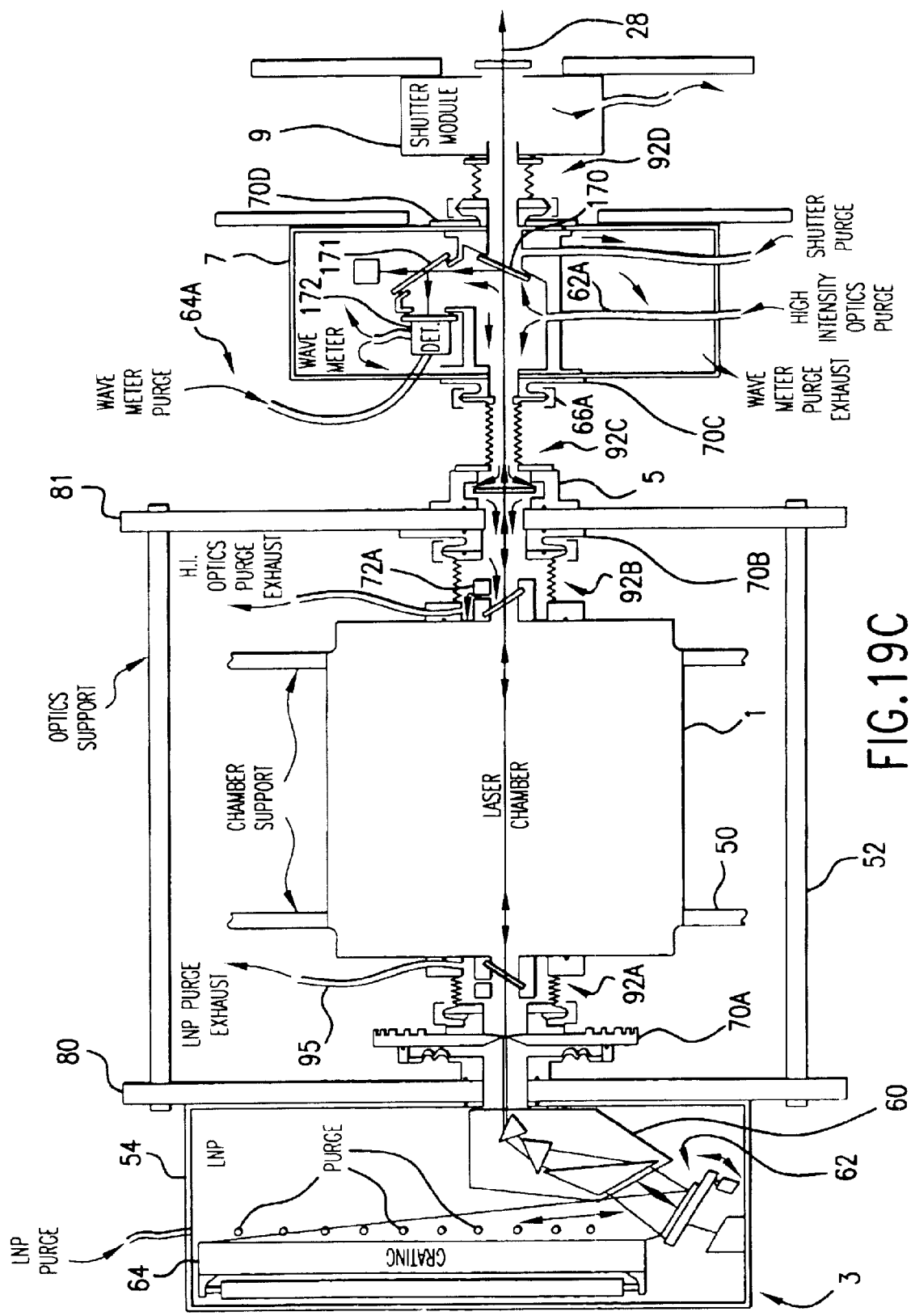
Figure 19E:
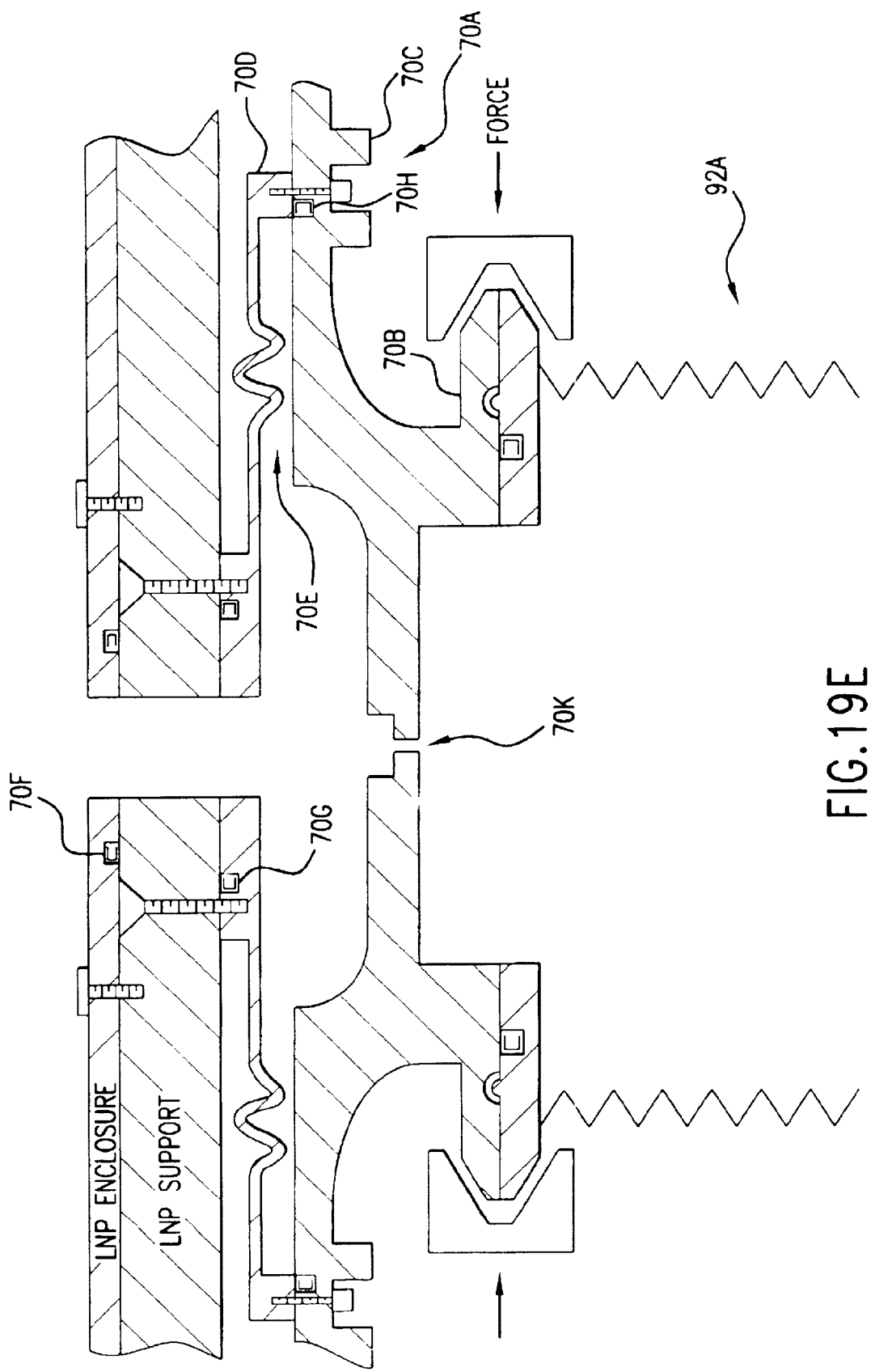
Figure 19G:
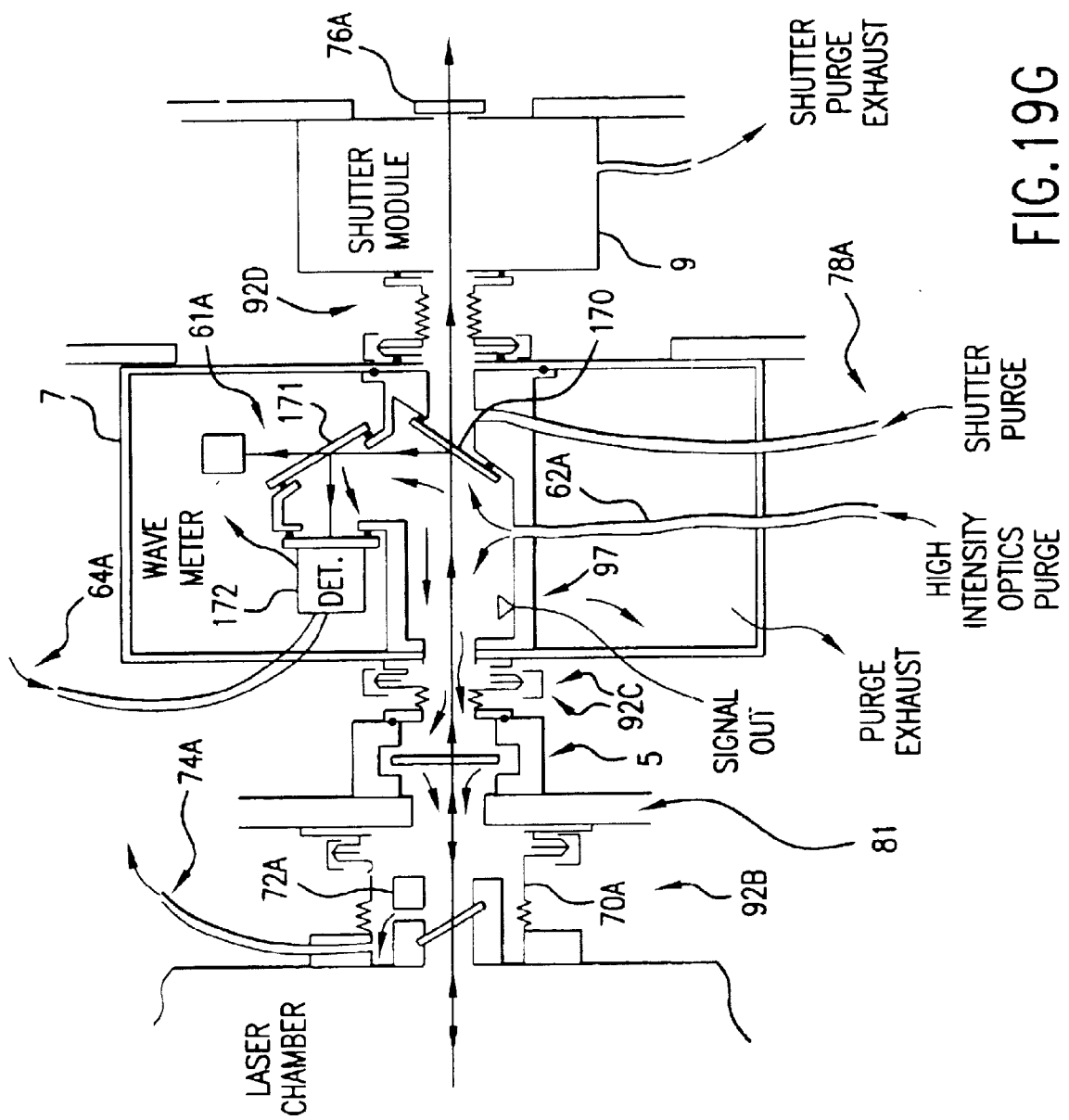

Applicants have discovered major advantages in providing an extremely "clean" beam path. Laser optics tend to deteriorate rapidly in the presence of high energy ultraviolet radiation combined with many forms of contamination including oxygen. Preferred techniques for enclosing the beam path are described in U.S. patent application Ser. No. 10/000,991 filed Nov. 14, 2001, entitled "Gas Discharge Laser With Improved Beam Path" which is incorporated by reference herein. FIGS. 19C, D, E and F are extracted from that application. FIG. 19C is a drawing showing bellows seals between the various components of gas discharge system similar to the master oscillator is described above. FIG, 19D shows a modification including a bellows arrangement to the LNP stepper motor to seal the interface between the motor and the LNP enclosure. FIG. 19E shows a thermally decoupled aperture for the LNP which minimizes heating in the LNP and also encloses the LNP entrance so that it can be purged with relatively inexpensive helium. Helium exits the LNP through a chamber window unit as shown at 95 in FIG. 19C. FIGS. 19F 1, 2, 3, 4 and 5 show easy sealing bellows seal used to provide seals between the laser modules but allowing quick easy decoupling of the modules to permit quick module replacement FIG. 19G shows a special purge arrangement so purge the high intensity portion of a wavemeter. This special purge is described in a following section.

Advantages of the System

The system described herein represents a major improvement in long term excimer laser performance for KrF lasers and especially for ArF and $F_2$ lasers. Contamination problems are basically eliminated which has resulted in substantial increases in component lifetimes and beam quality. In addition, since leakage has been eliminated except through outlet ports the flow can be controlled to desired values which has the effect of reducing $N_2$ requirements by about 50 percent.

SEALED SHUTTER UNIT WITH POWER METER

Figure 20:
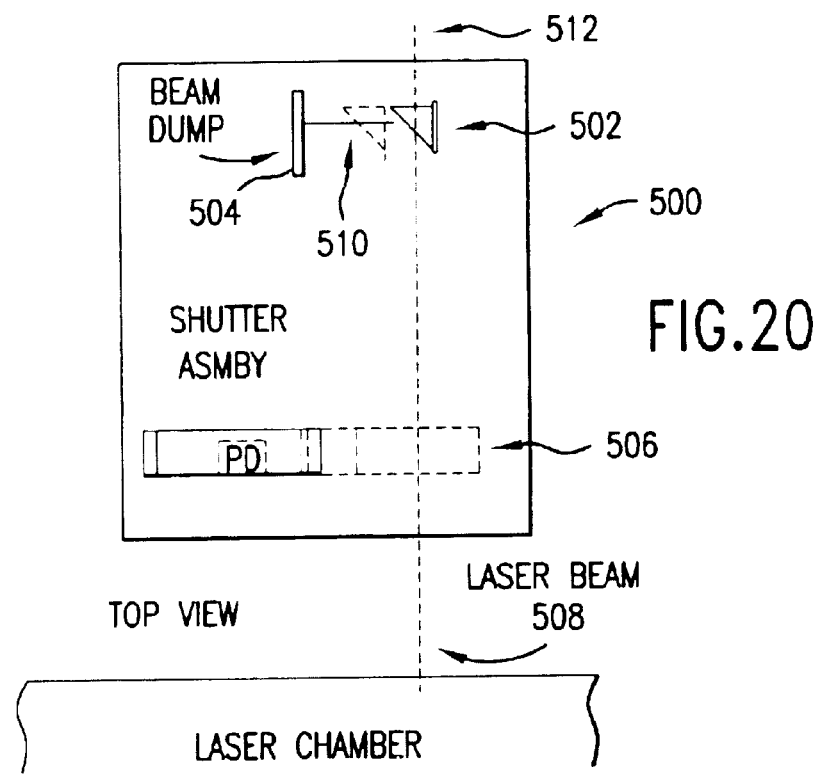
FIGS. 20, 20A and 20B show features of a preferred shutter.
Figures 20A, 20B:
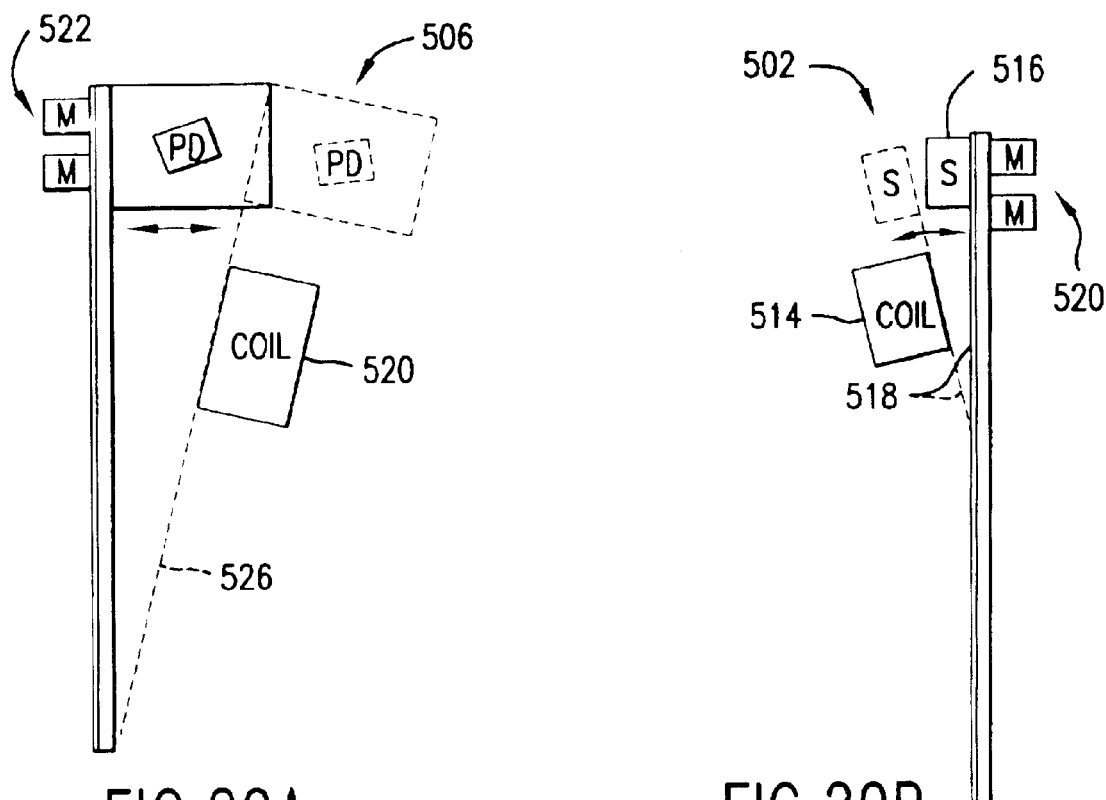

This first preferred embodiment includes a sealed shutter unit 500 with a built in power meter as shown in FIGS. 20, 20A and 20B. With this important improvement, the shutter has two functions, first, as a shutter to block the laser beam and, second, as a full beam power meter for monitoring beam power whenever a measurement is needed.

FIG. 20 is a top view showing the main components of the shutter unit. These are shutter 502, beam dump 504 and power meter 506. The path of the laser output beam with the shutter in the closed position is shown at 510 in FIG. 20. The path with the beam open is shown at 512. The shutter active surface of beam stop element 516 is at 45° with the direction of the beam exiting the chamber and when the shutter is closed the beam is both absorbed in the shutter surface and reflected to beam dump 504. Both the beam dump active surface and the shutter active surface is chrome plated for high absorption of the laser beam. In this embodiment, beam stop element 516 is mounted on flexible spring steel arm 518. The shutter is opened by applying a current to coil 514 as shown in FIG. 20B which pulls flexible arm 518 and beam stop element 516 to the coil removing beam stop element 516 from the path of the output laser beam. The shutter is closed by stopping the current flow through coil 514 which permits permanent magnets 520 to pull beam stop element 516 and flexible arm 518 back into the close position. In a preferred embodiment the current flow is carefully tailored to produce an easy transmit of the element and arm between the open and close positions.

Power meter 506 is operated in a similar fashion to place pyroelectric photo detector in the path of the output laser beam as shown in FIGS. 20 and 20A. In this case, coil 520 and magnets 522 pull detector unit 524 and its flexible arm 526 into and out of the beam path for output power measurements. This power meter can operate with the shutter open and with the shutter closed. Current to the coil is as with the shutter controlled to provide easy transit of unit 524 into and out of the beam path.

Improved WaveMeter Purge

Figure 22:
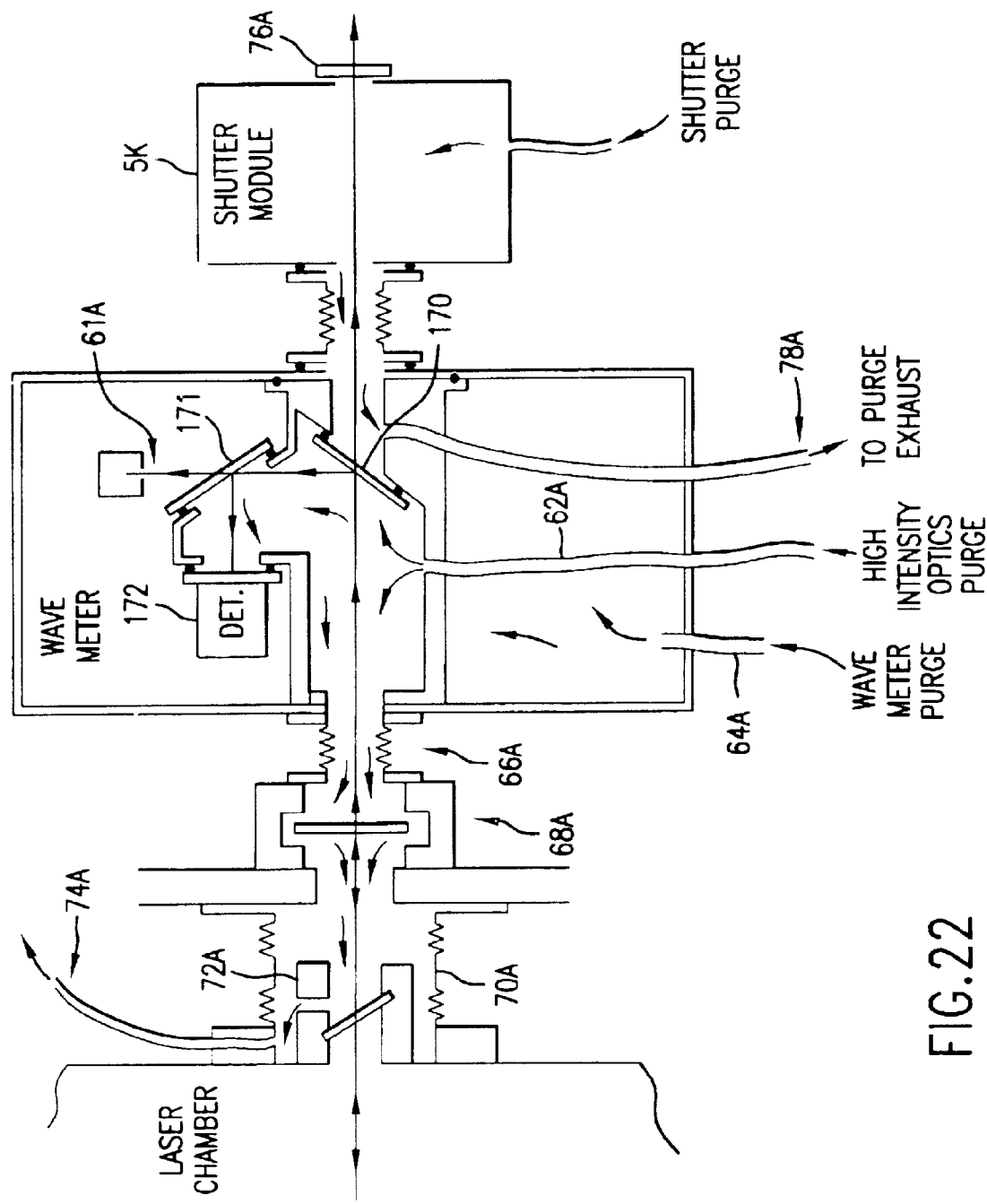
FIG. 22 shows a beam sealing technique.

In this preferred embodiment a special $N_2$ purge technique is used to provide extra purging of the high ultraviolet flux portions of the wavemeter as well as the output coupler and the chamber output window block. This technique is shown in FIG. 22. As explained above the laser output beam intersects partially reflecting mirror 170 (see also FIG. 14) which passes 95% of the energy in the beam as an output beam. About 4% of the reflected beam is reflected from mirror 171 to energy detector 172 where the pulse energy is measured. (The other part of the reflected beam passes through mirror 171 as shown at 61A and goes to other monitors in the wave meter.) At 4,000 Hz this 5% of the output energy represents a lot of UV light so special care has been taken to assure that the gas in the path of this portion of the beam is very clean and pure. To do this the wavemeter is modified to seal the region between the upstream side of mirror 170, the upstream side of mirror 171 and the front side of the window of detector 172 from the rest of the wavemeter. And a special purge flow to and from this region is provided as shown at 62A. The remainder of the wavemeter is purged by a second purge flow shown at 64A.

The purge flow 62A is confined in the wavemeter by seals at mirrors 170, 171 and the 172 detector window. The purge flow exits this region along the laser output beam path through a bellows region 6A back to the output coupler module 68A to purge it. The flow then flows through bellows unit 70A and into window block 72A, out through an exit port in the window block and an exit port in bellows unit 70A then back through a tube to $N_2$ purge module 17 as shown at 74A and in FIG. 19. The downstream side of window 170 is purged with purge flow from shutter module 5K. The purge flow may be from module 17 as shown in FIG. 19 or in some cases window 76A is removed and the output of shutter module is openly connected with a purged customer beam line in which case the exit purge line at 78A may be directed to a customer purge return system or exhausted to atmosphere.

Constant Optical Parameters

As lithography lasers age optical beam quality characteristics can change. Usually, quality tends to deteriorate slowly. When the beam quality no longer meets specifications even after service, replacement of major components (such as the laser chamber, the LNP and/or the wavemeter) is normally necessary. Thus, over the life of the laser beam quality may vary substantially within specification ranges. This could be a problem for integrated circuit lithographers which utilize lithography equipment designed for optical quality laser beams. The result of "better" than normal laser quality could result in an undesirable variation in integrated circuit quality. One solution is to provide a laser system where beam quality remains substantially constant over laser life. This may be accomplished using techniques described in U.S. patent application Ser. No. 10/027,210 filed concurrently with this application where the piezoelectric driver turning mirror can be used to provide wavelength stability values and bandwidth values corresponding to expected nominal values rather than the best values the laser is capable of. Pulse energy can also be controlled using the feedback controls described above to maintain energy stability values at an expected norm rather than the best possible. Fluorine concentration and laser gas pressure can also be regulated to produce expected beam quality values rather than the most stable values of pulse energy and wavelength and the narrowest possible bandwidth values.

Increasing Pulse Duration

Many optical components of integrated circuit lithography equipment especially lens components are very expensive. These components are known to deteriorate in use with short wavelength ultraviolet light. It is known that for a given pulse energy deterioration increases with decreasing pulse length. Therefore, longer pulse length equates to longer lens life. Therefore, longer pulse length could be an important improvement for these excimer lasers. The deterioration rate is much worse for ArF at 193 nm than KrF at 248 nm.

Figure 23A:
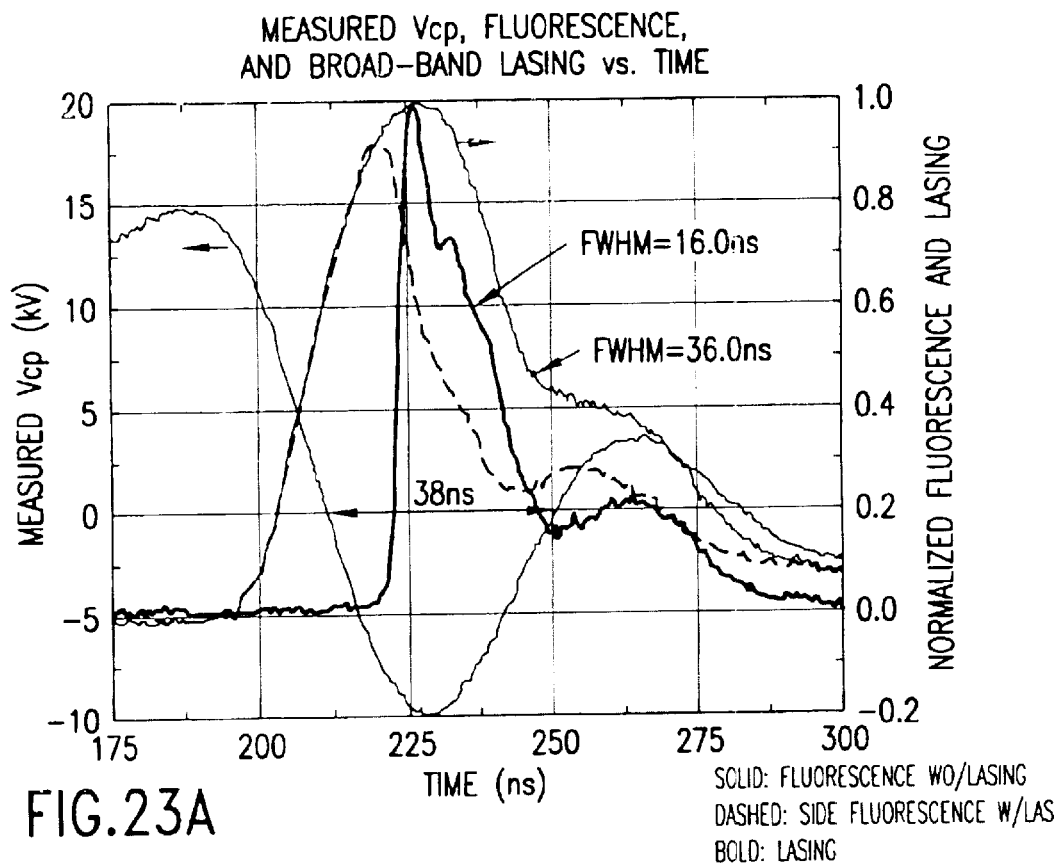
FIGS. 23A–23T describe a pulse stretching technique.

Typical pulse duration are about 15 ns to 25 ns for KrF and ArF narrowband lasers designed for the most efficient laser performance at pulse energies in the range of about 5 mJ to 10 mJ. FIG. 23A shows features of a typical excimer laser pulse. These features are voltage or Cp, side fluorescence without lasing and with lasing and the laser pulse for a KrF laser. Applicants have experimented with several techniques for increasing laser pulse durations such as increasing the capacitance of Cp but these techniques resulted in much deteriorated over-all performance. Applicants have sucessfully increased pulse duration substantially using a pulse power configuration Applicants call "Current Overshoot Maximizer".

Current Overshoot Maximizer

Figure 23B:
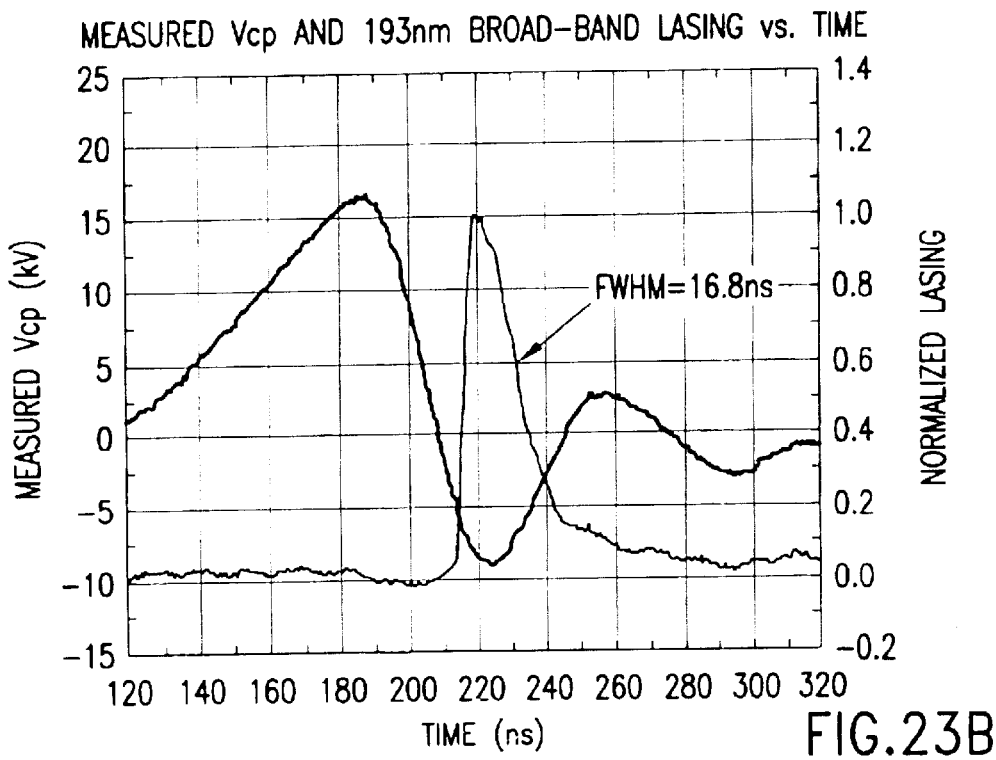
Figure 23C:
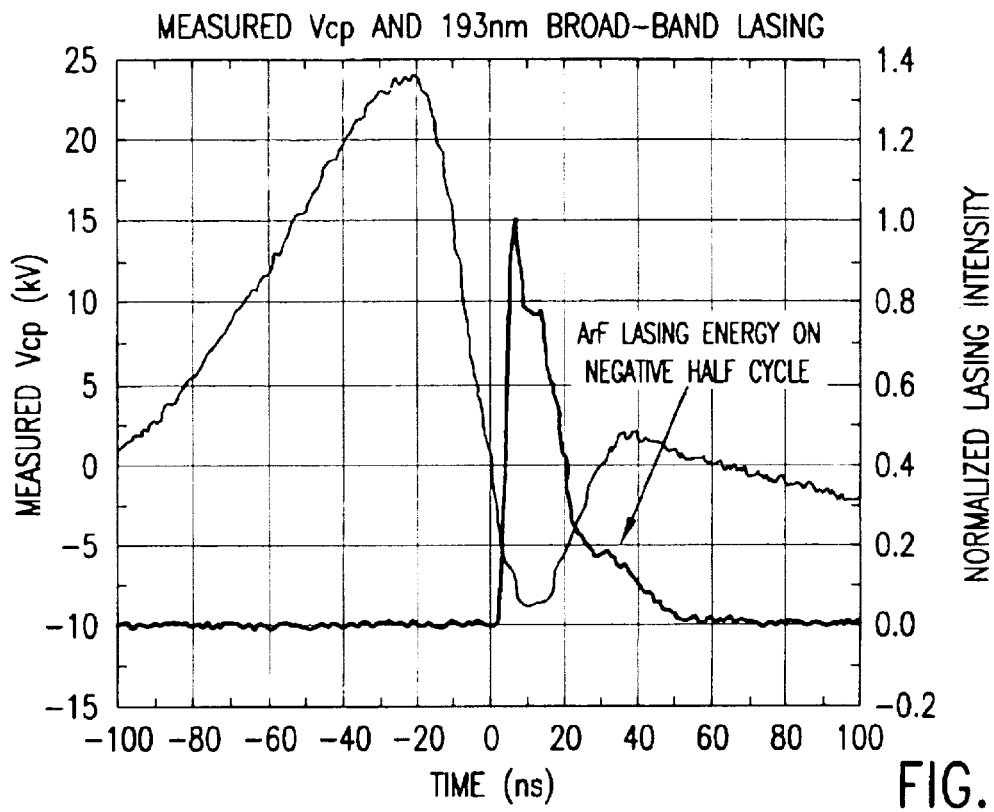
Figure 23D:
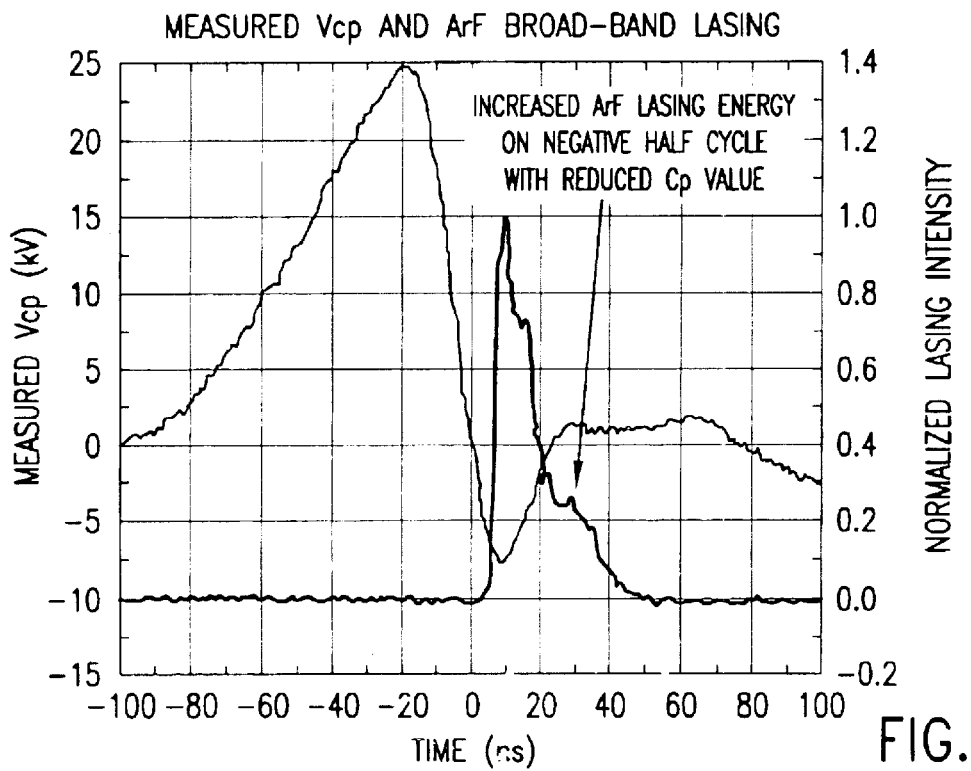
Figure 23E:
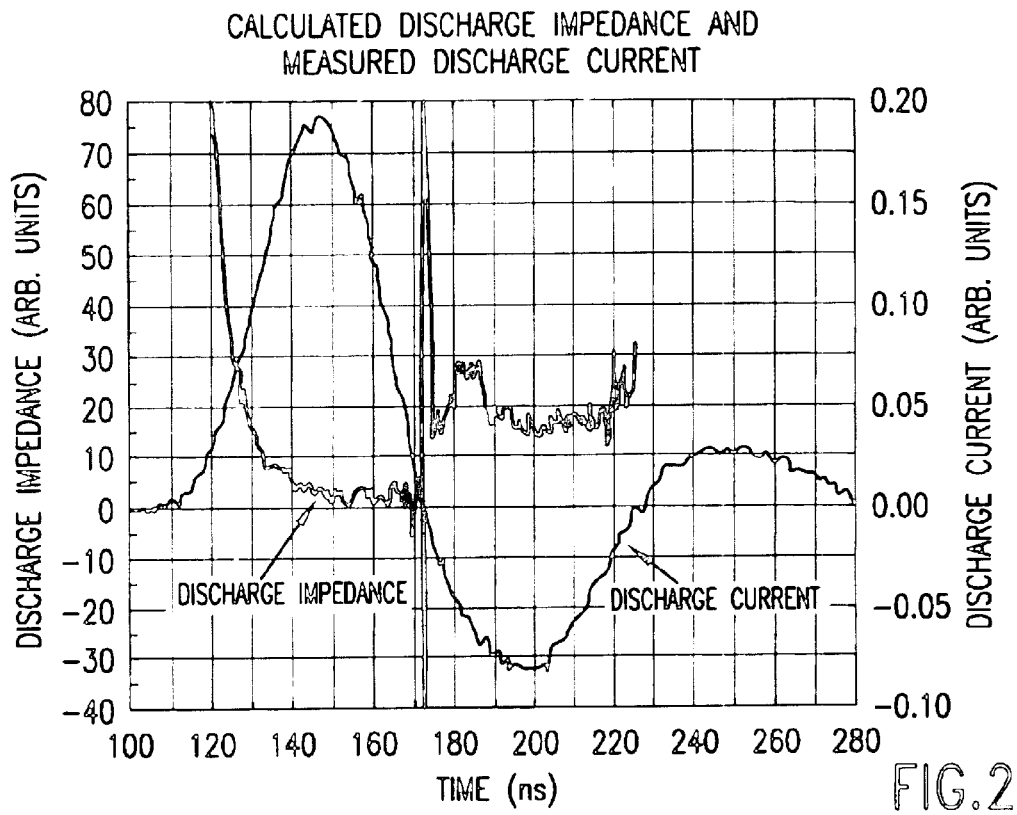
Figures 1, 23N:
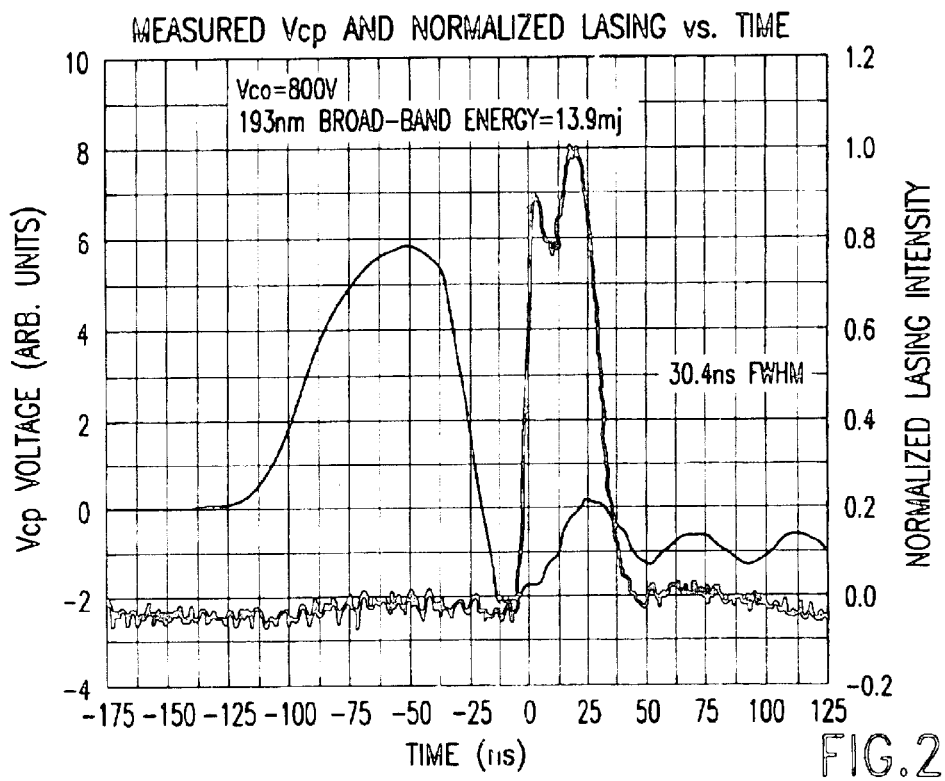
Figure 23F:
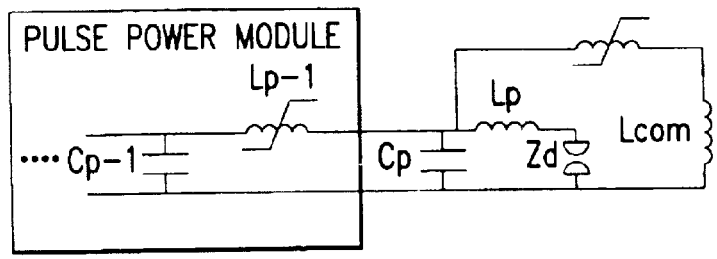

A pulse power current overshoot maximizer ("COM") circuit is shown in FIG. 23F. The first clue that a current overshoot strategy may be viable is evident in FIG. 23A. The lasing intensity shown in this figure has two definite humps, the first caused by the initial positive current cycle and the second smaller hump due to the first negative current cycle through the discharge. The difference in intensity is due to the greatly reduced energy stored in Cp prior to the negative current cycle as compare to the amount just prior to the first positive current cycle. If the amount of lasing which occurs on the negative cycle can be increased, then the resulting lasing pulse will be approximately two times wider. For reference, the ArF lasing results shown in the baseline report are shown in FIG. 23B. At that time, no lasing at all occurred on the negative current cycle in ArF as it clearly does for KrF.

The values for Cp and Lp are important in determining the level of electrical pumping during each part of the waveshape. In this case the desire is to increase the pumping level during the negative current cycle. This can be accomplished in two ways, first to reduce Lp so that more of the negative Vcp is applied across the discharge and secondly to reduce Cp so that Vcp is higher for a given stored energy and can overcome the head inductance faster for higher peak current. Reducing Lp from 6.5 nH to 4.1 nH raised the negative cycle pumping level above threshold for ArF as shown in FIG. 23C. In this figure one can see significant lasing energy caused by the negative current cycle. Reducing the Cp value further increased the level of lasing output during the negative current cycle as shown in FIG. 23D.

The amount of lasing output during the negative cycle shown in these figures is still well below the 50% intensity level. One reason for this is the improved matching to the discharge impedance which resulted from these Lp and Cp value changes. As Lp and Cp are reduced, more of the Cp stored energy is transferred to the discharge during the time when the discharge exhibits a high impedance. Measurements of the time varying discharge impedance were made and the results are shown in FIG. 23E. The discharge impedance takes approximately 20 ns to collapse from $M\Omega$ values to the region of $1\Omega$. If the discharge circuit formed by Cp and Lp is made fast enough, all of the energy stored in Cp will be dissipated into the high impedance discharge and there would be no voltage overshoot on Cp. The reductions in Cp and Lp necessary to achieve lasing during the negative cycle have also increased the fraction of initial Cp energy which is absorbed by the discharge during the first positive current cycle. As the amount of energy absorbed during the positive cycle is increased, there is less energy remaining on Cp during the negative voltage overshoot and thus less energy available to drive the negative current cycle.

Figure 23G:
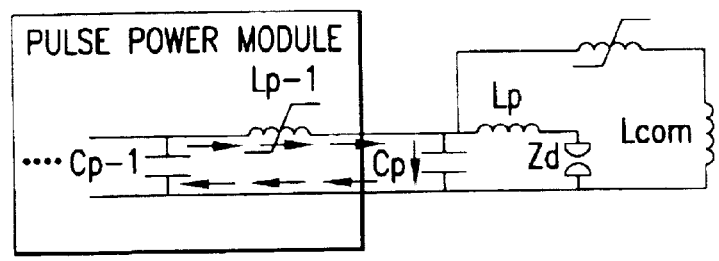
Figure 23H:
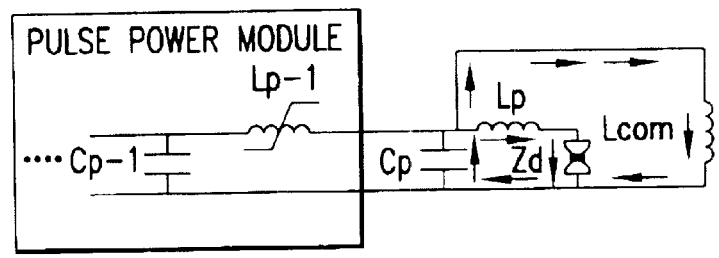
Figure 23I:
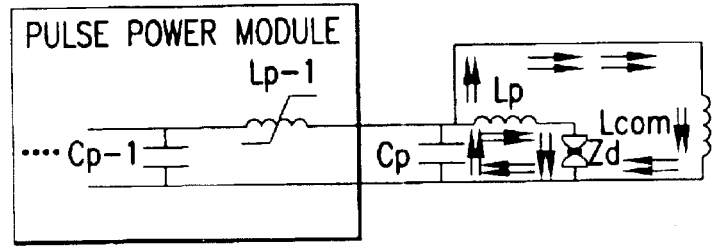
Figure 23J:
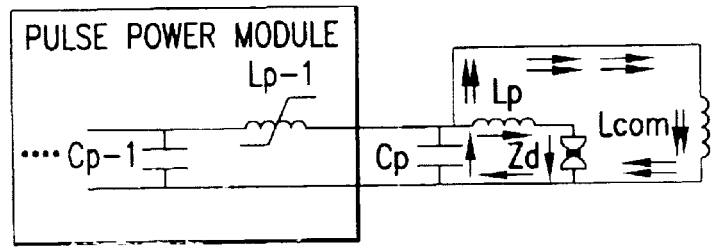
Figure 23K:
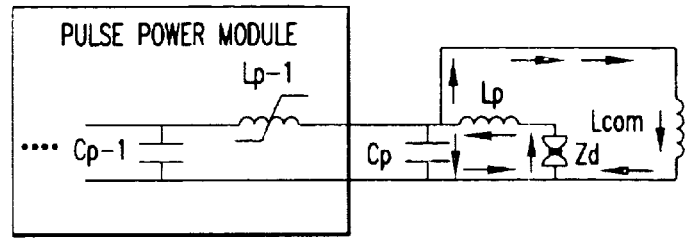
Figure 23L:
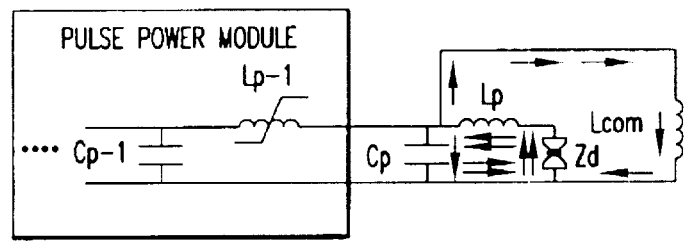

A schematic diagram of the COM is shown in FIG. 23F. This circuit is similar in topology to the double pulser used early in the 2× program except that the outer peaking capacitors are replaced with an inductor called Lcom. The V*S product of the saturable inductor placed between Lcom and Cp is sized to switch nearly simultaneously with the initiation of discharge. With this arrangement, current will flow from the peaking capacitors into both the discharge and the COM inductor. The sequence of events is as follows:

1) Cp is pulse charged by the pulse power module (FIG. 23G).
2) The COM saturable inductor switches nearly simultaneously with the initiation of avalanche discharge (FIG. 23H).
3) Current flow begins to build, flowing out of Cp into both the discharge and Lcom (FIG. 23I).
4) The voltage on Cp passes through zero and the current through the discharge begins to subside, but the Lp inductance and the Lcom inductance force continued current flow out of Cp, forcing Vcp negative. Since the inductance of Lcom is larger than Lp, its current flow subsides much more slowly than the discharge current (FIG. 23J).
5) The negative voltage on Cp (and thus negative voltage on Lp) reverses the current flow through the discharge, but the current flow through Lcom remains in the same direction because it has a larger value than Lp and thus a longer time constant (FIG. 23K).
6) The current flowing through Lcom no longer flows out of Cp but instead flows through the discharge which presents a much lower impedance than Cp. The reverse discharge current is driven by both the current flow through Lcom and the negative voltage on Cp. Thus, the magnitude of the negative current half cycle through the discharge is increased by the presence of the COM inductor (FIG. 23L).

Optimum operation of the COM depends on minimizing the total inductance of the COM inductor, Lcom. Two factors lead to an increase in the value of Lcom. The first factor is the need for sufficient V*S product in the Lcom saturable switch. As the V*S product requirements increase, so does the saturated inductance of this switch due to the need for a greater volume of ferrite cores. Initial experiments with the COM used a 100 ns transfer time pulse power system. The required core volume to hold off while charging Cp was 8 torroidal cores each 1.0 inch ID×2.5 inch OD×0.5 inch thick. Later experiments made use of a 75 ns transfer time pulse power system developed for the 2× program. With this transfer time, only 6 cores were required, affording a 25% reduction in the saturated inductance of the COM switch.

The second factor affecting the inductance of the Lcom is the longitudinal inductance of the peaking capacitor buss. All of the schematics shown so far represent Cp and Lp as single lumped circuit elements. These circuit elements are actually distributed. For example, the 16.5 nF peaking capacitance is made up of 28 individual capacitors each with a value of 0.59 nF. A more realistic schematic representation of the laser chamber is shown in FIG. 13. The peaking capacitance is now broken up into Cp1, Cp2, . . . Cpn. The head inductance is similarly broken into individual elements. In addition to the Cp and Lp components are the buss inductance elements, Lb1 through Lbn-1. The buss inductance elements represent the inductance in the longitudinal direction between the peaking capacitors. Normally, this circuit element is unimportant because it does not participate in the Cp-Lp-Zd loop and its inductance value is small compared to the Lp-1 inductor inside the last stage of the pulse power module.

This buss inductance does become important when using the COM because the COM is not a distributed element, instead it feeds the peaking capacitor buss at a single point. Thus, current flowing from Lcom must pass through various amounts of buss inductance before reaching the discharge. New peaking capacitor interconnection plates have been designed to exclude as much magnetic flux as possible between the top and bottom of the peaking capacitor buss. The effect of these flux exclusion plates can be seen in the ringing frequency of the energy trapped on the peaking capacitor buss after the main discharge. A 14% reduction in the per length buss inductance results from the addition of the lower flux exclusion plate. Addition of the upper flux exclusion plate also leads to a similar reduction. Minimizing the buss inductance has greatly increased the efficiency of the COM system. Because of the smaller value of Lcom, the COM creates a higher peak reverse current in the discharge.

Initial COM measurements were made with an ArF gas fill of 360 kPa total pressure and a 0.36 kPa partial pressure of fluorine. This gas mix represents a considerable reduction in pressure from the baseline mix of 440 kPa total pressure. Over the past 13 months, various developments in pulse power and chamber design (most of which have been listed above) have allowed the gradual reduction in gas pressure while still maintaining a satisfactory 193 nm optical gain. The desire for a reduced operating pressure stems from the empirical finding that high repetition rate performance (1000 Hz and above) is more stable with lower laser gas pressures.

Figure 23M:
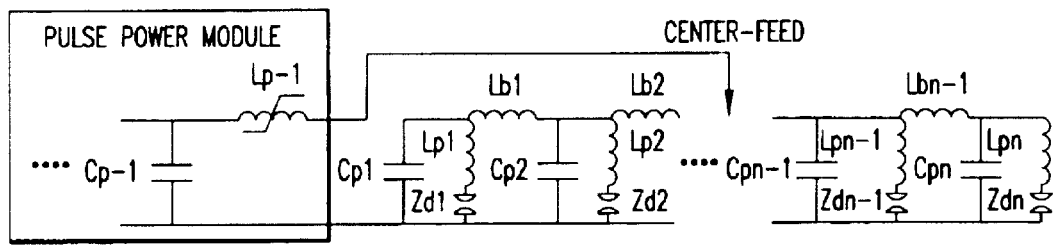
Figure 23N:
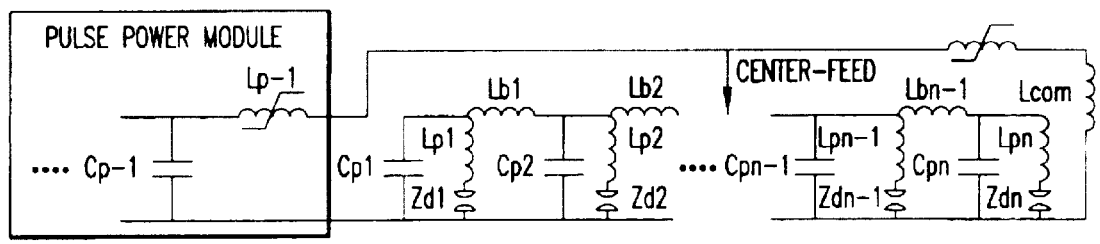
Figures 1, 23M:
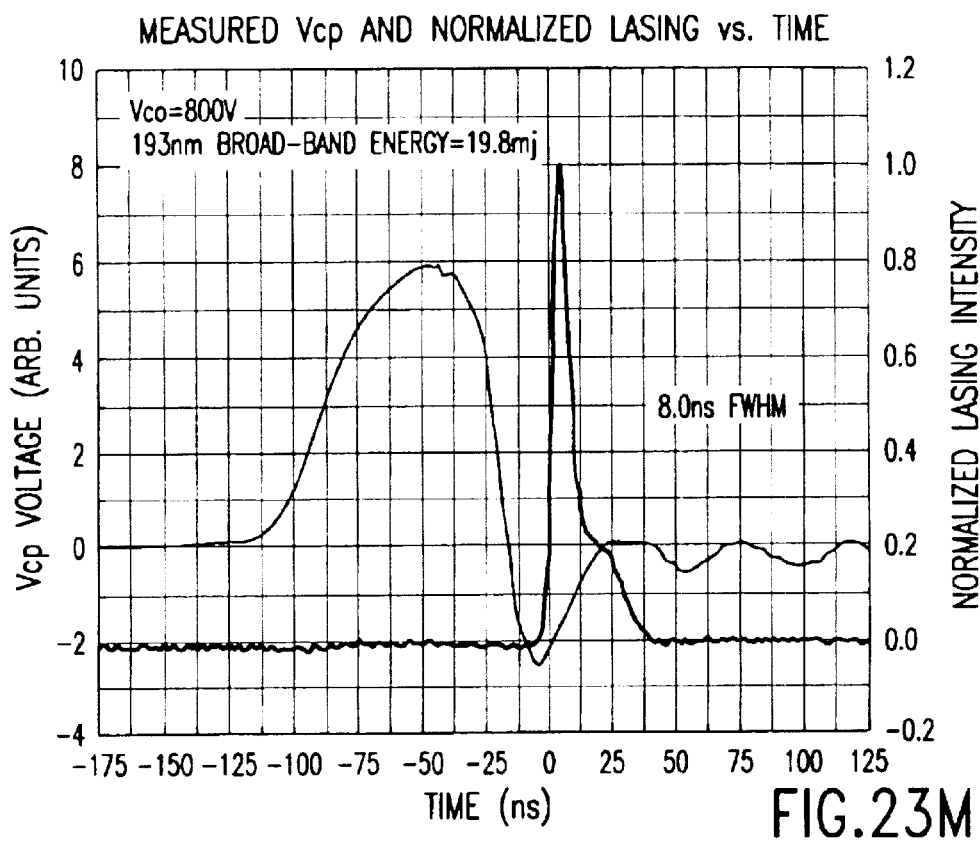
Figures 2, 23M:
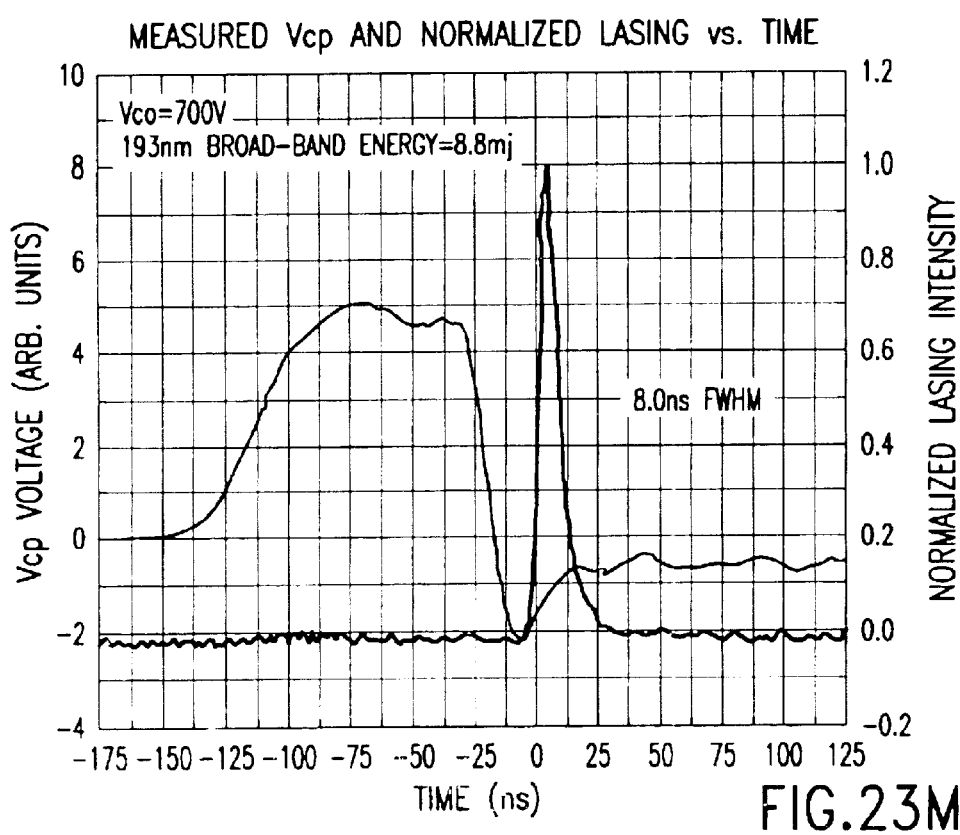
Figures 3, 23M:
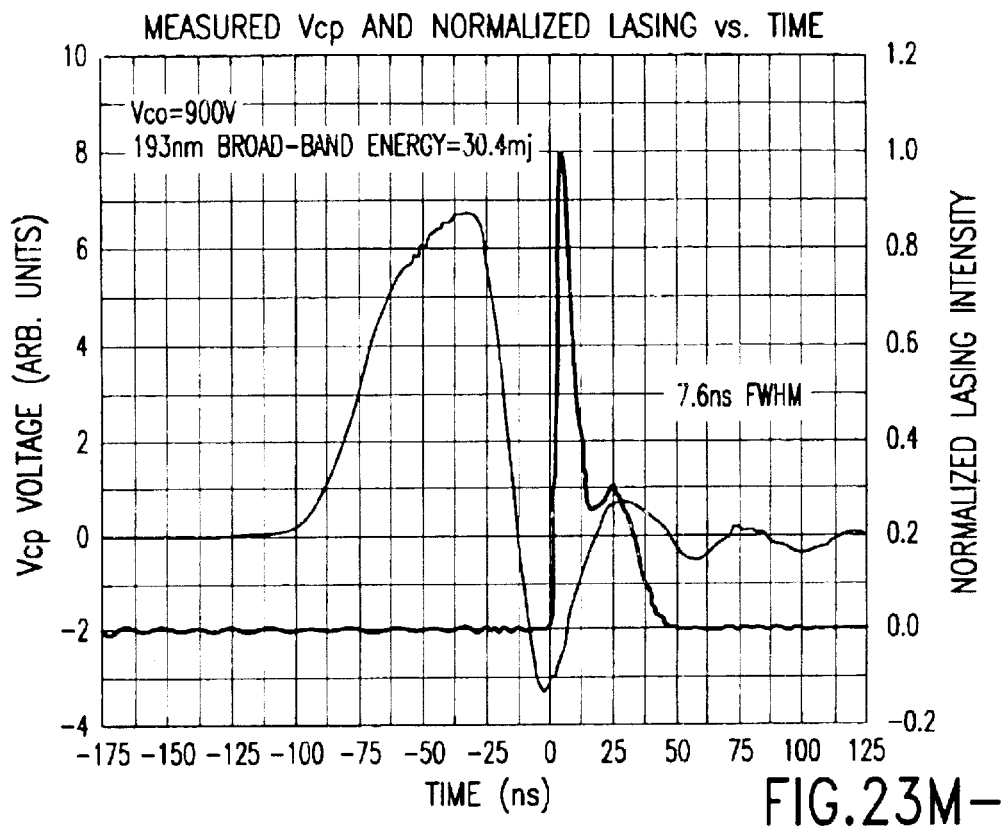
Figures 4, 23M:
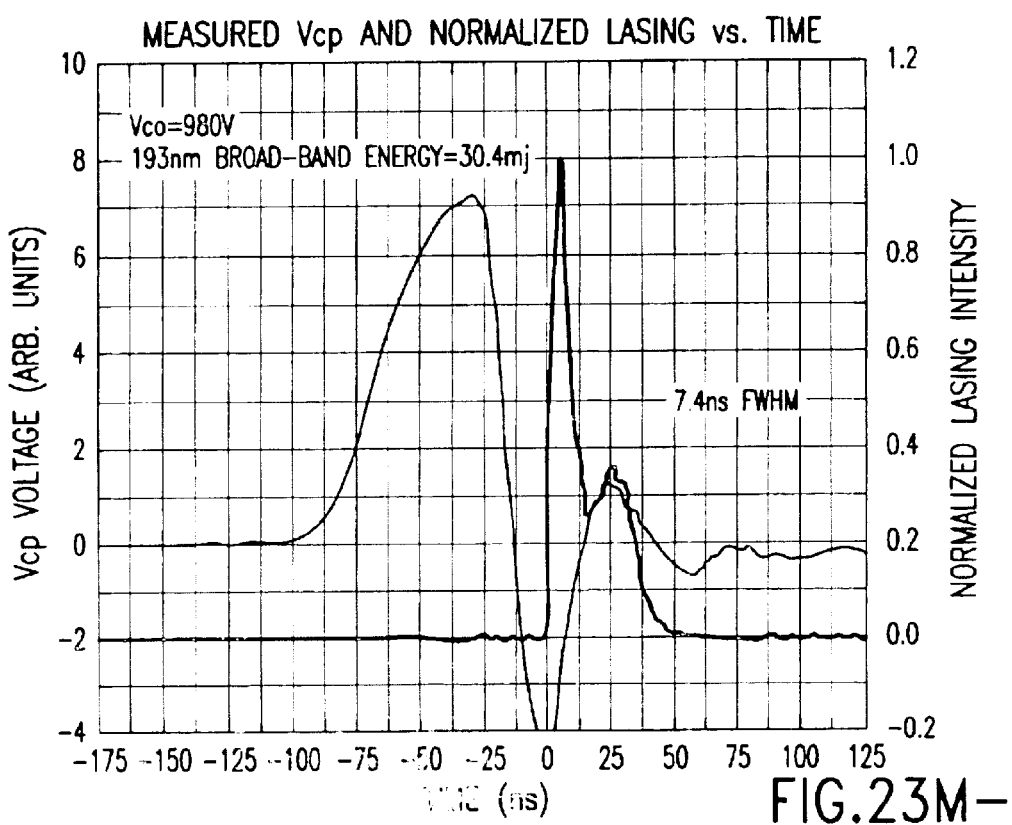
Figures 2, 23N:
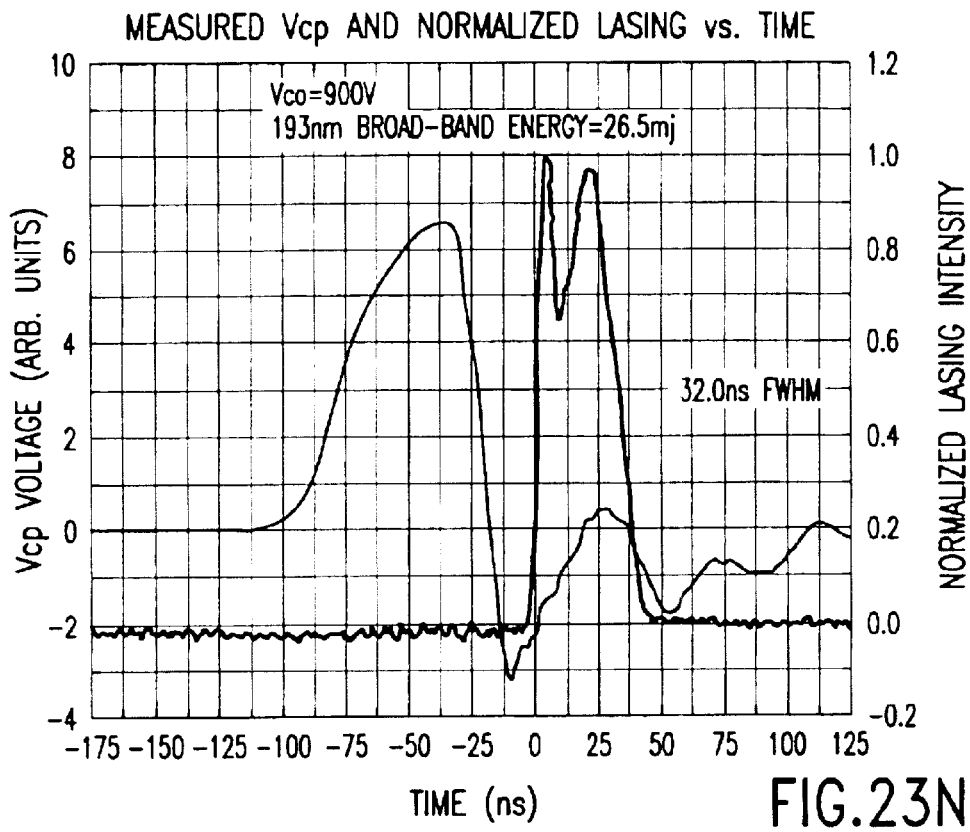
Figures 3, 23N:
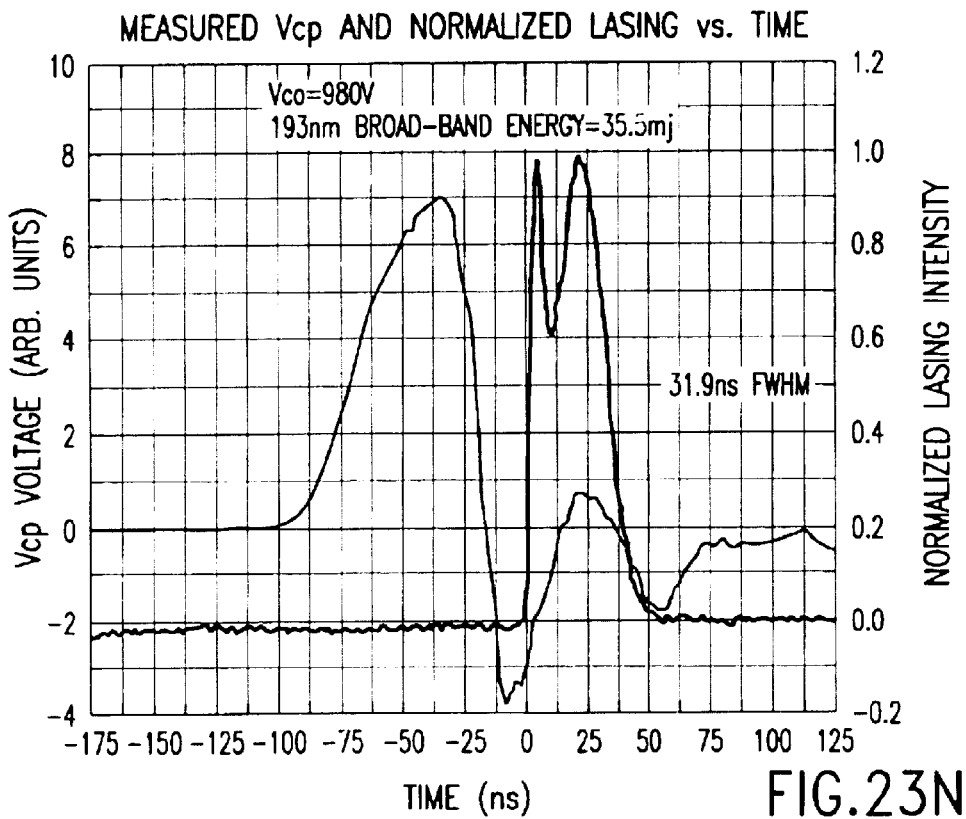

At the 360 kPa pressure level, the reduction in laser system efficiency while using the COM was between 20% and 30% and the characteristic double pulse width could only be obtained for Vco values of 900 V or greater. After some experimentation, it was found that with a lower total pressure, 300 kPa, the reduction in efficiency with the COM was similar to that with the KrF laser and successful operation was obtained down to Vco values of 800 V. The Vcp and lasing waveshapes with out the COM are shown in FIG. 23M (1–4) for various charging voltage. The Vcp and lasing waveshapes with the COM are shown in FIG. 23N (1–4).

Figure 23O:
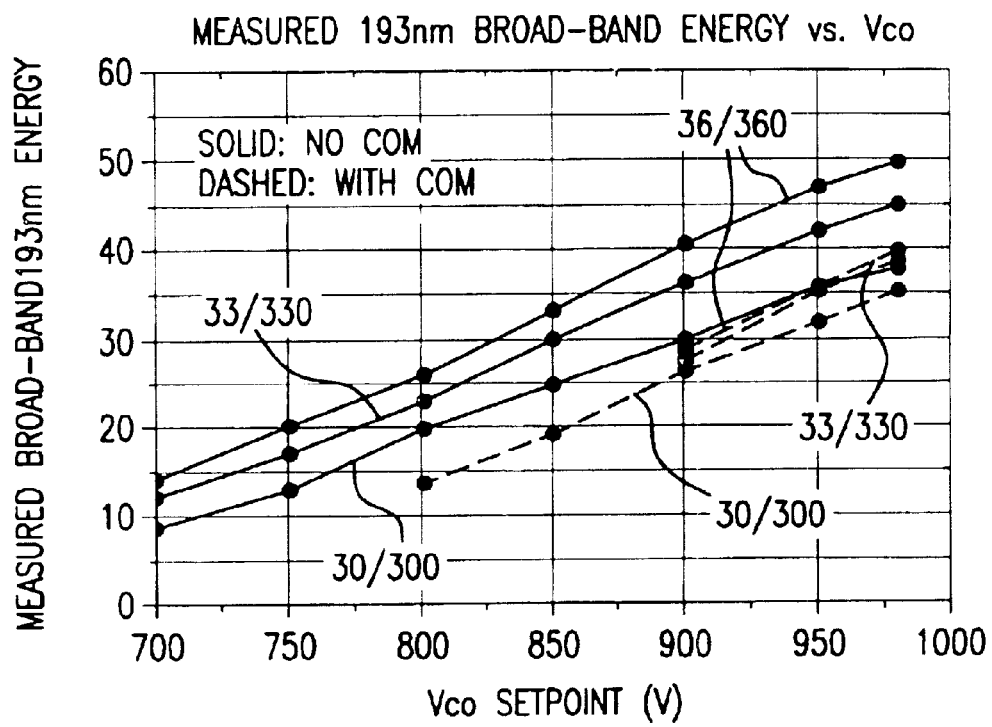
Figure 23P:
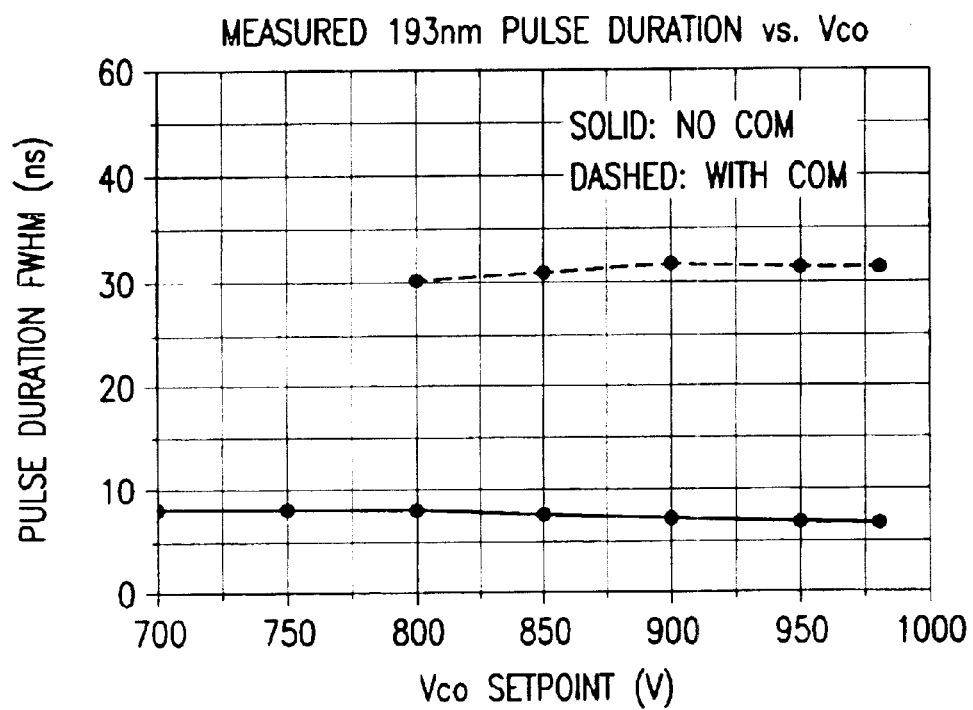

The change in efficiency when using the COM can be seen in the results shown in FIG. 23O. As the total gas pressure is reduced, the difference between the non-COM and COM configurations becomes less. FIG. 23P shows the measured 193 nm pulse duration with and without the COM. The addition of the COM increases the lasing pulse duration from approximately 8 ns FWHM to 31 ns FWHM. Unfortunately, the 8 ns FWHM value is not the baseline for the 2x program. For comparison, FIG. 1 shows the 16.8 ns FWHM pulse duration for the 2x program baseline performance.

The results of section 4 showed that the COM can efficiently double the 193 nm optical pulse duration. Other performance criteria are of equal importance such as line-narrowed spectral performance, energy stability, and electrode erosion. This section contains the measured performance of a line-narrowed laser system employing the COM. The KrF configuration was used because of the many uncontrolled variables that presently exist in highly line-narrowed ArF systems.

Figure 23Q:
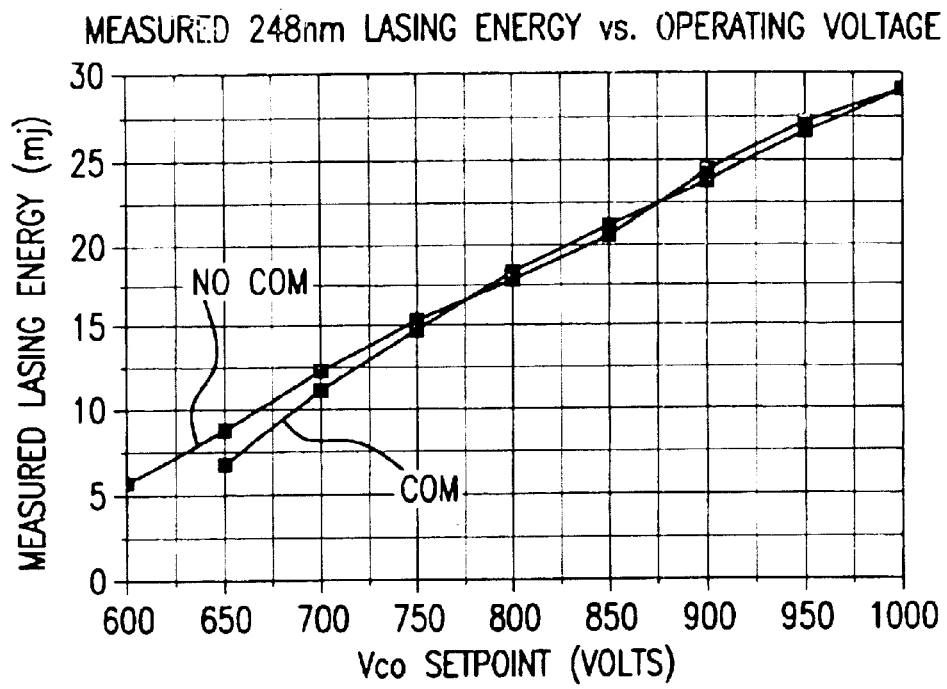
Figure 23R:
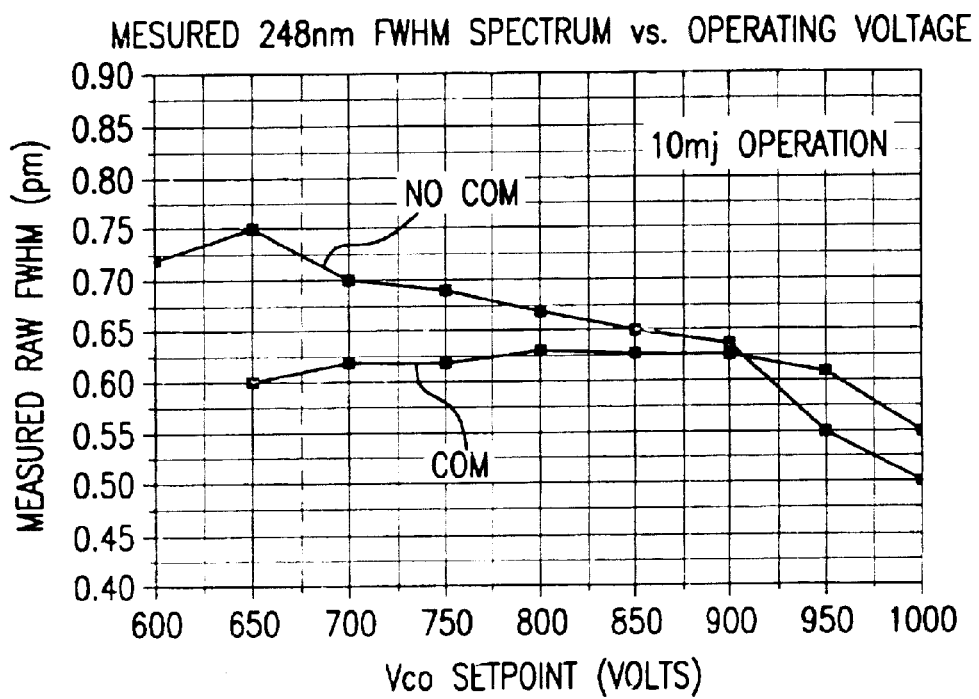

The line-narrowed efficiency with the COM in place is virtually identical to that without the COM as shown in FIG. 23Q. The output energy vs. operating voltage shows only a small deficit at the lower operating voltages and not difference at all for the higher operating voltages. The measured FWHM spectral performance is shown in FIG. 23R. Use of the COM results in a slightly lower FWHM spectrum and a more consistent spectrum over the full operating range. The consistent spectrum with the COM is most likely due to the fact that the pulse shape does not change over the range of operating voltages with the COM while there are dramatic changes in pulse shape without the COM.

Figure 23T:
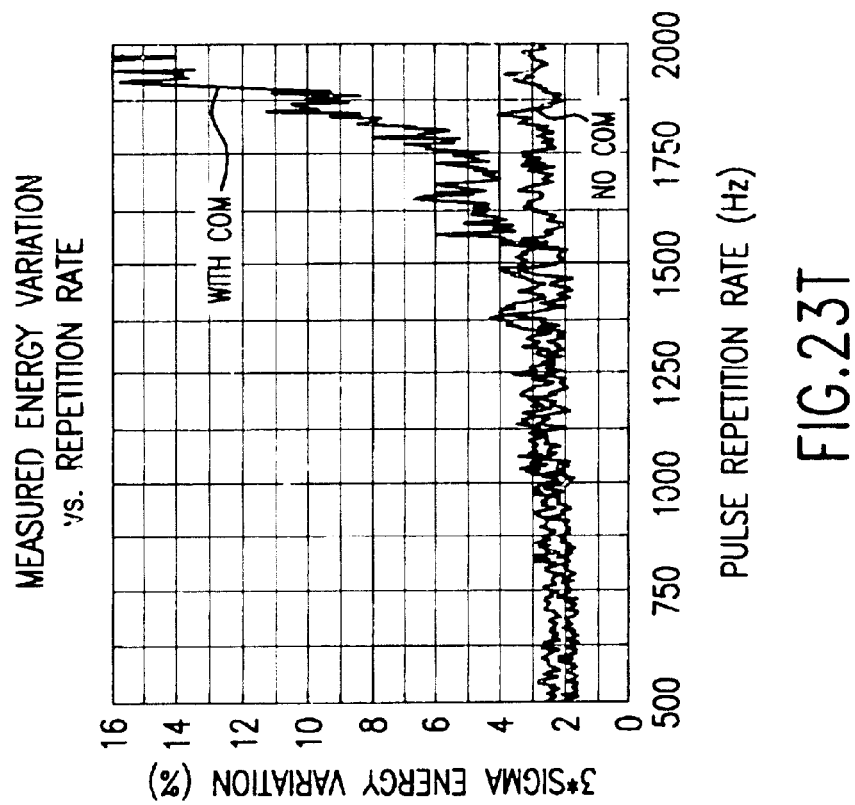
Figure 23S:
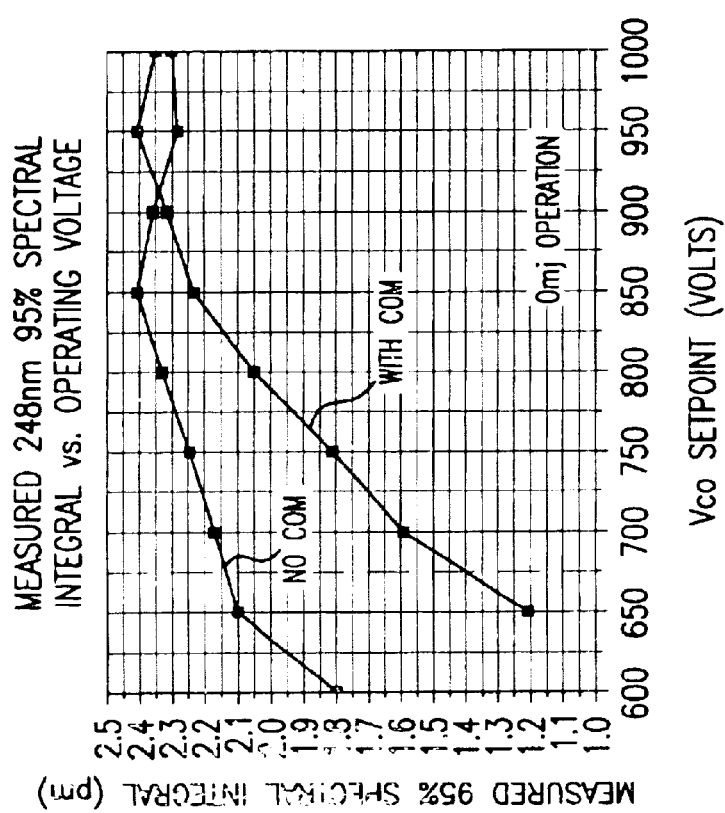

The 95% spectral performance is shown in FIG. 23S. Both configurations exhibit a reduction in 95% spectral integral with decreasing operating voltage. This effect is well known and is thought to be due to the reduction in cavity gain for lower operating voltages. As the cavity gain is reduced, the weakly lasing "wings" of the spectrum are more greatly impacted than the main body of the spectrum since the "wings" are so much closer to lasing threshold. It is also well understood that a longer pulse duration leads to a smaller 95% spectral integral. For the normal case without the COM these two conditions, suppression of the spectral wings and the pulse duration, are in conflict since the pulse duration decreases for lower operating voltages and tends to increase the 95% spectral integral opposite to the wing suppression. Since the COM maintains a constant pulse shape over nearly the full range of operating voltage, suppression of the spectral wings can achieve full effect. The improvement in 95% spectral integral can be extreme for the lower operating voltages. For example, at the 10 mj output level use of the COM results in a 45% reduction in the 95% spectral integral.

Energy stability is another important performance parameter for both broad-band and line-narrowed operation. There are several ways to specify the laser's optical energy stability and many operating modes under which it can be measured. Historically, it has been found that all of these various methods are proportional to some degree with a simple measure of the energy standard deviation, $\sigma$, while operating in constant voltage mode. FIG. 23T shows the measured energy variation in constant voltage mode for line-narrowed KrF operation. The low repetition rate performance of the COM is slightly worse than without, but not substantially. For reasons unsure at this time, the energy stability performance degrades with the COM for repetition rates above 1500 Hz.

Once possibility for degraded energy stability performance at higher repetition rates is increased streamer activity caused by energy remaining in the COM inductor after the main discharge. Since the COM inductor stores energy via current flow, as the discharge extinguishes and becomes an open circuit the voltage across the COM inductor will spike up in an attempt to maintain any current flow which may still exist. A large enough voltage spike across the COM inductor and thus across the electrodes will re-initiate avalanche but this time into a non-uniform, poorly pre-ionized gas medium resulting in an arc or streamer. These streamers can have very low energy compared to the main discharge, 1 mj as compared to 2–5 J.

Though these energies are small, they are concentrated into very small regions so the energy density of a streamer can be much higher than that of the main discharge. Such small regions of high energy density create acoustic energy in the form of over-pressure waves emanating from the arc region. At low repetition rates this acoustical energy can dissipate before the next laser pulse and thus have little effect on laser operation. At higher repetition rates significant acoustical energy remains and the resulting pressure variations can disturb the discharge quality. In addition, the higher repetition rates approach the first harmonic resonances of the chamber volume and increased acoustics from streamers can pump these resonances to form acoustic standing waves within the chamber.

Additional evidence for increased streamer density when using the COM is in the Fluorine consumption comparison. Shorter spans between injections with the COM implies a 33% increase in Fluorine consumption and thus an equivalent increase in the electrode erosion rate. Cymer has found that electrode erosion is strongly related to the size, quantity, and frequency of streamers occurring between the electrodes. Use of the COM seems to increase streamer activity and is expected to adversely impact the chamber lifetime.

Pulse Multiplier

Figure 24A:
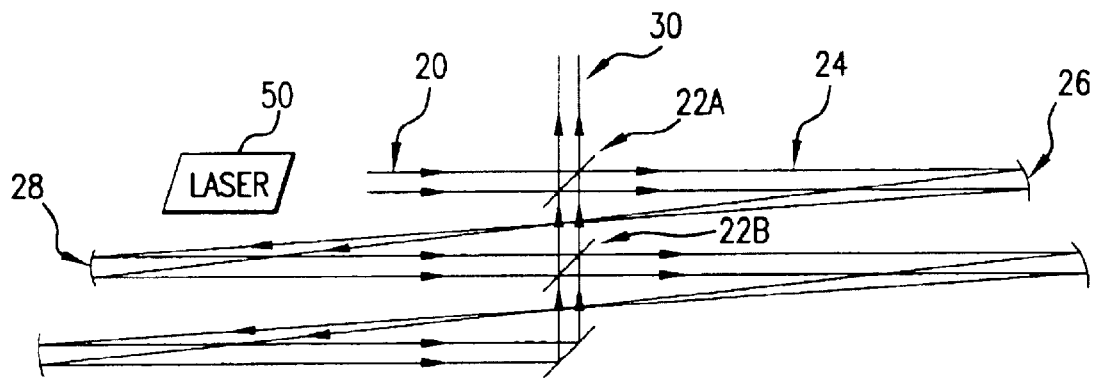
FIGS. 24A, B and C describe another pulse stretching technique.
Figure 24B:
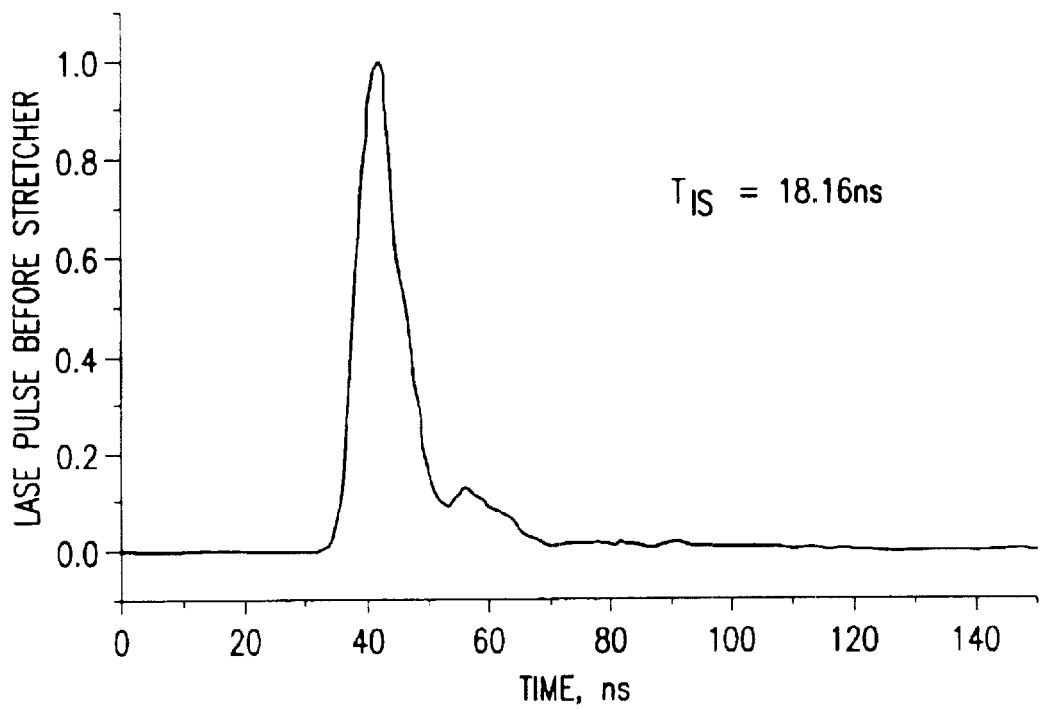
Figure 24C:
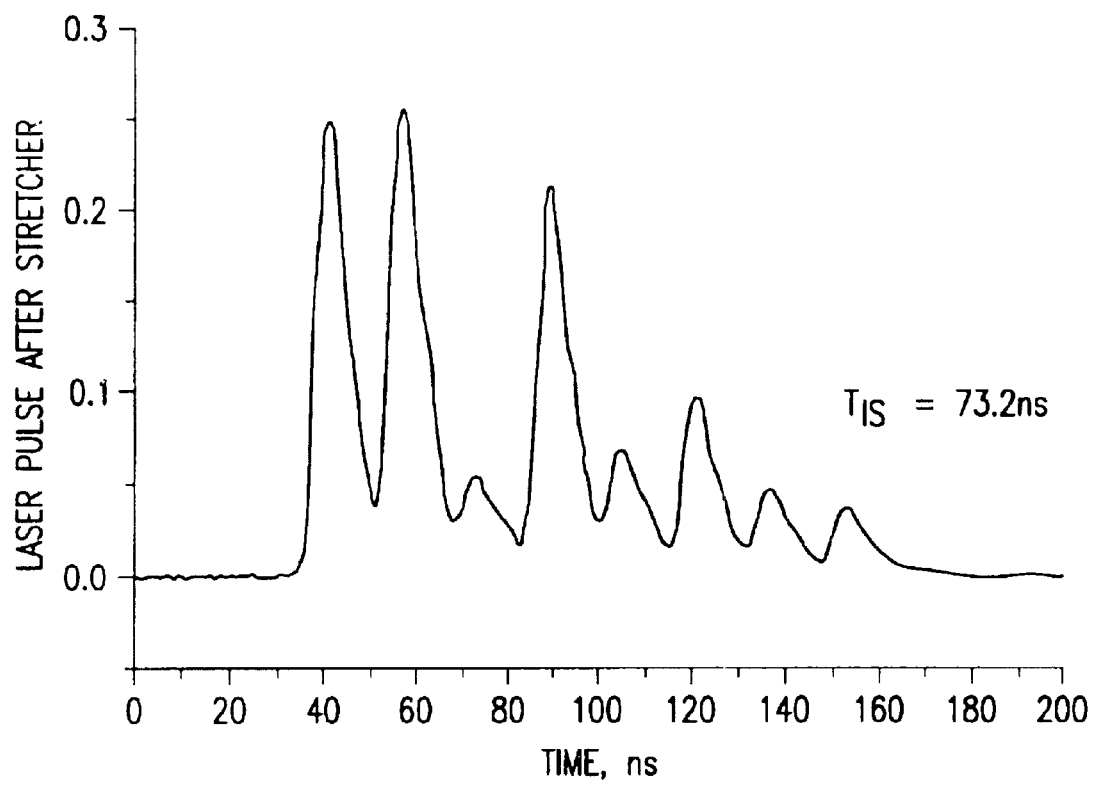

Another technique for stretching the pulse duration is to split each pulse into two or more parts, delay all but the first part then join them back together. One such technique is described in U.S. Pat. No. 6,067,311 which is assigned to Applicants' employer and is incorporated herein by reference. Another such technique is described in U.S. patent application Ser. No. 10/006,913 filed Nov. 29, 2001 which is incorporated by reference herein. FIGS. 24A, 24B and 24C drawings extracted from that application describes the technique. FIGS. 24A and 24C show the before and after results of pulse stretching.

Various modifications may be made to the present invention without altering its scope. Those skilled in the art will recognize many other possible variations. The system could be designed for high pulse repetition rates other than 4000 Hz such as any repetition rate within the range of about 3000 Hz up to 6000 Hz or 8000 Hz. Repetition rates in excess of 8000 Hz will probably require a different blower system. The laser system described above specifically for KrF could be utilized as an ArF laser by changing the gas mixture and modifying the LNP and wavemeter for 193 nm operation. Preferably the electrode spacing is reduced from 16.5 mm to 13.5 mm. For example, active feedback control of bandwidth can be provided by adjusting the curvature of the line narrowing grating using a motor driver to adjust the bending mechanism shown in FIG. 22A. Or much faster control of bandwidth could be provided by using piezoelectric devices to control the curvature of the grating. Other heat exchanger designs should be obvious modifications to the one configuration shown herein. For example, all four units could be combined into a single unit. There could be significant advantages to using much larger fins on the heat exchanger to moderate the effects of rapid changes in gas temperature which occurs as a result of burst mode operation of the laser. The reader should understand that at extremely high pulse rates the feedback control on pulse energy does not necessarily have to be fast enough to control the pulse energy of a particular pulse using the immediately preceding pulse. For example, control techniques could be provided where measured pulse energy for a particular pulse is used in the control of the second or third following pulse. Many variations and modifications in the algorithm for converting wavemeter etalon and grating data to wavelength values are possible. For example, Applicants have discovered that a very minor error results from a focusing error in the etalon optical system which causes the measured line width to be larger than it actually is. The error increases slightly as the diameter of the etalon fringe being measured gets larger. This can be corrected by scanning the laser and a range of wavelengths and watch for step changes as the measured fringes leave the windows. A correction factor can then be determined based on the position of the measured fringes within the windows. Accordingly, the above disclosure is not intended to be limiting and the scope of the invention should be determined by the appended claims and their legal equivalents.

We claim:

1. An extreme repetition rate gas discharge laser system capable of operating at pulse repetition rates in excess of 3,000 laser output pulses per second, said laser comprising:
   A) a laser chamber containing a laser gas and having two elongated electrodes, defining a discharge region and having a gas flow path with a gradually increasing cross section downstream of said electrodes to permit recovery of a large percentage of static pressure drop occurring in the discharge region,
   B) a tangential type fan for producing sufficient gas movement said laser gas in said discharge region to clear from said discharge region, following each gas discharge in said discharge region, substantially all discharge produced ions prior to a next gas discharge when operating at a repetition rate up to and above 4,000 gas discharge per second or greater,
   C) a heat exchanger system removing heat energy from said laser gas,
   D) a pulse power system provide electrical pulses to said electrodes sufficient to produce laser output pulses at rates of up to and above 4,000 laser output pulses per second with precisely controlled pulse energies in the range of about 5 mJ, and
   E) a laser beam measurement and control system measuring pulse energy wavelength and bandwidth of every pulse or substantially every pulse with feedback control of laser output pulse energy and wavelength.

2. A laser as in claim 1 wherein said discharge laser system is a KrF excimer laser system and the laser gas is comprised of krypton, fluorine and neon.

3. A laser as in claim 2 and wherein said chamber also comprises a vane structure upstream of said discharge region for normalizing gas velocity upstream of said discharge region.

4. A laser as in claim 1 wherein said fan comprises a shaft driven by two brushless DC motors.

5. A laser as in claim 4 wherein said motors are water cooled motors.

6. A laser as in claim 4 wherein each of said motors comprise a stator and each of said motors comprise a magnetic rotor contained in a pressure cup separating a said stator from said laser gas.

7. A laser as in claim 4 wherein said tangential fan comprise a blade structure machined from a single piece of aluminum stock.

8. A laser as in claim 7 wherein said blade structure has an outside diameter of about five inches.

9. A laser as in claim 4 wherein said motors are sensorless motors and further comprising a master motor controller for controlling one of said motors and a slave motor controller for controlling the other motor.

10. A laser as in claim 1 wherein said finned heat exchanger system is water cooled.

11. A laser as in claim 10 wherein said heat exchanger system comprises at least four separate water cooled heat exchangers.

12. A laser as in claim 11 wherein each of said four heat exchangers comprise a tubular water flow passage containing a turbulator.

13. A laser as in claim 10 wherein heat exchanger system comprises at least one heat exchanger having a tubular water flow passage wherein at least one turbulator is located in said path.

14. A laser as in claim 1 wherein said pulse power system comprise water cooled electrical components.

15. A laser as in claim 14 wherein at least one of said water cooled components is a component operated at high voltage in excess of 12,000 volts.

16. A laser as in claim 15 wherein said high voltage is isolated from ground using an inductor through which cooling water flows.

17. A laser as in claim 1 wherein said pulse power system comprises a resonant charging system to charge a charging capacitor to a precisely controlled voltage.

18. A laser as in claim 17 wherein said resonant charging system comprises a de-Qing circuit.

19. A laser as in claim 17 wherein said resonant charging system comprises a bleed circuit.

20. A laser as in claim 17 wherein said resonant charging system comprises a de-Qing circuit and a bleed circuit.

21. A laser as in claim 1 wherein said pulse power system comprises a charging system comprised of at least one power supply.

22. A laser as in claim 1 wherein said laser beam measurement and control system comprises an etalon unit, a photo diode array, a programmable logic device, and optics to focus laser light from said etalon unit onto said photo diode array wherein said programmable logic device is programmed to analyze data from said photodiode array to determine locations on said photo diode array of etalon fringes.

23. A laser as in claim 22 wherein said measurement an control system also comprises a microprocessor programmed to calculate wavelength and bandwidth from fringe data located by said programmable logic device.

24. A laser as in claim 22 wherein said microprocessor is programmed with an algorithm for calculating wavelength and bandwidth based on measurement of said fringes.

25. A laser as in claim 24 wherein said microprocessor make calculations of wavelength and bandwidth faster than $1/4,000$ of a second.

26. A laser as in claim 22 wherein said etalon unit comprises a defractive diffusing element.

27. A laser as in claim 1 and further comprising a line narrowing unit comprising a tuning mirror driven at least in part by a PZT drive.

28. A laser as in claim 27 wherein said tuning mirror is also driven in part by a stepper motor.

29. A laser as in claim 27 and further comprising a pretuning means.

30. A laser as in claim 27 and further comprising an active tuning means comprising a learning algorithm.

31. A laser as in claim 27 and further comprising an adaptive feed forward algorithm.

32. A laser as in claim 27 wherein said line narrowing unit comprises a grating defining a grating face and a purge means for forcing purge gas adjacent to said grating face.

33. A laser as in claim 32 wherein said purge gas is nitrogen.

34. A laser as in claim 32 wherein said purge gas is helium.

35. A laser as in claim 27 and further comprising a beam seal system providing a first beam seal between a first window of said chamber and line narrowing unit and a second beam seal between a second window of said chamber and an output coupler unit, each of said beam seals comprising a metal bellows.

36. A laser as in claim 35 wherein each of said first and second beam seals permit easy replacement of said laser chamber.

37. A laser as in claim 35 wherein each of said beam seals contain no elastomer, provide vibration isolation from said chamber, provide beam train isolation from atmospheric gases and permit unrestricted replacement of said laser chamber without disturbance of said LNP or said output coupler unit.

38. A laser as in claim 1 and further comprising a nitrogen purge system comprising a nitrogen filter.

39. A laser as in claim 1 and further comprising a nitrogen purge system comprising a purge module comprising flow monitors said laser also comprising purge exhaust tubes for transporting exhaust purge gas from said laser.

40. A laser as in claim 1 and further comprising a shutter unit comprising an electrically operated shutter and a power meter which can be positioned in a laser output beam path with a command signal.

41. A laser as in claim 1 wherein said measurement and control system comprises a primary beam splitter for splitting off a small percentage of the light in each of the output pulses from said laser, a second beam splitter for directing a portion of said small percentage to said pulse energy detector and a means isolating a volume bound said primary beam splitter, said secondary beam splitter and a window of said pulse energy detector from other portions of said measurement and control system to define an isolated region.

42. A laser as in claim 41 and further comprising a purge means for purging said isolated region with a purge gas.

43. A laser as in claim 42 wherein said laser further comprises an output coupler unit and an output window unit said purge means being exhaust from said isolated region also purges said output coupler unit and said output window unit.

44. A laser as in claim 1 wherein said chamber also comprises a current return having ribs with a generally rectangular cross section with a long direction in a direction of laser gas flow.

45. A laser as in claim 1 wherein said chamber comprises an anode and dielectric spacers positioned on two sides of said anode to improve laser gas flow in regions between the two electrodes.

46. A laser as in claim 1 wherein said pulse power system comprises a corona plate electrically connected to capacitors of a peaking capacitor bank and one of said electrodes by metal rods having lengths chosen to provide increased inductance.

47. A gas discharge laser system comprising:
   A) a laser chamber containing a laser gas and having two elongated electrodes, defining a discharge region therebetween and having a gas flow path through the discharge region,
   B) a fan for producing sufficient gas movement of said laser gas through said discharge region to clear from said discharge region, following each gas discharge in said discharge region, substantially all discharge produced ions prior to a next gas discharge when operating at a repetition rate of up to and above 4,000 gas discharges per second,
   C) a heat exchanger system removing heat energy from said laser gas,
   D) a pulse power system providing electrical pulses to said electrodes sufficient to produce laser output pulses at rates of up to and above 4,000 laser output pulses per second with precisely controlled pulse energies, and E) a laser beam measurement and control system measuring pulse energy, wavelength and bandwidth of every pulse or substantially every pulse with feedback control of the laser output, said laser beam measurement and control system comprising a fringe producing optic, a fringe photo detector producing output signals representative of a fringe pattern, a programmable logic device receiving the output signals of the fringe photo detector, and having logic that analyzes the output signals of the fringe photo detector to determine the presence and location of the fringes and provide an output signal representative of the presence and location of the fringes.

48. The apparatus of claim 47 further comprising:

a computer processor connected to the output of the programmable logic device and programmed to compute one or more of wavelength and bandwidth of the output laser pulse utilizing the output of the programmable logic device.

49. The apparatus of claim 48 further comprising:

the programmable logic device containing logic to create a fringe look-up table from the output of the fringe photo detector.

50. The apparatus of claim 49 further comprising:

the programmable logic device contains logic to identify the optimum set of fringes from the table of fringes for the microprocessor to use in calculating one or more of wavelength and bandwidth.

51. The apparatus of claim 50 further comprising:

the fringe photo detector comprises an array of photo detector elements each producing an output signal representative of an intensity of light shining upon the photo detector element; and the look-up table contains the location in the array of at least one pixel comprising a rising edge pixel having at least a selected threshold intensity level and of at least one pixel comprising a trailing edge pixel comprising a pixel occurring after a peak pixel and having at or less than the selected threshold intensity level, for each fringe.

52. The apparatus of claim 51 further comprising:

the programmable logic device containing logic to identify at least a first fringe comprising a selected fringe positioned within a first window in the array and a second fringe comprising a selected fringe positioned within a second window in the array and to identify at least the first and the second fringe to the microprocessor.

53. The apparatus of claim 50 further comprising:

the programmable logic device containing logic to identify at least a first fringe comprising a selected fringe positioned within a first window in the array and a second fringe comprising a selected fringe positioned within a second window in the array and to identify at least the first and the second fringe to the microprocessor.

54. The apparatus of claim 48 further comprising:

the programmable logic device contains logic to identify the optimum set of fringes from the table of fringes for the microprocessor to use in calculating one or more of wavelength and bandwidth.

55. The apparatus of claim 54 further comprising:

the fringe photo detector comprises an array of photo detector elements each producing an output signal representative of an intensity of light shining upon the photo detector element; and the look-up table contains the location in the array of at least one pixel comprising a rising edge pixel having at least a selected threshold intensity level and of at least one pixel comprising a trailing edge pixel comprising a pixel occurring after a peak pixel and having at or less than the selected threshold intensity level, for each fringe.

56. The apparatus of claim 55 further comprising:

the programmable logic device containing logic to identify at least a first fringe comprising a selected fringe positioned within a first window in the array and a second fringe comprising a selected fringe positioned within a second window in the array and to identify at least the first and the second fringe to the microprocessor.

57. The apparatus of claim 54 further comprising:

the programmable logic device containing logic to identify at least a first fringe comprising a selected fringe positioned within a first window in the may and a second fringe comprising a selected fringe positioned within a second window in the array and to identify at least the first and the second fringe to the microprocessor.

58. The apparatus of claim 47 further comprising:

the programmable logic device containing logic to create a fringe look-up table from the output of the fringe photo detector.

59. The apparatus of claim 58 further comprising:

the programmable logic device contains logic to identify the optimum set of fringes from the table of fringes for the microprocessor to use in calculating one or more of wavelength and bandwidth.

60. The apparatus of claim 59 further comprising:

the fringe photo detector comprises an array of photo detector elements each producing an output signal representative of an intensity of light shining upon the photo detector element; and the look-up table contains the location in the array of at least one pixel comprising a rising edge pixel having at least a selected threshold intensity level and of at least one pixel comprising a trailing edge pixel comprising a pixel occurring after a peak pixel and having at or less than the selected threshold intensity level, for each fringe.

61. The apparatus of claim 60 further comprising:

the programmable logic device containing logic to identify at least a first fringe comprising a selected fringe positioned within a first window in the array and a second fringe comprising a selected fringe positioned within a second window in the array and to identify at least the first and the second fringe to the microprocessor.

62. The apparatus of claim 59 further comprising:

the programmable logic device containing logic to identify at least a first fringe comprising a selected fringe positioned within a first window in the array and a second fringe comprising a selected fringe positioned within a second window in the array and to identify at least the first and the second fringe to the microprocessor.

63. The apparatus of claim 47 further comprising:

the programmable logic device contains logic to identify the optimum set of fringes from the table of fringes for the microprocessor to use in calculating one or more of wavelength and bandwidth.

64. The apparatus of claim 63 further comprising:

the fringe photo detector comprises an array of photo detector elements each producing an output signal representative of an intensity of light shining upon the photo detector element; and the look-up table contains the location in the array of at least one pixel comprising a rising edge pixel having at least a selected threshold intensity level and of at least one pixel comprising a trailing edge pixel comprising a pixel occurring after a peak pixel and having at or less than the selected threshold intensity level, for each fringe.

65. The apparatus of claim 64 further comprising:

the programmable logic device containing logic to identify at least a first fringe comprising a selected fringe positioned within a first window in the array and a second fringe comprising a selected fringe positioned within a second window in the array and to identify at least the first and the second fringe to the microprocessor.

66. The apparatus of claim 63 further comprising:

the programmable logic device containing logic to identify at least a first fringe comprising a selected fringe positioned within a first window in the array and a second fringe comprising a selected fringe positioned within a second window in the array and to identify at least the first and the second fringe to the microprocessor.

\* \* \* \* \*

UNITED STATES PATENT AND TRADEMARK OFFICE
CERTIFICATE OF CORRECTION

PATENT NO. : 6,882,674 B2
DATED : April 19, 2005
INVENTOR(S) : Wittuk et al.

It is certified that error appears in the above-identified patent and that said Letters Patent is hereby corrected as shown below:

Column 27,
Line 23, change "2003" to -- 2001 --.

Column 36,
Line 18, change "movement said" to -- movement of said --.
Line 26, change "provide" to -- providing --.
Line 52, change "comprise" to -- comprises --.
Line 60, delete "finned".

Column 37,
Line 40, change "make" to -- makes --.

Column 38,
Line 24, change "bound" to -- bounding --.

Column 39,
Line 11, change "provide" to -- providing --.

Signed and Sealed this

Twenty-third Day of May, 2006

JON W. DUDAS
*Director of the United States Patent and Trademark Office*